(12) United States Patent
Hsiao et al.

(10) Patent No.: US 11,183,584 B2
(45) Date of Patent: Nov. 23, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Meng-Hsuan Hsiao, Hsinchu (TW); Tung Ying Lee, Hsinchu (TW); Wei-Sheng Yun, Taipei (TW); Jin Cai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 16/746,127

(22) Filed: Jan. 17, 2020

(65) Prior Publication Data

US 2021/0226042 A1    Jul. 22, 2021

(51) Int. Cl.
*H01L 29/786* (2006.01)
*H01L 29/423* (2006.01)
*H01L 29/16* (2006.01)
*H01L 29/66* (2006.01)
*H01L 27/092* (2006.01)
(Continued)

(52) U.S. Cl.
CPC .. *H01L 29/66742* (2013.01); *H01L 21/02532* (2013.01); *H01L 21/02603* (2013.01); *H01L 21/30604* (2013.01); *H01L 21/76224* (2013.01); *H01L 29/0649* (2013.01);
(Continued)

(58) Field of Classification Search
CPC ......... H01L 29/78696; H01L 29/66545; H01L 29/66742; H01L 29/4966; H01L 21/28194; H01L 29/0673
See application file for complete search history.

(56) References Cited

U.S. PATENT DOCUMENTS 9,236,267 B2    1/2016  De et al.
9,502,265 B1    11/2016 Jiang et al.
(Continued)

FOREIGN PATENT DOCUMENTS

DE    112015006966 T5   7/2018
DE    102017119141 A1   1/2019

*Primary Examiner* — Brian Turner
(74) *Attorney, Agent, or Firm* — McDermott Will & Emery LLP

(57) ABSTRACT

A method of manufacturing a semiconductor device includes forming a stacked structure of first semiconductor layers and second semiconductor layers alternately stacked in a first direction over a substrate. A thickness of the first semiconductor layers as formed increases in each first semiconductor layer spaced further apart from the substrate in the first direction. The stacked structure is patterned into a fin structure extending along a second direction substantially perpendicular to the first direction. A portion of the first semiconductor layers between adjacent second semiconductor layers is removed, and a gate structure is formed extending in a third direction over a first portion of the first semiconductor layers so that the gate structure wraps around the first semiconductor layers. The third direction is substantially perpendicular to both the first direction and the second direction. Each of the first semiconductor layers at the first portion of the first semiconductor layers have a substantially same thickness.

20 Claims, 52 Drawing Sheets

(51) Int. Cl.
  *H01L 29/06*     (2006.01)
  *H01L 21/762*    (2006.01)
  *H01L 21/02*     (2006.01)
  *H01L 21/306*    (2006.01)

(52) U.S. Cl.
  CPC .... *H01L 29/0673* (2013.01); *H01L 29/42392* (2013.01); *H01L 29/78618* (2013.01); *H01L 29/78696* (2013.01)

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,691,851 B1 | 6/2017 | Fung |
| 9,786,774 B2 | 10/2017 | Colinge et al. |
| 9,853,101 B2 | 12/2017 | Peng et al. |
| 9,881,993 B2 | 1/2018 | Ching et al. |
| 10,090,157 B2 | 10/2018 | Fung |
| 10,134,640 B1 | 11/2018 | Chiang et al. |
| 2016/0204195 A1* | 7/2016 | Wen .................. H01L 29/66439 257/347 |
| 2017/0358646 A1* | 12/2017 | Fung .................. H01L 27/0924 |
| 2018/0090569 A1* | 3/2018 | Yang .................. H01L 29/1033 |
| 2019/0355851 A1 | 11/2019 | Seshadri et al. |

* cited by examiner

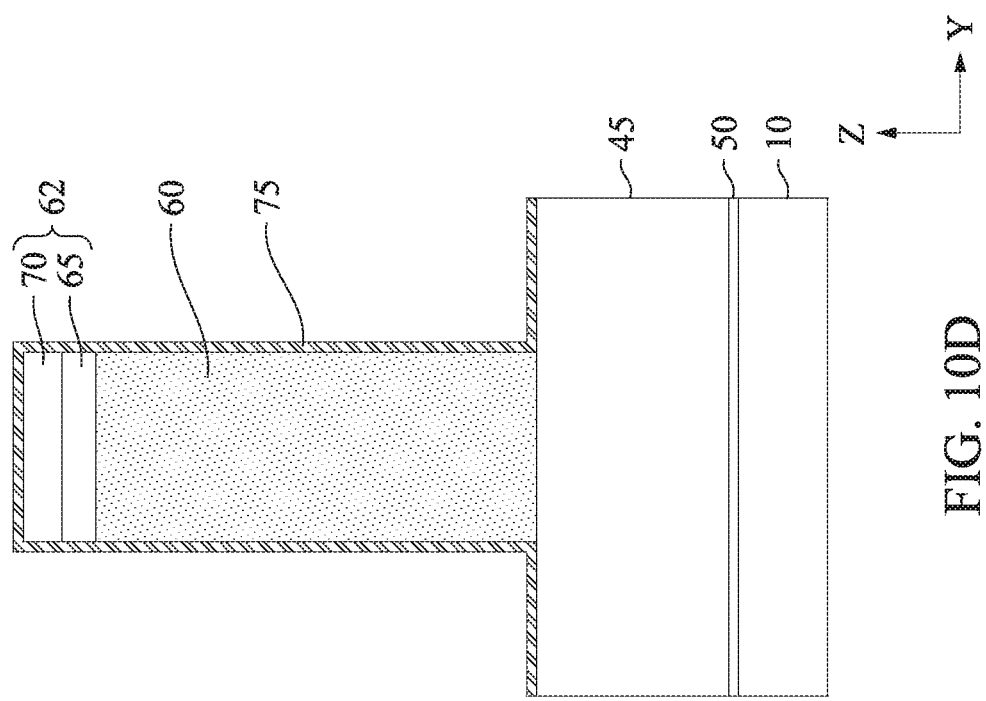
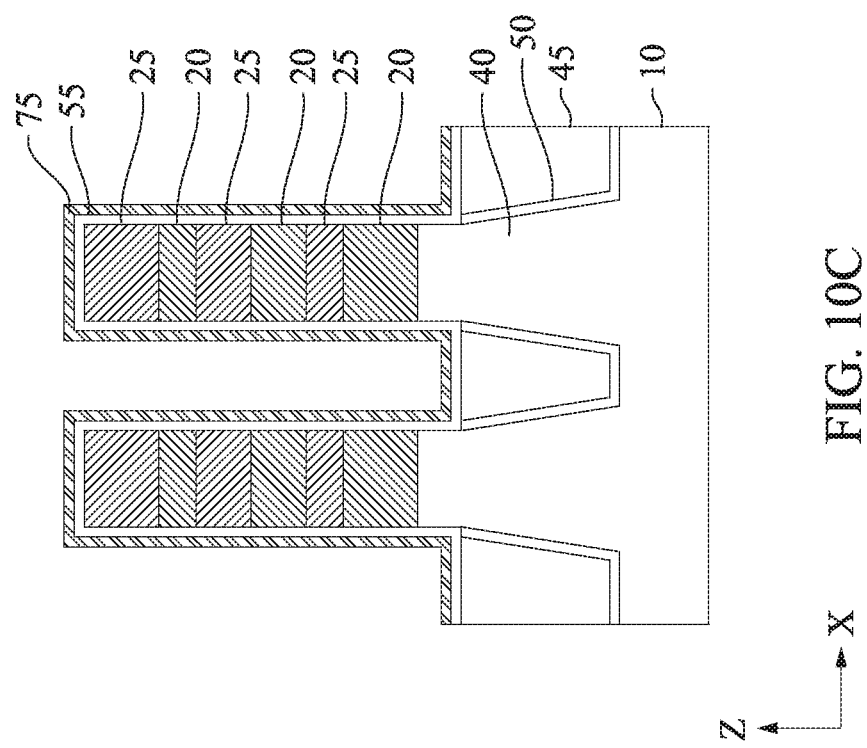
FIG. 10D
FIG. 10C

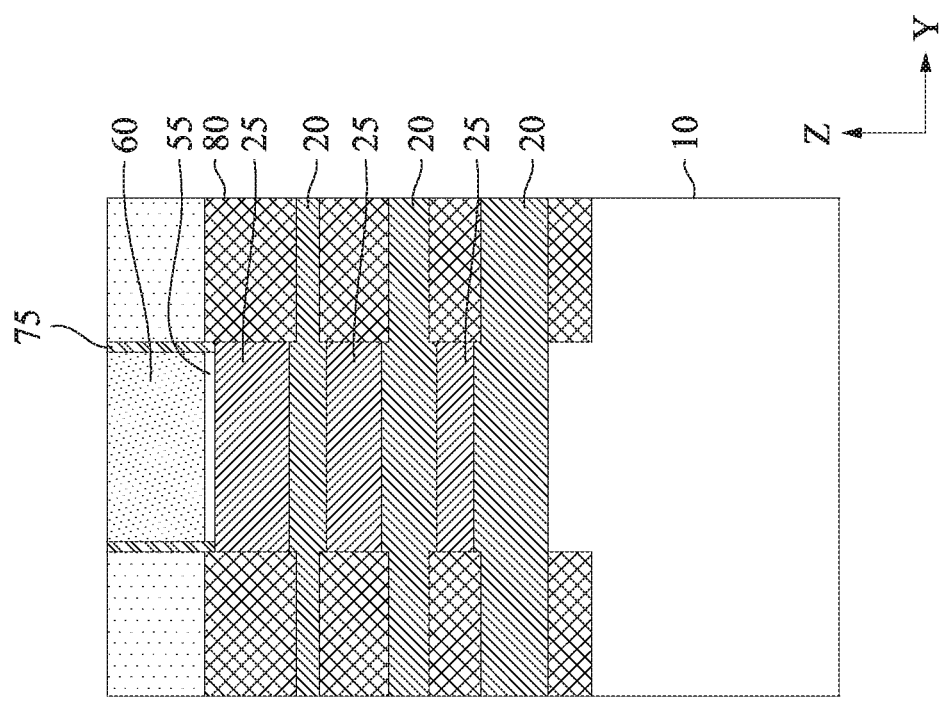
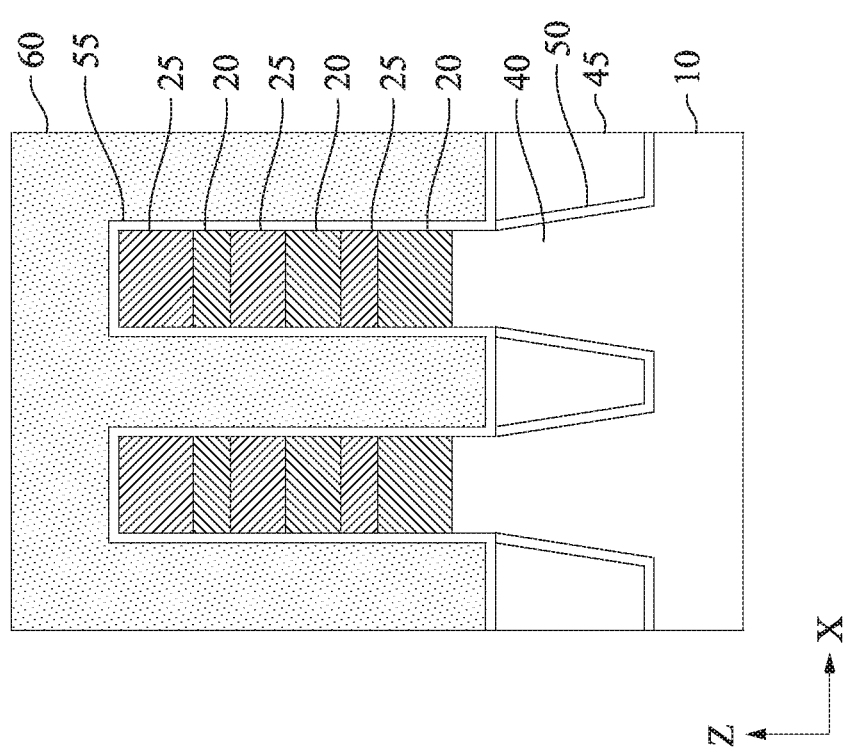
FIG. 13B
FIG. 13A

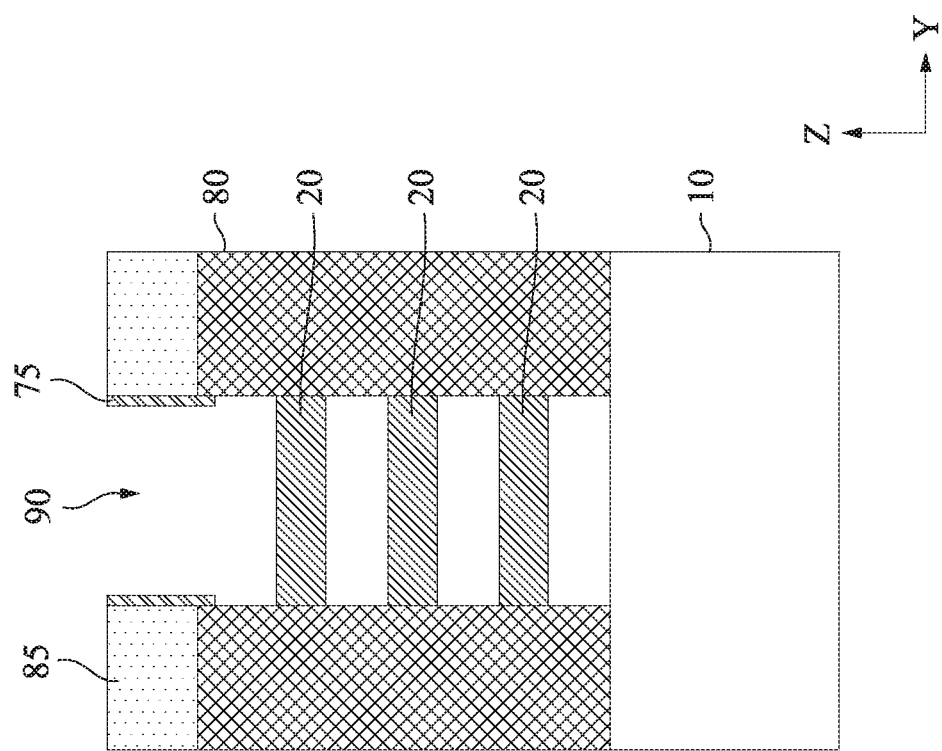
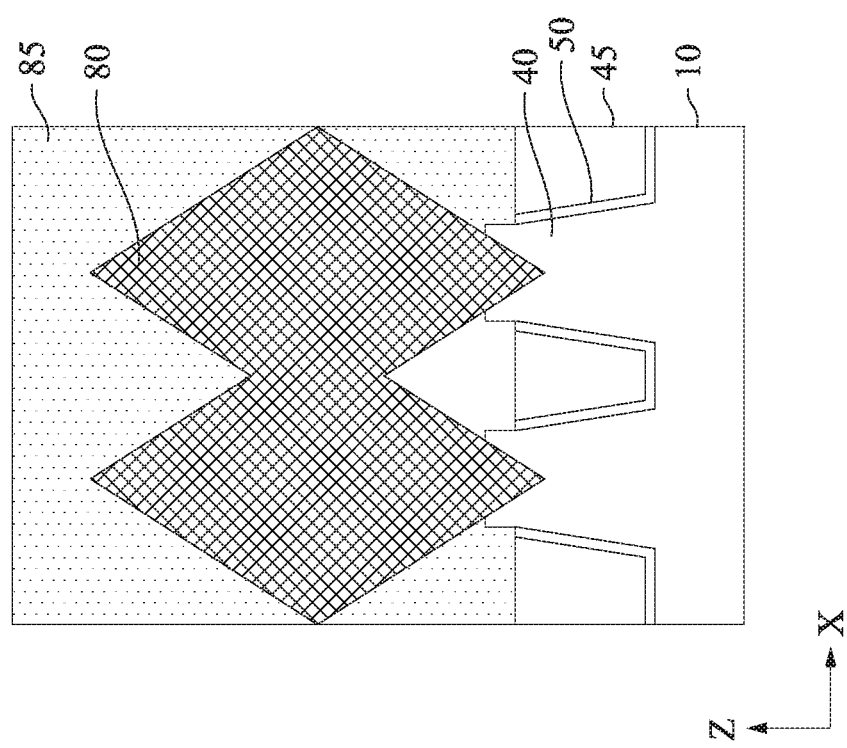
FIG. 15F
FIG. 15E

US 11,183,584 B2

SEMICONDUCTOR DEVICE AND MANUFACTURING METHOD THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET) including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and result in less short-channel effects due to steeper sub-threshold current swing (SS) and smaller drain induced barrier lowering (DIBL).

As transistor dimensions are continually scaled down to sub 20-25 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 9A is a cross sectional view taken along the gate electrode in the X-direction (corresponding to line A-A of FIG. 1). FIG. 9B is a cross sectional view taken along the fin structure in the Y-direction (corresponding to line B-B of FIG. 1).

FIGS. 10A-10D show one of the various stages of manufacturing a semiconductor FET device according to embodiments of the present disclosure. FIG. 10A is a cross sectional view taken along the gate electrode in the X-direction (corresponding to line A-A of FIG. 1). FIG. 10B is a cross sectional view taken along the fin structure in the Y-direction (corresponding to line B-B of FIG. 1). FIG. 10C is a cross sectional view corresponding to line C-C of FIG. 1. FIG. 10D is a cross sectional view corresponding to line D-D of FIG. 1.

FIG. 11A is a cross sectional view taken along the gate electrode in the X-direction (corresponding to line A-A of FIG. 1). FIG. 11B is a cross sectional view taken along the fin structure in the Y-direction (corresponding to line B-B of FIG. 1). FIG. 11C is a cross sectional view corresponding to line C-C of FIG. 1. FIG. 11D is a cross sectional view corresponding to line D-D of FIG. 1.

FIG. 12A is a cross sectional view taken along the gate electrode in the X-direction (corresponding to line A-A of FIG. 1). FIG. 12B is a cross sectional view taken along the fin structure in the Y-direction (corresponding to line B-B of FIG. 1). FIG. 12C is a cross sectional view corresponding to line C-C of FIG. 1. FIG. 12D is a cross sectional view corresponding to line D-D of FIG. 1.

FIGS. 13A-13D show one of the various stages of manufacturing a semiconductor FET device according to embodiments of the present disclosure. FIG. 13A is a cross sectional view taken along the gate electrode in the X-direction (corresponding to line A-A of FIG. 1). FIG. 13B is a cross sectional view taken along the fin structure in the Y-direction (corresponding to line B-B of FIG. 1). FIG. 13C is a cross sectional view corresponding to line C-C of FIG. 1. FIG. 13D is a cross sectional view corresponding to line D-D of FIG. 1.

FIG. 14A is a cross sectional view taken along the gate electrode in the X-direction (corresponding to line A-A of FIG. 1). FIG. 14B is a cross sectional view taken along the fin structure in the Y-direction (corresponding to line B-B of FIG. 1). FIG. 14C is a cross sectional view corresponding to line C-C of FIG. 1. FIG. 14D is a cross sectional view corresponding to line D-D of FIG. 1.

FIG. 15A is a cross sectional view taken along the gate electrode in the X-direction (corresponding to line A-A of FIG. 1). FIG. 15B is a cross sectional view taken along the fin structure in the Y-direction (corresponding to line B-B of FIG. 1). FIG. 15C is a cross sectional view corresponding to line C-C of FIG. 1. FIG. 15D is a cross sectional view corresponding to line D-D of FIG. 1. FIG. 15E is a cross sectional view corresponding to line C-C of FIG. 1 and FIG. 15F is a cross sectional view corresponding to line B-B of FIG. 1 of another embodiment.

FIG. 16A is a cross sectional view taken along the gate electrode in the X-direction (corresponding to line A-A of FIG. 1). FIG. 16B is a cross sectional view taken along the fin structure in the Y-direction (corresponding to line B-B of FIG. 1). FIG. 16C is a cross sectional view corresponding to line C-C of FIG. 1. FIG. 16D is a cross sectional view corresponding to line D-D of FIG. 1.

FIG. 22A is a cross sectional view taken along the gate electrode in the X-direction (corresponding to line A-A of FIG. 1). FIG. 22B is a cross sectional view taken along the fin structure in the Y-direction (corresponding to line B-B of FIG. 1).

FIG. 23A is a cross sectional view taken along the gate electrode in the X-direction (corresponding to line A-A of FIG. 1). FIG. 23B is a cross sectional view taken along the fin structure in the Y-direction (corresponding to line B-B of FIG. 1). FIG. 23C is a cross sectional view corresponding to line C-C of FIG. 1. FIG. 23D is a cross sectional view corresponding to line D-D of FIG. 1.

FIG. 24A is a cross sectional view taken along the gate electrode in the X-direction (corresponding to line A-A of FIG. 1). FIG. 24B is a cross sectional view taken along the fin structure in the Y-direction (corresponding to line B-B of FIG. 1). FIG. 24C is a cross sectional view corresponding to line C-C of FIG. 1. FIG. 24D is a cross sectional view corresponding to line D-D of FIG. 1.

FIG. 25A is a cross sectional view taken along the gate electrode in the X-direction (corresponding to line A-A of FIG. 1). FIG. 25B is a cross sectional view taken along the fin structure in the Y-direction (corresponding to line B-B of FIG. 1). FIG. 25C is a cross sectional view corresponding to line C-C of FIG. 1. FIG. 25D is a cross sectional view corresponding to line D-D of FIG. 1.

FIG. 26A is a cross sectional view taken along the gate electrode in the X-direction (corresponding to line A-A of FIG. 1). FIG. 26B is a cross sectional view taken along the fin structure in the Y-direction (corresponding to line B-B of FIG. 1). FIG. 26C is a cross sectional view corresponding to line C-C of FIG. 1. FIG. 26D is a cross sectional view corresponding to line D-D of FIG. 1.

FIG. 27A is a cross sectional view taken along the gate electrode in the X-direction (corresponding to line A-A of FIG. 1). FIG. 27B is a cross sectional view taken along the fin structure in the Y-direction (corresponding to line B-B of FIG. 1). FIG. 27C is a cross sectional view corresponding to line C-C of FIG. 1. FIG. 27D is a cross sectional view corresponding to line D-D of FIG. 1.

FIG. 28A is a cross sectional view taken along the gate electrode in the X-direction (corresponding to line A-A of FIG. 1). FIG. 28B is a cross sectional view taken along the fin structure in the Y-direction (corresponding to line B-B of FIG. 1). FIG. 28C is a cross sectional view corresponding to line C-C of FIG. 1. FIG. 28D is a cross sectional view corresponding to line D-D of FIG. 1.

FIG. 29A is a cross sectional view taken along the gate electrode in the X-direction (corresponding to line A-A of FIG. 1). FIG. 29B is a cross sectional view taken along the fin structure in the Y-direction (corresponding to line B-B of FIG. 1). FIG. 29C is a cross sectional view corresponding to line C-C of FIG. 1. FIG. 29D is a cross sectional view corresponding to line D-D of FIG. 1.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/ or operations as described with respect to one embodiment (e.g., one or more figures) may be employed in the other embodiments, and detailed description thereof may be omitted.

Disclosed embodiments relate to a semiconductor device, in particular, a gate structure of a gate-all-around field effect transistor (GAA FET) and its manufacturing method.

In the present disclosure, a method for fabricating a GAA FET and a stacked channel FET are provided. It is noted that in the present disclosure, a source and a drain are interchangeably used and the structures thereof are substantially the same.

Figure 1:
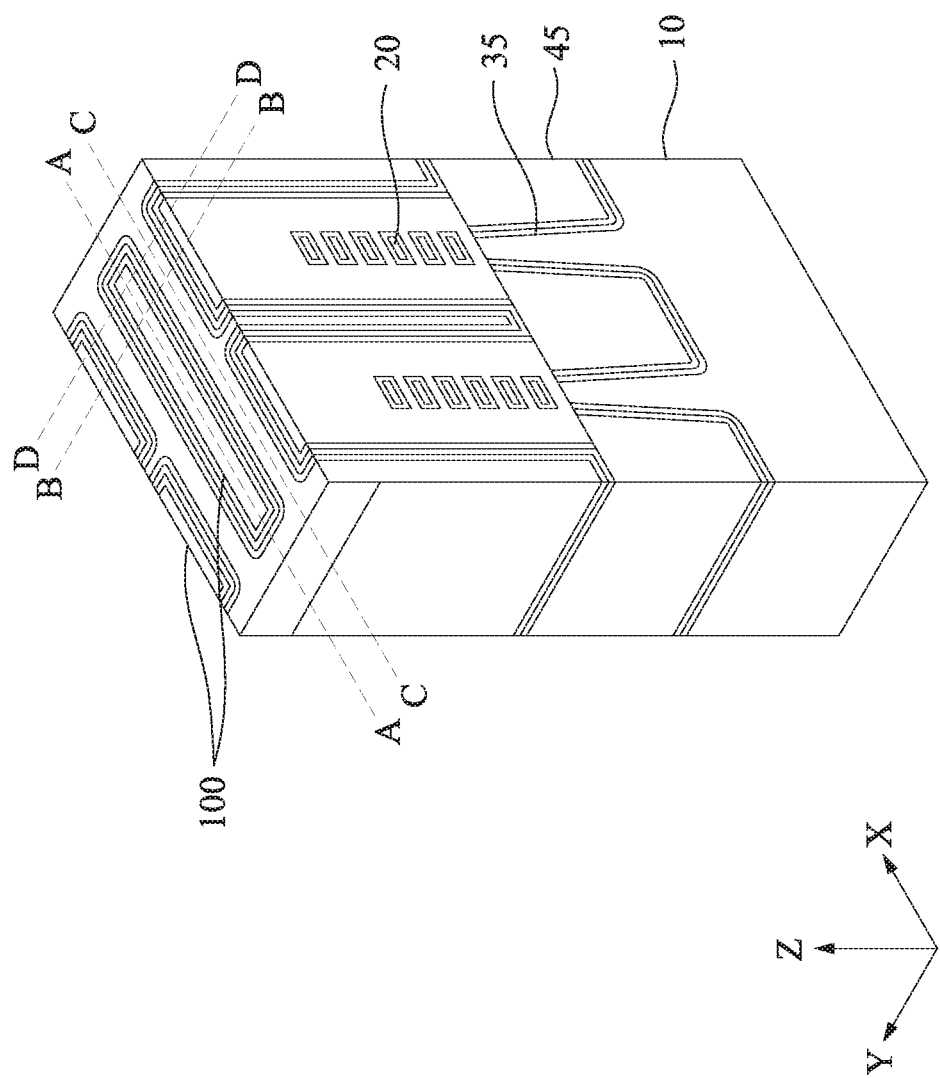
FIG. 1 shows an isometric view of a GAA FET semiconductor device showing one of the stages of a manufacturing process according to an embodiment of the present disclosure.

FIG. 1 shows an isometric view of a GAA FET semiconductor device showing one of the stages of a manufacturing process according to an embodiment of the present disclosure. One or more gate electrodes 100 extending in the X-direction are disposed over one or more fin structures 35 extending in the Y-direction. The X-direction is substantially perpendicular to the Y-direction. The fin structures 35 are formed on a semiconductor substrate 10. A lower portion of the fin structure 35 is embedded in an isolation insulating layer 45, and the gate electrode 100 wraps around semiconductor nanowires 20.

FIGS. 2-16F show exemplary sequential processes for manufacturing a GAA FET according to embodiments of the present disclosure. It is understood that additional operations can be provided before, during, and after processes shown by FIGS. 2-16F, and some of the operations described below can be replaced or eliminated, for additional embodiments of the method. The order of the operations/processes may be interchangeable.

Figure 2:
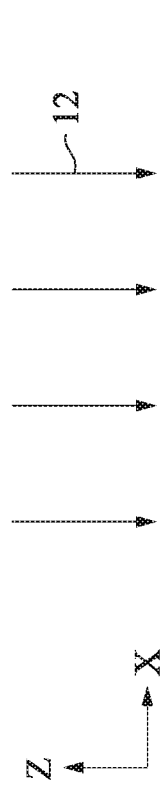
FIG. 2 shows a cross sectional view of one of the various stages of manufacturing a semiconductor GAA FET device according to embodiments of the present disclosure.
Figure 2:
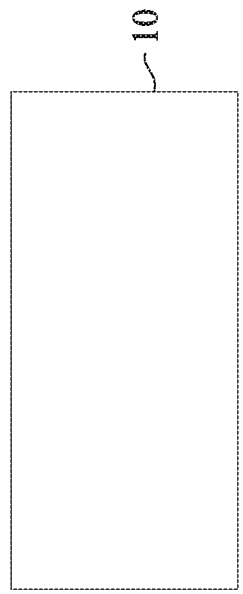

FIG. 2 shows a cross sectional view of one of the various stages of manufacturing a semiconductor FET device according to embodiments of the present disclosure. As shown in FIG. 2, a semiconductor substrate 10 is provided. In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP.

As shown in FIG. 2, impurity ions (dopants) 12 are implanted into a silicon substrate 10 to form a well region in some embodiments. The ion implantation is performed to prevent a punch-through effect. The substrate 10 may include various regions that have been suitably doped with impurities (e.g., p-type or n-type conductivity). The dopants 12 are, for example, boron ($BF_2$) for an n-type Fin FET and phosphorus for a p-type Fin FET in some embodiments.

Figure 3:
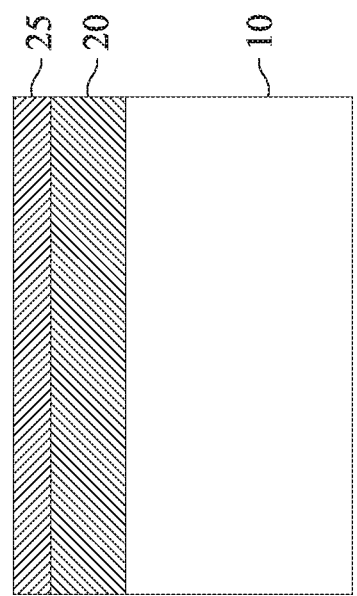
FIG. 3 shows a cross sectional view of one of the various stages of manufacturing a semiconductor GAA FET device according to embodiments of the present disclosure.

Then, as shown in FIG. 3, a first semiconductor layer 20 is formed over the substrate 10. In some embodiments, the first semiconductor layer 20 is formed of a first semiconductor material. In some embodiments, the first semiconductor material includes a first Group IV element, and in other embodiments, the first semiconductor material includes a first Group IV element and a second Group IV element. The Group IV elements are selected from the group consisting of C, Si, Ge, Sn, and Pb. In some embodiments, the first Group IV element is Si and the second Group IV element is Ge. In certain embodiments, the first semiconductor material is $Si_{1-x}Ge_x$, wherein $0.3 \leq x \leq 0.9$, and in other embodiments, $0.4 \leq x \leq 0.7$.

Figure 4:
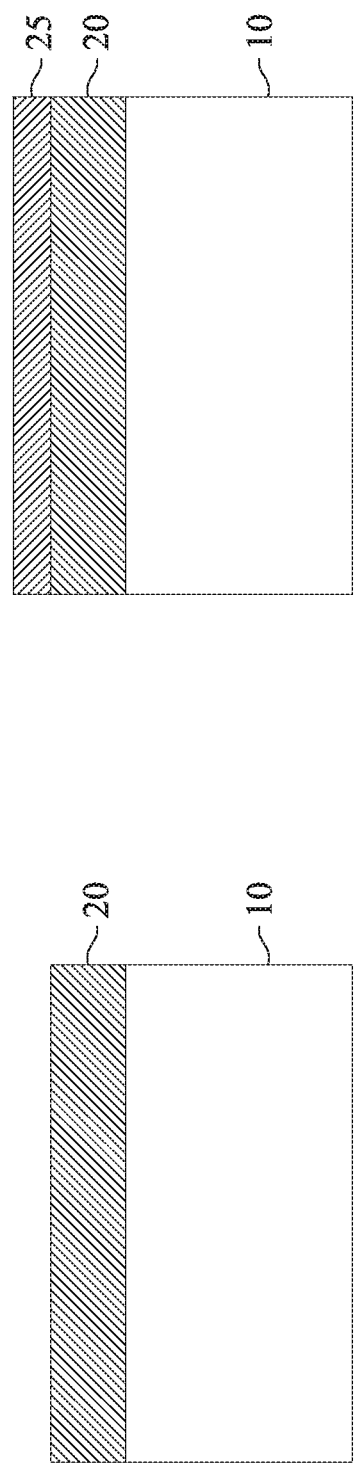
FIG. 4 shows a cross sectional view of one of the various stages of manufacturing a semiconductor GAA FET device according to embodiments of the present disclosure.

A second semiconductor layer 25 is subsequently formed over the first semiconductor layer 20, as shown in FIG. 4. In some embodiments, the second semiconductor layer 25 is formed of a second semiconductor material different from the first semiconductor material. In some embodiments, the second semiconductor material includes a first Group IV element, and in other embodiments, the second semiconductor material includes a first Group IV element and a second Group IV element. The Group IV elements are selected from the group consisting of C, Si, Ge, Sn, and Pb. In some embodiments, the first Group IV element is Si and the second Group IV element is Ge. In some embodiments, the amounts of the Group IV elements are different in the second semiconductor material than in the first semiconductor material. In some embodiments, the amount of Ge in the first semiconductor material is greater than the amount of Ge in the second semiconductor material. In certain embodiments, the second semiconductor material is $Si_{1-y}Ge_y$, wherein $0.1 \leq y \leq 0.5$, and x>y, and in other embodiments, $0.2 \leq y \leq 0.4$. In some embodiments, y is zero (the second semiconductor material is Si).

In some embodiments, the second semiconductor layer 25 is made of the same material as the semiconductor substrate 10.

In some embodiments, a thickness of the first semiconductor layer 20 and the second semiconductor layer 25 is about 3 nm to about 20 nm and a thickness of the first semiconductor layer 20 is greater than a thickness of the second semiconductor layer 25.

The first semiconductor layer 20 and the second semiconductor layer 25 may be formed by one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy, and/or other suitable processes.

Figure 5B:
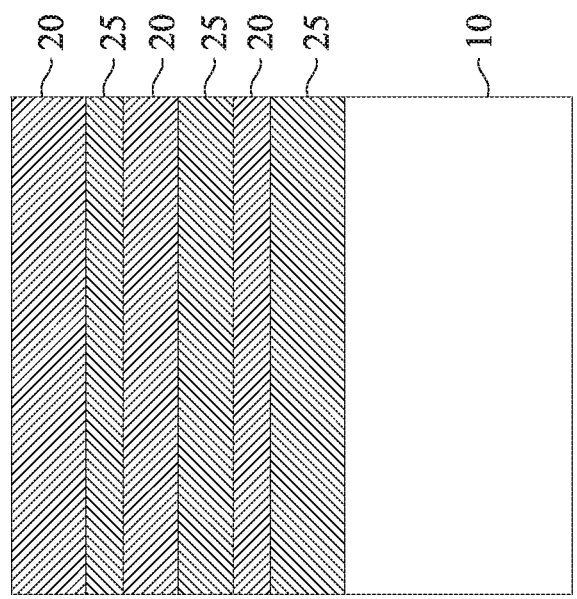
FIGS. 5A and 5B show cross sectional views of one of the various stages of manufacturing a semiconductor GAA FET device according to embodiments of the present disclosure.
Figure 5A:
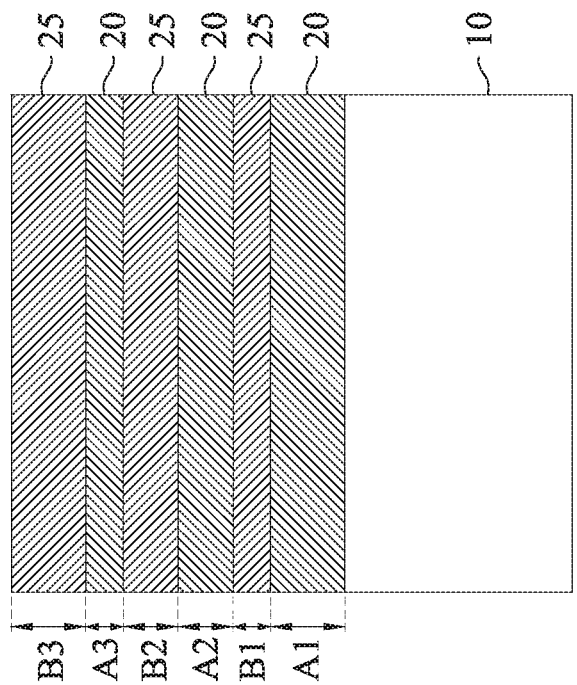

Next, in some embodiments, additional first semiconductor layers 20 and second semiconductor layers 25 are stacked in a repeating sequence, as shown in FIG. 5A. In FIG. 5A, three repeating sequences of first and second semiconductor layers are shown, however, the number of the repeating sequences are not limited to three, and may be as small as 2 and in some embodiments, 4-10 repeating sequences are formed. In other embodiments, repeating sequences of the second semiconductor layer 25 and the first semiconductor layer 20 are formed, as shown in FIG. 5B. By adjusting the numbers of the stacked layers, a driving current of the GAA FET device can be adjusted.

As shown in FIG. 5A in one embodiment, the lowermost first semiconductor layer 20 is made of SiGe having a thickness A1 of about 5 nm to about 20 nm. The lowermost second semiconductor layer 25 is made of Si having a thickness B1 of about 3 nm to about 18 nm. In some embodiments, the next first semiconductor layer 20 spaced apart from the substrate 10 is made of SiGe having a thickness A2 of about 4 nm to about 19 nm, and the next second semiconductor layer 25 spaced apart from the substrate 10 is made of Si having a thickness B2 of about 4 nm to about 19 nm. In some embodiments, the uppermost first semiconductor layer 20 is made of SiGe having a thickness A3 of about 3 nm to about 18 nm, and the uppermost second semiconductor layer 25 is made of Si having a thickness B3 of about 5 nm to about 20 nm. In some embodiments, the thicknesses A1 and B3 are about the same, the thicknesses A2 and B2 are about the same, and the thicknesses A3 and B1 are about the same. The thicknesses A1, A2, and A3 are related by A1>A2>A3. The thicknesses B1, B2, and B3 are related by B3>B2>B1. In some embodiments, the thickness of each successive second semiconductor layer 25 is about 1 to about 2 nm thicker than a respective preceding second semiconductor layer as the distance from the substrate increases. In some embodiments, the thickness of each successive first semiconductor layer 20 is about 1 to about 2 nm thinner than a respective preceding first semiconductor layer as the distance from the substrate increases.

Figure 6:
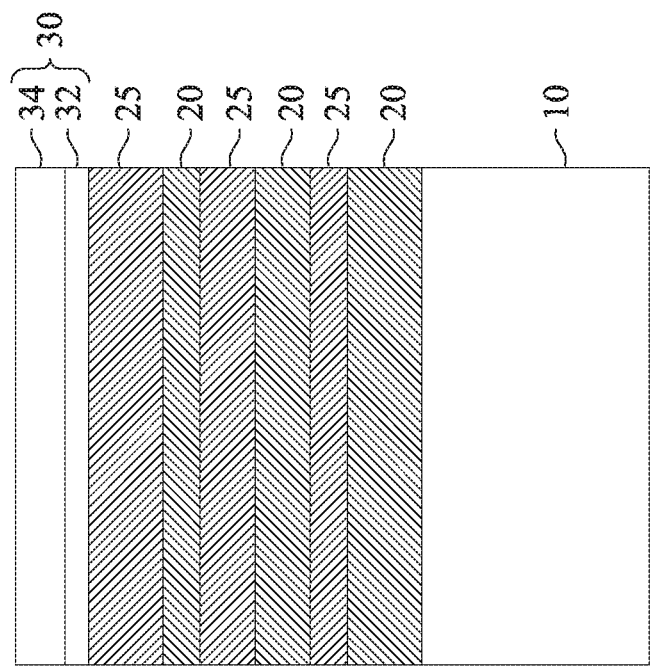
FIG. 6 shows a cross sectional view of one of the various stages of manufacturing a semiconductor GAA FET device according to embodiments of the present disclosure.
Figure 6:
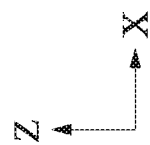

In some embodiments, a mask layer 30 is formed over the uppermost semiconductor layer, as shown in FIG. 6. The mask layer 30 includes a first mask layer 32 and a second mask layer 34 in some embodiments. The first mask layer 32 is a pad oxide layer made of a silicon oxide, which can be formed by a thermal oxidation or chemical vapor deposition (CVD). The second mask layer 34 is made of a silicon nitride, which is formed by CVD, including low pressure CVD (LPCVD) and plasma enhanced CVD (PECVD), physical vapor deposition (PVD), atomic layer deposition (ALD), or other suitable process. The mask layer 30 is patterned into a mask pattern by using patterning operations including photolithography and etching.

Figure 7:
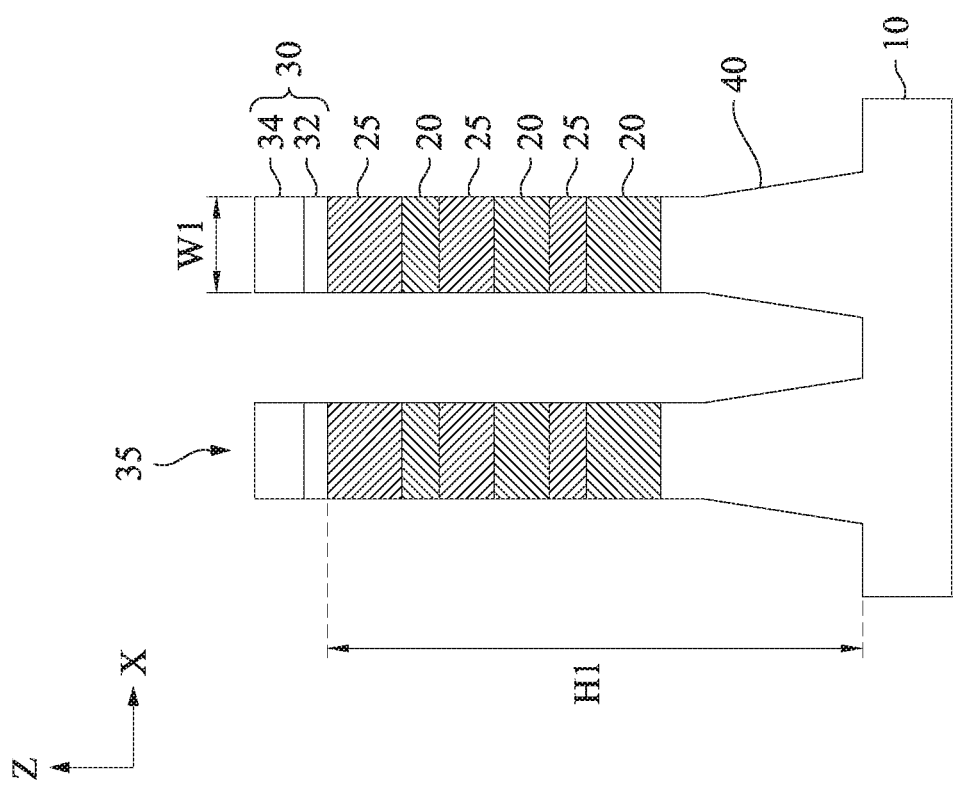
FIG. 7 shows a cross sectional view of one of the various stages of manufacturing a semiconductor GAA FET device according to embodiments of the present disclosure.

Next, as shown in FIG. 7, the stacked layers of the first and second semiconductor layers 20, 25 are patterned by using the patterned mask layer, thereby the stacked layers are formed into fin structures 35 extending in the Y direction. In FIG. 7, two fin structures 35 are arranged in the X direction. But the number of the fin structures is not limited to two, and may be as small as one and three or more. In some embodiments, one or more dummy fin structures are formed on both sides of the fin structures 35 to improve pattern fidelity in the patterning operations. As shown in FIG. 7, the fin structures 35 have upper portions constituted by the stacked semiconductor layers 20, 25 and well portions 40.

The width W1 of the upper portion of the fin structure 35 along the X direction is in a range from about 5 nm to about 40 nm in some embodiments, and is in a range from about 10 nm to about 30 nm in other embodiments. The height H1 along the Z direction of the fin structure is in a range from about 100 nm to about 200 nm in some embodiments.

The stacked fin structure 35 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 35.

After the fin structures 35 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 50 is formed over the fin structures before forming the insulating material layer. The fin liner layer 50 is made of $Si_3N_4$ or a silicon nitride-based material (e.g., SiON, SiCN, or SiOCN).

In some embodiments, the fin liner layers 50 include a first fin liner layer formed over the substrate 10 and sidewalls of the bottom part 40 of the fin structures 35, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Figure 8:
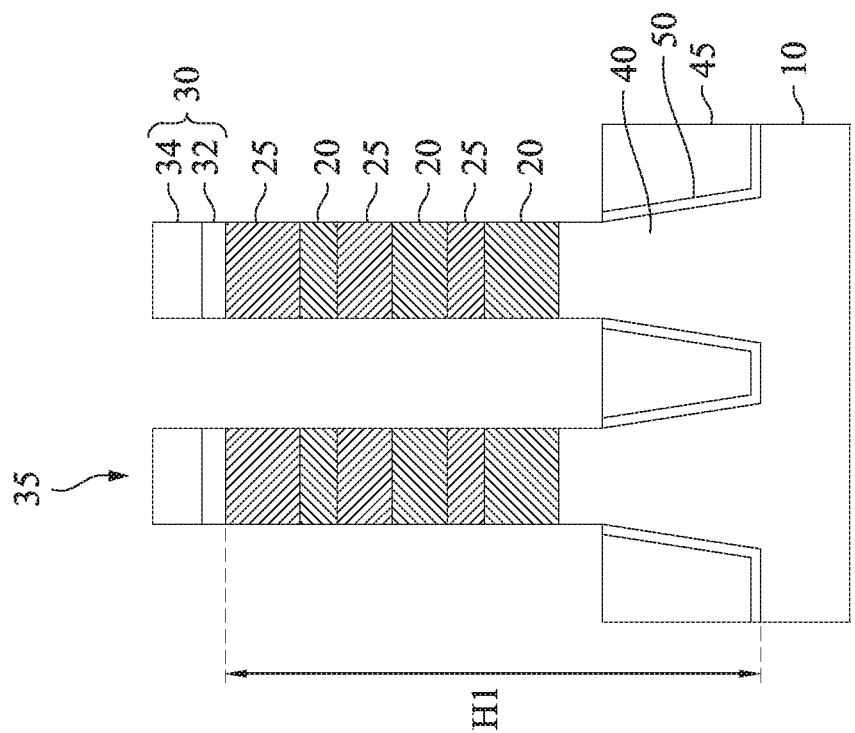
FIG. 8 shows a cross sectional view of one of the various stages of manufacturing a semiconductor GAA FET device according to embodiments of the present disclosure.

Then, as shown in FIG. 8, the insulating material layer is recessed to form an isolation insulating layer 45 so that the upper portions of the fin structures 35 are exposed. With this operation, the fin structures 35 are electrically separated from each other by the isolation insulating layer 45, which is also called a shallow trench isolation (STI).

In the embodiment shown in FIG. 8, the insulating material layer 45 is recessed until the upper portion of the well region 40 is exposed. In other embodiments, the upper portion of the well region 40 is not exposed.

Figure 9B:
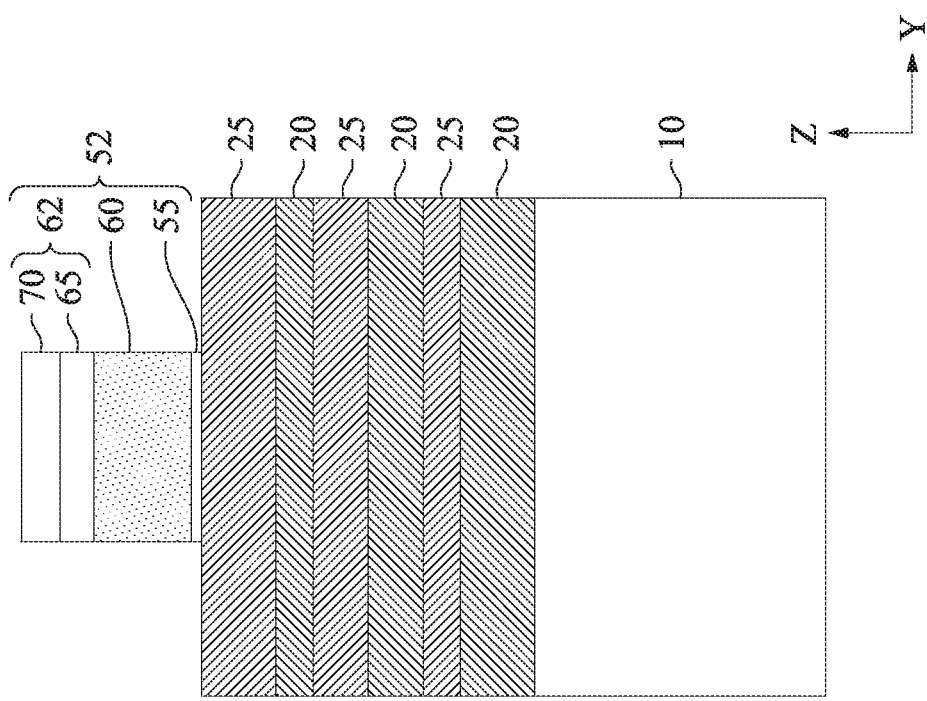
FIGS. 9A and 9B show one of the various stages of manufacturing a semiconductor FET device according to embodiments of the present disclosure.
Figure 9A:
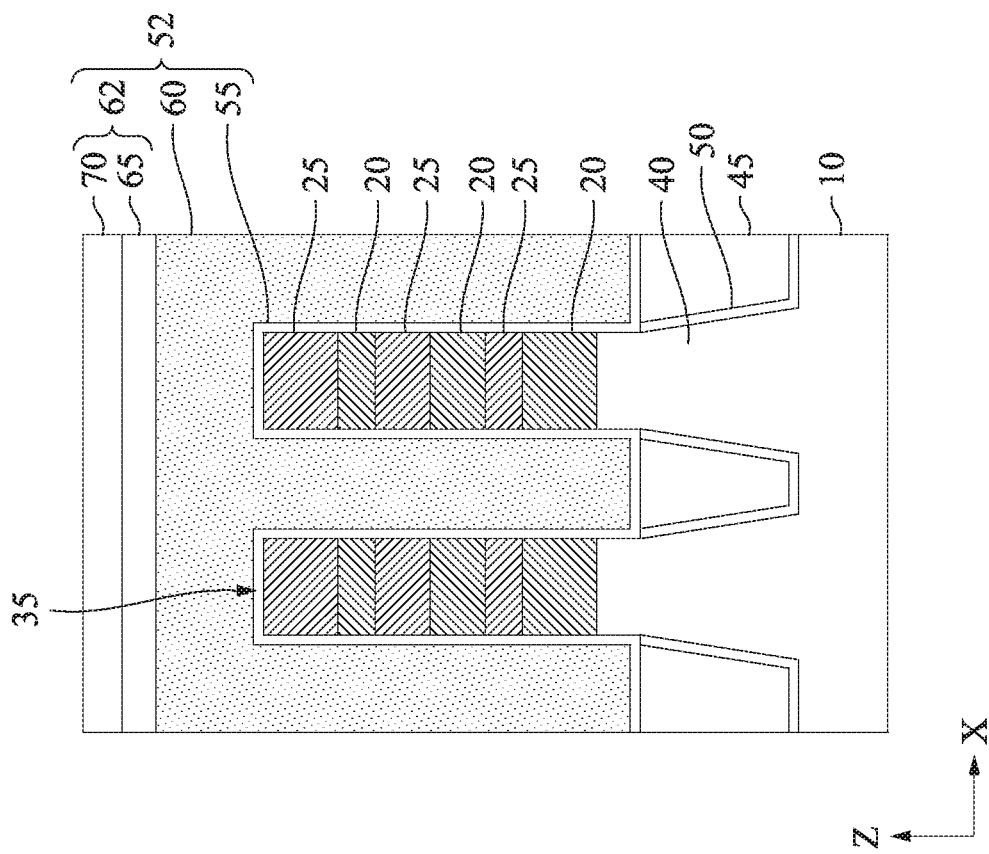

After the isolation insulating layer 45 is formed, a sacrificial (dummy) gate structure 52 is formed in some embodiments, as shown in FIGS. 9A and 9B. FIG. 9A is a cross sectional view taken along the gate electrode in the X-direction (corresponding to line A-A of FIG. 1). FIG. 9B is a cross sectional view taken along the fin structure 35 in the Y-direction (corresponding to line B-B of FIG. 1). FIGS. 9A and 9B illustrate a structure after a sacrificial gate structure 52 is formed over the exposed fin structures 35. The sacrificial gate structure 52 is formed over a portion of the fin structures 35 which is to be a channel region. The sacrificial gate structure 52 defines the channel region of the GAA FET. The sacrificial gate structure 52 includes a sacrificial gate dielectric layer 55 and a sacrificial gate electrode layer 60. The sacrificial gate dielectric layer 55 includes one or more layers of insulating material, such as a silicon oxide-based material. In one embodiment, silicon oxide formed by CVD is used. The thickness of the sacrificial gate dielectric layer 55 is in a range from about 1 nm to about 5 nm in some embodiments.

The sacrificial gate structure 52 is formed by first blanket depositing the sacrificial gate dielectric layer over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer 60 includes silicon such as polycrystalline silicon or amorphous silicon. The thickness of the sacrificial gate electrode layer 60 is in a range from about 100 nm to about 200 nm in some embodiments. In some embodiments, the sacrificial gate electrode layer 60 is subjected to a planarization operation. The sacrificial gate dielectric layer and the sacrificial gate electrode layer are deposited using CVD, including LPCVD and PECVD, PVD, ALD, or other suitable process. Subsequently, a mask layer 62 is formed over the sacrificial gate electrode layer. The mask layer 62 includes a pad silicon nitride layer 65 and a silicon oxide mask layer 70.

Next, a patterning operation is performed on the mask layer 62 and sacrificial gate electrode layer 60 is patterned into the sacrificial gate structure 52, as shown in FIGS. 9A and 9B. The sacrificial gate structure 52 includes the sacrificial gate dielectric layer 55, the sacrificial gate electrode layer 60 (e.g., polysilicon), and the mask layer 62, including the silicon nitride pad layer 65 and the silicon oxide mask layer 70. By patterning the sacrificial gate structure, the stacked layers of the first and second semiconductor layers are partially exposed on opposite sides of the sacrificial gate structure, thereby defining source/drain (S/D) regions. In this disclosure, a source and a drain are interchangeably used and the structures thereof are substantially the same. In FIGS. 9A and 9B, one sacrificial gate structure 52 is formed, but the number of the sacrificial gate structures is not limited to one. Two or more sacrificial gate structures are arranged in the Y direction of the fin structures in some embodiments. In certain embodiments, one or more dummy sacrificial gate structures are formed on both sides of the sacrificial gate structures to improve pattern fidelity.

Figure 10B:
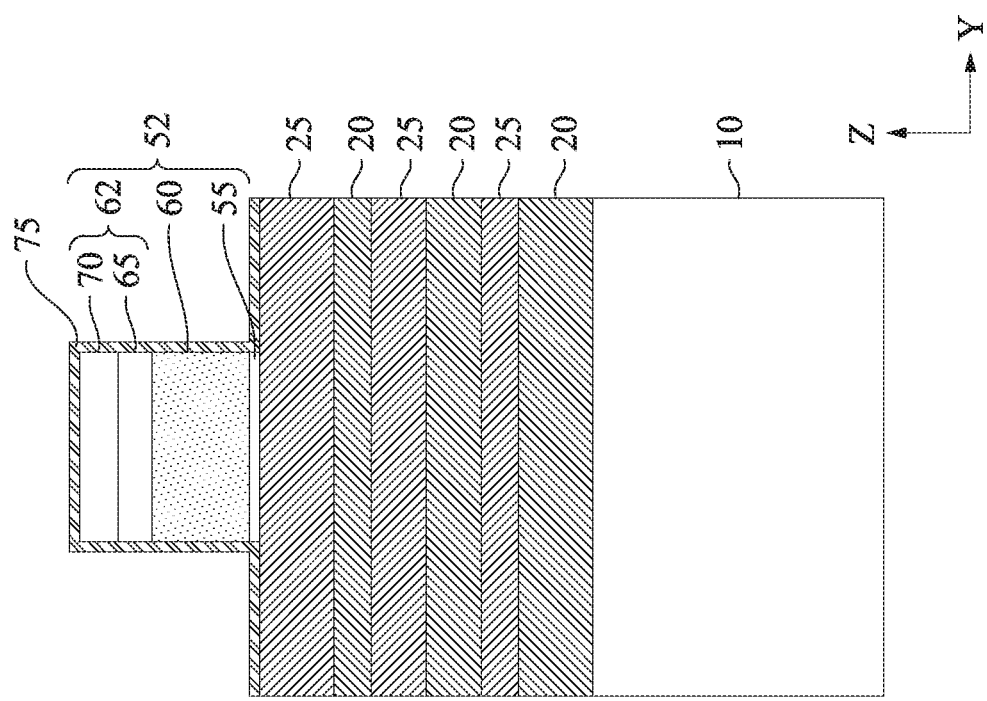
Figure 10A:
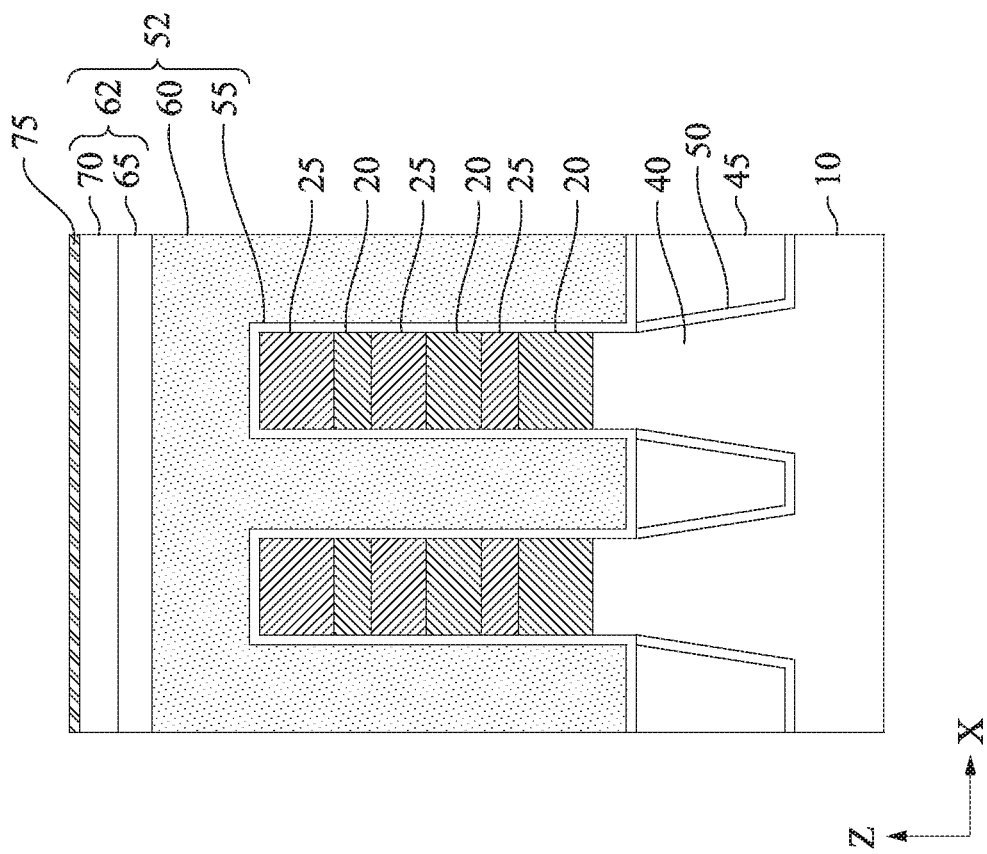

After the sacrificial gate structure 52 is formed, a cover layer 75 made of an insulating material is conformally formed over the exposed fin structures 35 and the sacrificial gate structure 52, as shown in FIGS. 10A-10D. FIG. 10A is a cross sectional view taken along the gate electrode in the X-direction (corresponding to line A-A of FIG. 1). FIG. 10B is a cross sectional view corresponding to the fin structure in the Y-direction (corresponding to line B-B of FIG. 1). FIG. 10C is a cross sectional view corresponding to line C-C of FIG. 1. FIG. 10D is a cross sectional view corresponding to line D-D of FIG. 1. The cover layer 75 is deposited in a conformal manner so it is formed to have substantially equal thicknesses on vertical surfaces, such as the sidewalls, horizontal surfaces, and the top of the sacrificial gate structure, respectively. In some embodiments, the cover layer 75 has a thickness in a range from about 2 nm to about 20 nm, in other embodiments, the cover layer 75 has a thickness in a range from about 5 nm to about 15 nm.

In some embodiments, the cover layer 75 includes a first cover layer and a second cover layer. The first cover layer may include a low-k dielectric material, such as SiOC and/or SiOCN or any other suitable dielectric material, and the second cover layer may include one or more of $Si_3N_4$, SiON, and SiCN or any other suitable dielectric material. The first cover layer and the second cover layer are made of different materials in some embodiments so they can be selectively etched. The first cover layer and the second cover layer can be formed by ALD or CVD, or any other suitable method.

Figure 11B:
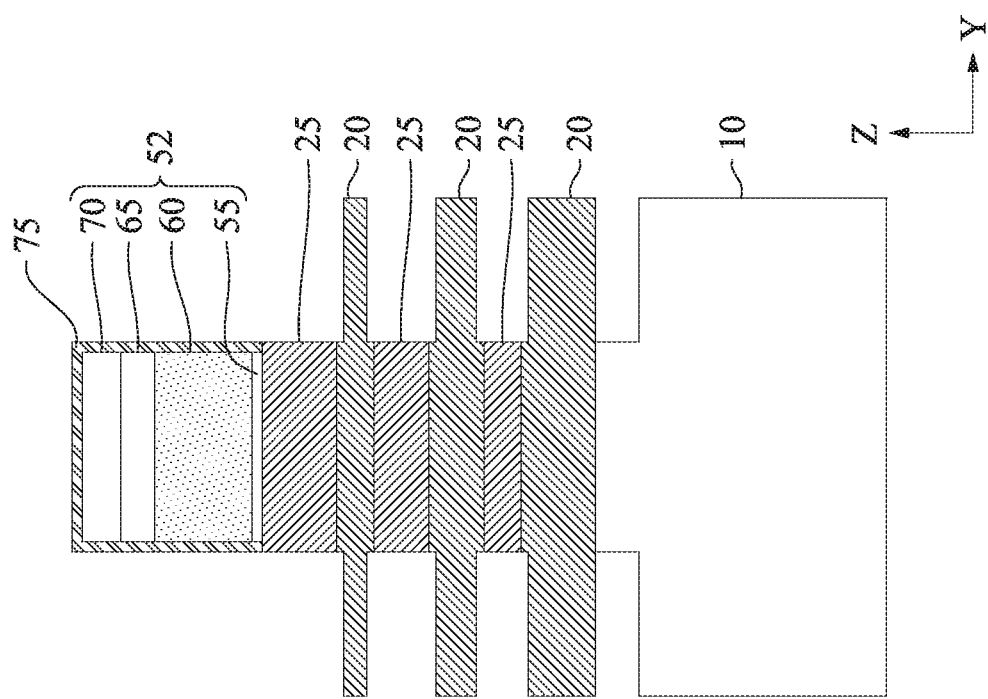
FIGS. 11A-11D show one of the various stages of manufacturing a semiconductor FET device according to embodiments of the present disclosure.
Figure 11A:
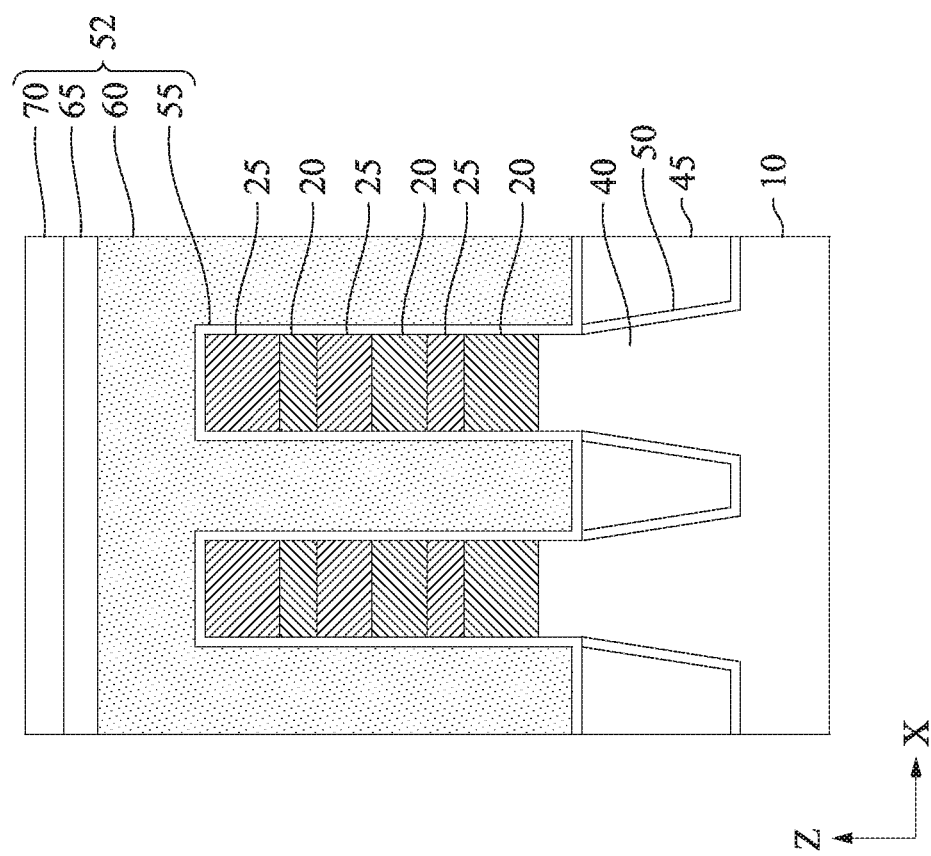
Figure 11D:
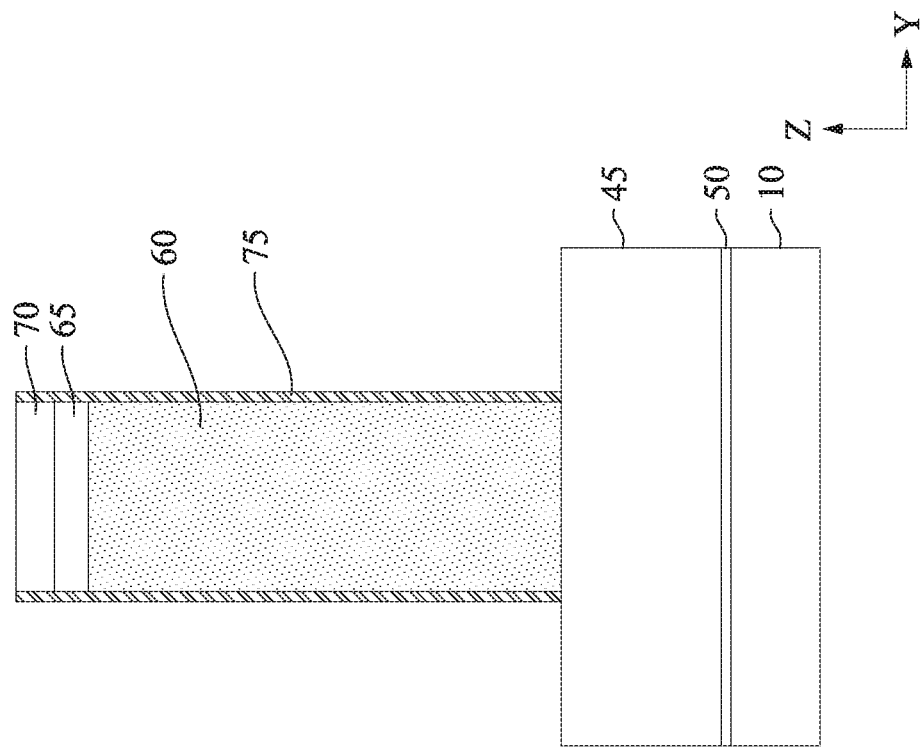
Figure 11C:
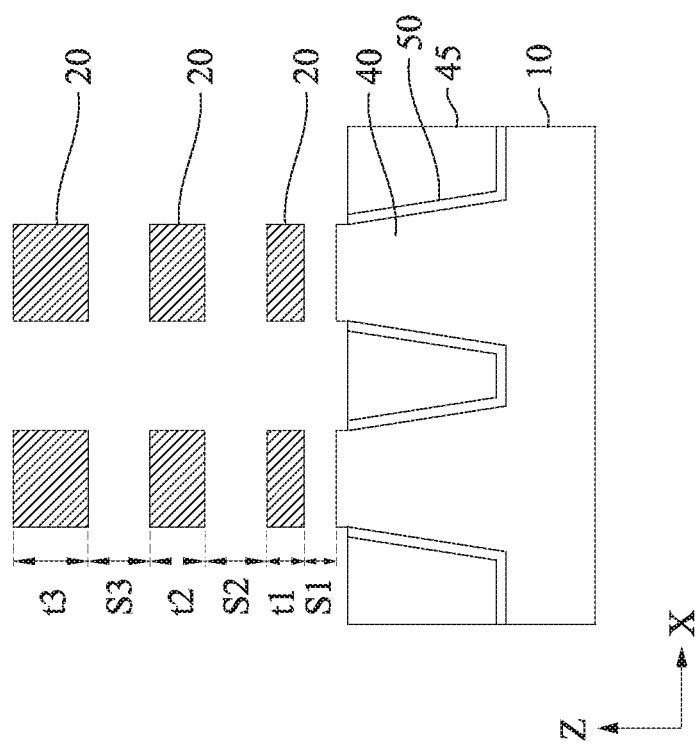

Then, as shown in FIGS. 11A-11D, the cover layer 75 is subjected to anisotropic etching to remove the cover layer 75 formed over the silicon oxide mask layer 70 and the source/drain regions, and then the second semiconductor layers 25 and upper portion of the substrate 10 in the source/drain regions are removed down to about the upper surface of the isolation insulating layer 45 in some embodiments. FIG. 11A is a cross sectional view corresponding to the gate electrode in the X-direction (corresponding to line A-A of FIG. 1). FIG. 11B is a cross sectional view taken along the fin structure in the Y-direction (corresponding to line B-B of FIG. 1). FIG. 11C is a cross sectional view corresponding to line C-C of FIG. 1. FIG. 11D is a cross sectional view corresponding to line D-D of FIG. 1. The second semiconductor layers 25 and upper portion of the substrate are removed using a suitable etching operation. For example, when the second semiconductor layers 25 are Si and the first semiconductor layers 20 are Ge or SiGe, the second semiconductor layers 25 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, the second semiconductor layers 25 are removed when forming a p-type pFET.

As shown in FIG. 11B, in some embodiments, the wet etchant used in removing the portions of the second semiconductor layer 25 in the source/drain regions also partially etches the first semiconductor layers 20. The amount of the first semiconductor layer 20 etched during the second semiconductor removal is greater in the upper first semiconductor layers 20 (the layers a further distance away from the semiconductor substrate 10). The upper first semiconductor layers 20 are exposed to the wet etchant for a longer period of time than the lower first semiconductor layers.

As shown in FIG. 11C, in some embodiments, as a result of the partial etching of the first semiconductor layers 20 during the removal of the second semiconductor layers 25 in the source/drain regions, the thickness t1, t2, t3 of each of the portion of the first semiconductor layers 20 in the source/drain regions is substantially the same, and the spaces S1, S2, S3 between adjacent first semiconductor layers 20 is substantially the same. By substantially the same it is meant that the thicknesses of each layer are within 5% of each other, and the distance of the spaces between adjacent layers are within 5% of each other.

The cover layer 75 and sacrificial gate dielectric layer 55 are completely removed in the source/drain regions using suitable lithography and etching techniques in some embodiments.

Figure 11E:
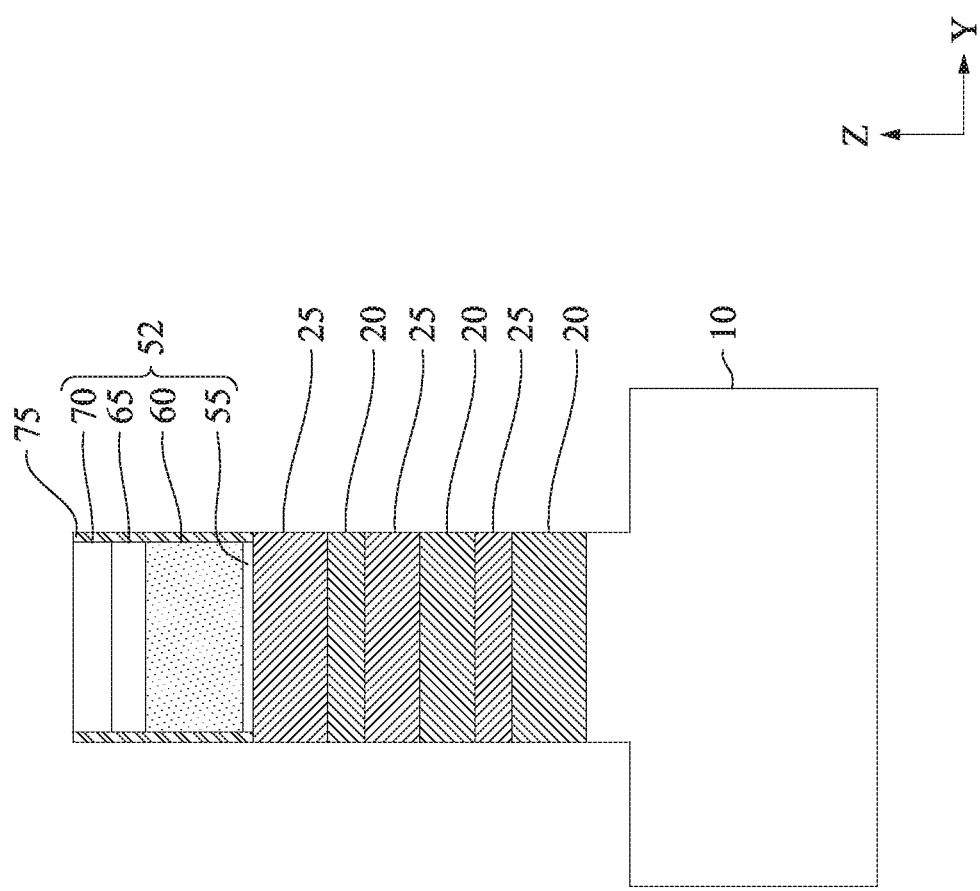
FIG. 11E is a cross sectional view corresponding to line B-B of FIG. 1 of another embodiment.

In other embodiments, the fin structures in the source/drain regions are recessed down to about the upper surface of the isolation insulating layer 45, as shown in FIG. 11E. In other words, all the first and second semiconductor layers and the upper portion of the substrate 10 are removed in the source/drain regions. FIG. 11E is a cross sectional view corresponding to line B-B of FIG. 1. The fin structures are recessed by a recess etching operation using suitable etchants in some embodiments. In some embodiments, the recess etching operation is a dry etching operation. In some embodiments, the fin structures are recessed in the source/drain regions when forming an n-type pFET.

Figure 12B:
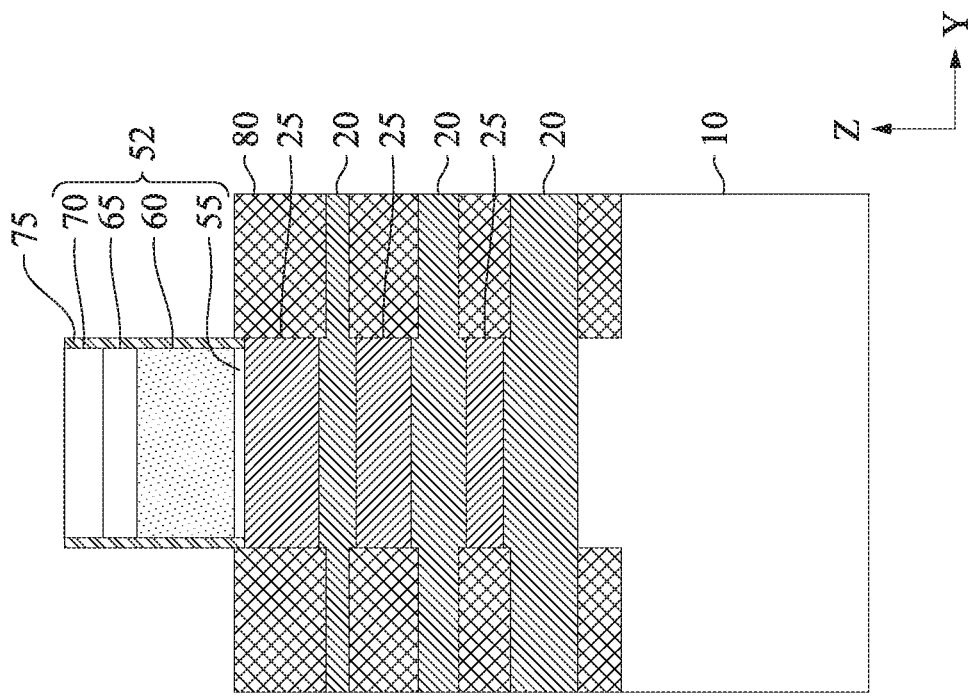
FIGS. 12A-12D show one of the various stages of manufacturing a semiconductor FET device according to embodiments of the present disclosure.
Figure 12A:
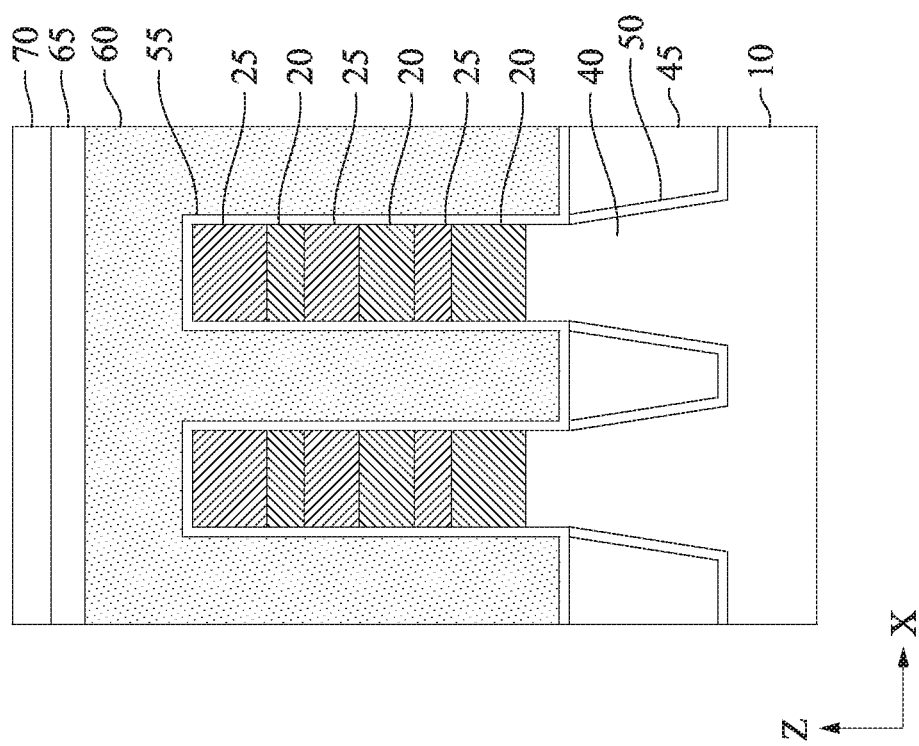
Figure 12D:
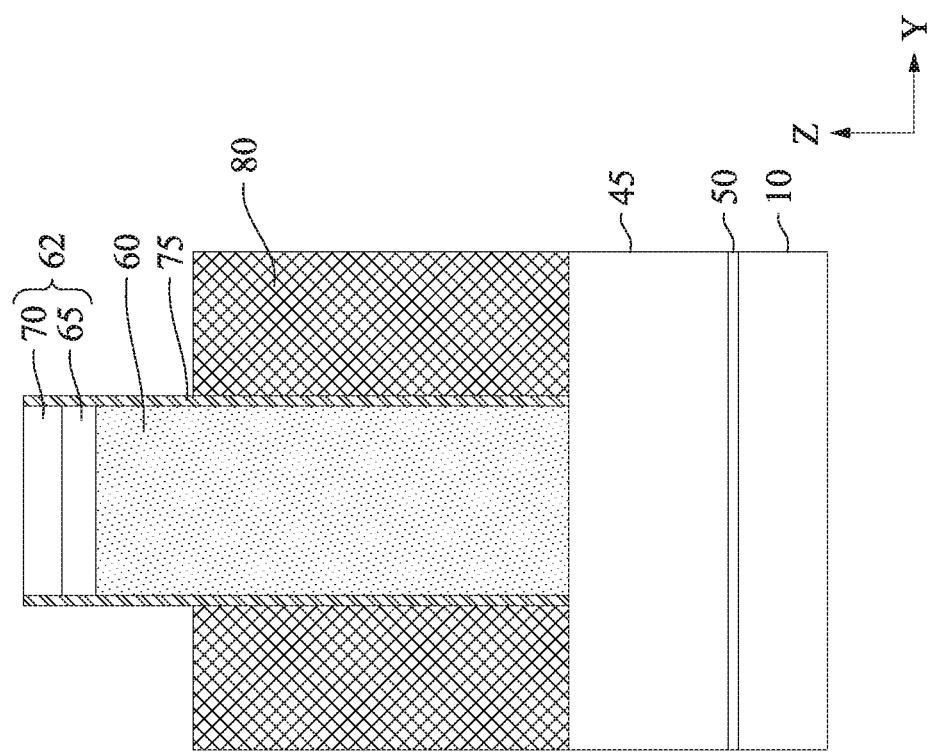
Figure 12C:
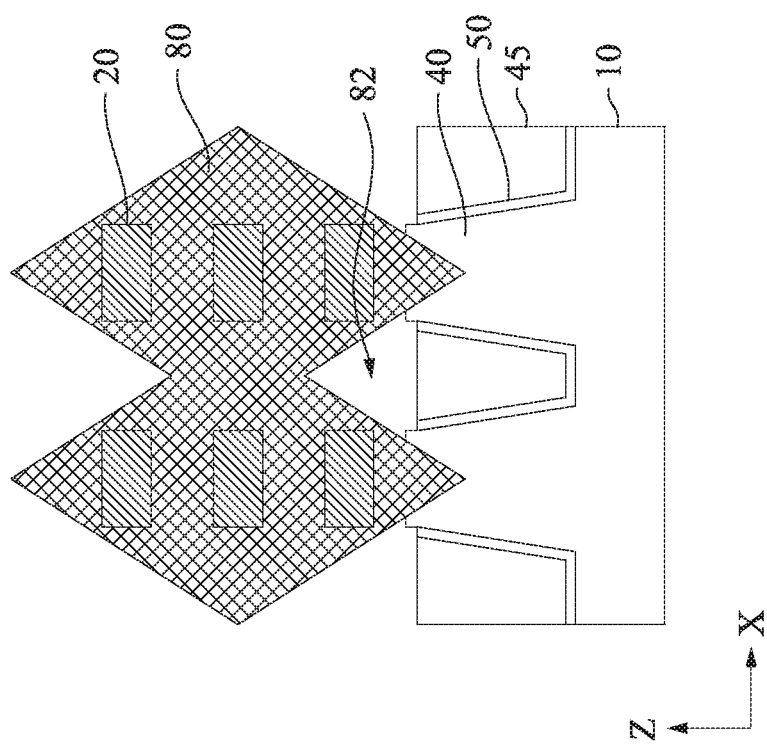

Subsequently, a source/drain epitaxial layer 80 is formed, as shown in FIGS. 12A-12D. FIG. 12A is a cross sectional view taken along the gate electrode in the X-direction (corresponding to line A-A of FIG. 1). FIG. 12B is a cross sectional view taken along the fin structure in the Y-direction (corresponding to line B-B of FIG. 1). FIG. 12C is a cross sectional view corresponding to line C-C of FIG. 1. FIG. 12D is a cross sectional view corresponding to line D-D of FIG. 1.

The source/drain epitaxial layer 80 includes one or more layers of Si, SiP, SiC, and SiCP for an n-channel FET or Si, SiGe, Ge for a p-channel FET. For the P-channel FET, boron (B) may also be contained in the source/drain. The source/drain epitaxial layers 80 are formed by an epitaxial growth method using CVD, ALD, or molecular beam epitaxy (MBE). As shown in FIG. 12C, the source/drain epitaxial layers 80 grow around the fin structures, and the grown epitaxial layers merge above the isolation insulating layer 45 and subsequently define a void 82 in some embodiments. The source/drain epitaxial layer 80 is formed in contact with the cover layer 75 disposed over side faces of the sacrificial gate structure 52, as shown in FIG. 12D.

In some embodiments, the source/drain epitaxial layer 80 has a diamond shape, a hexagonal shape, other polygonal shapes, or a semi-circular shape in cross section.

Figure 12F:
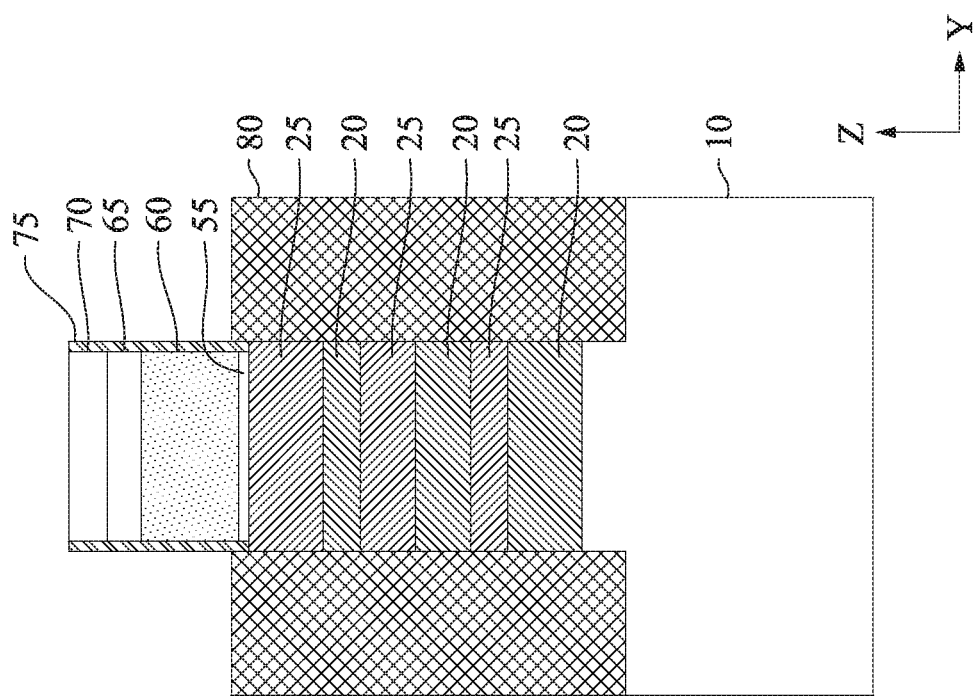
FIG. 12F is a cross sectional view corresponding to line B-B of FIG. 1 of another embodiment.
Figure 12E:
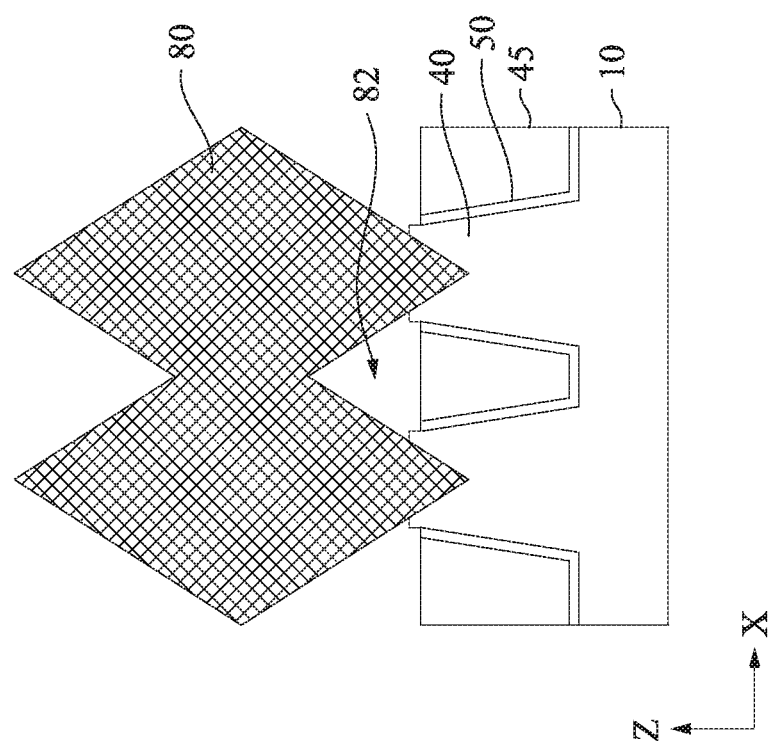
FIG. 12E is a cross sectional view corresponding to line C-C of FIG. 1

FIGS. 12E and 12F show another embodiment, where the source/drain epitaxial layer 80 is formed on the structure of FIG. 11E. FIG. 12E is a cross sectional view corresponding to line C-C of FIG. 1 and FIG. 12F is a cross sectional view corresponding to line B-B of FIG. 1.

Figure 13D:
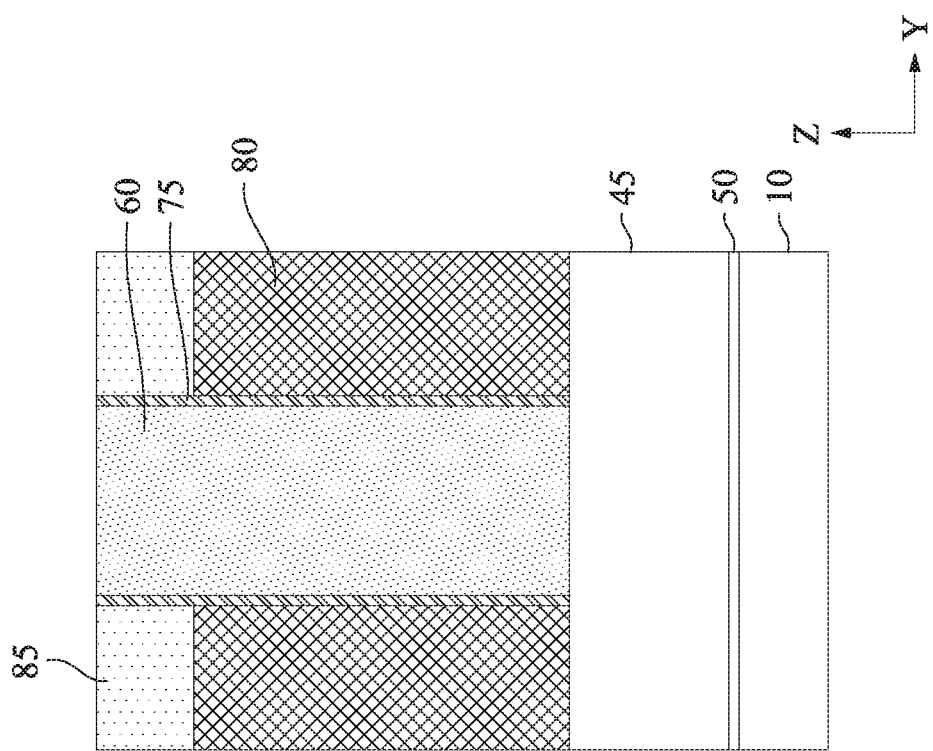
Figure 13C:
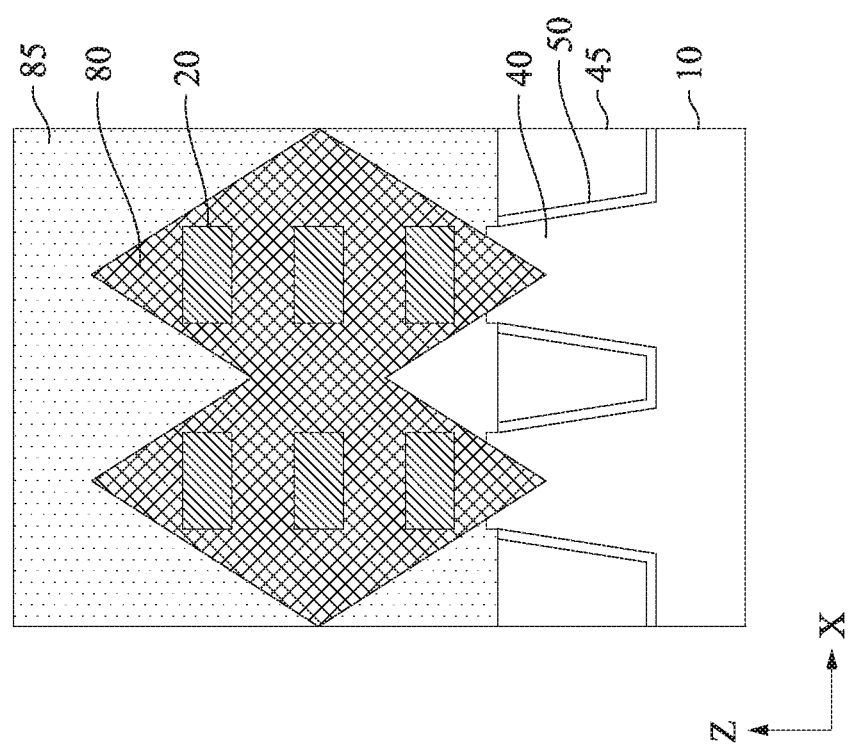

Subsequently, an interlayer dielectric (ILD) layer 85 is formed, as shown in FIGS. 13A-13D. FIG. 13A is a cross sectional view taken along the gate electrode in the X-direction (corresponding to line A-A of FIG. 1). FIG. 13B is a cross sectional view taken along the fin structure in the Y-direction (corresponding to line B-B of FIG. 1). FIG. 13C is a cross sectional view corresponding to line C-C of FIG. 1. FIG. 13D is a cross sectional view corresponding to line D-D of FIG. 1.

The materials for the ILD layer 85 include compounds comprising Si, O, C, and/or H, such as silicon oxide, SiCOH and SiOC. Organic materials, such as polymers, may be used for the ILD layer 85. After the ILD layer 85 is formed, a planarization operation, such as chemical-mechanical polishing (CMP), is performed, so that the top portion of the sacrificial gate electrode layer 60 is exposed. The CMP also removes a portion of the cover layer 75, and the mask layer 62 covering the upper surface of the sacrificial gate electrode layer 60.

Figure 13F:
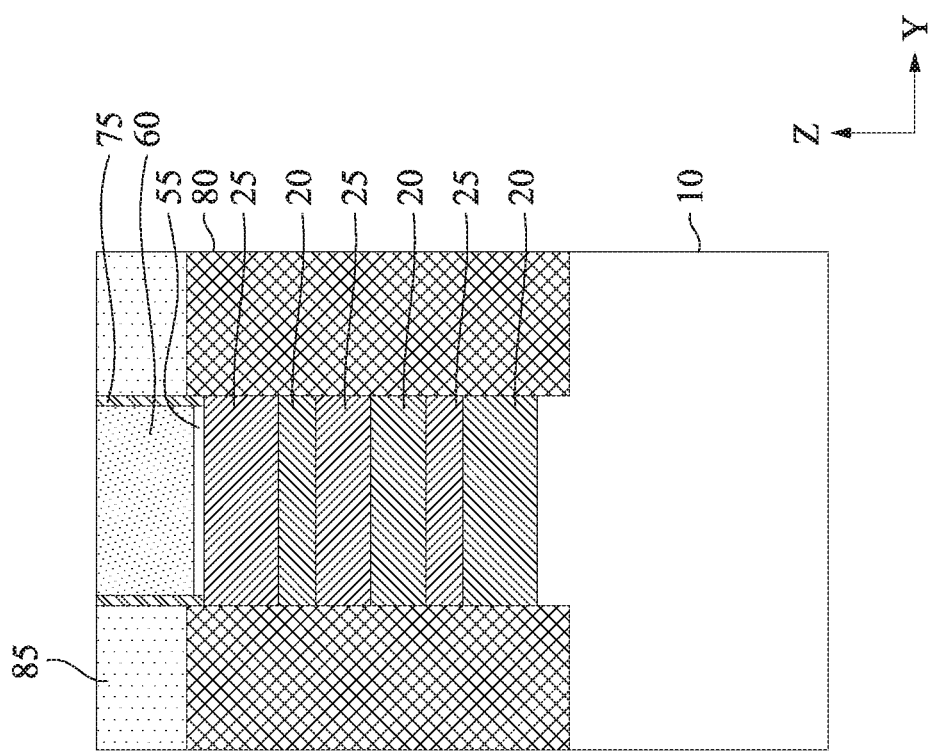
FIG. 13F is a cross sectional view corresponding to line B-B of FIG. 1 of another embodiment.
Figure 13E:
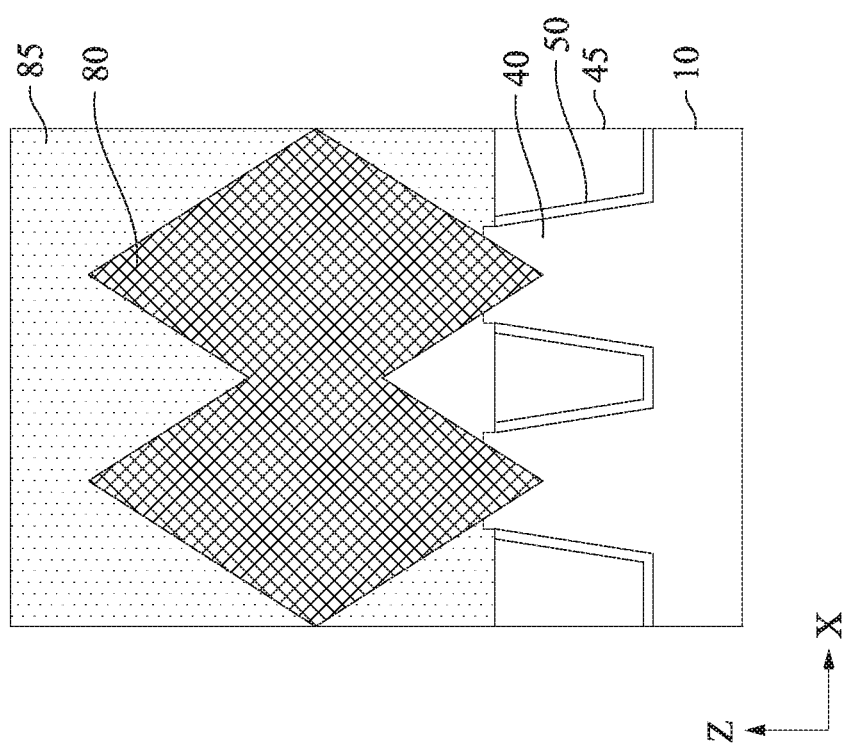
FIG. 13E is a cross sectional view taken along line C-C of FIG. 1

FIGS. 13E and 13F show another embodiment, where the ILD layer 85 is formed on the structure of FIGS. 12E and 12F. FIG. 13E is a cross sectional view corresponding to line C-C of FIG. 1 and FIG. 13F is a cross sectional view corresponding to line B-B of FIG. 1.

Figure 14B:
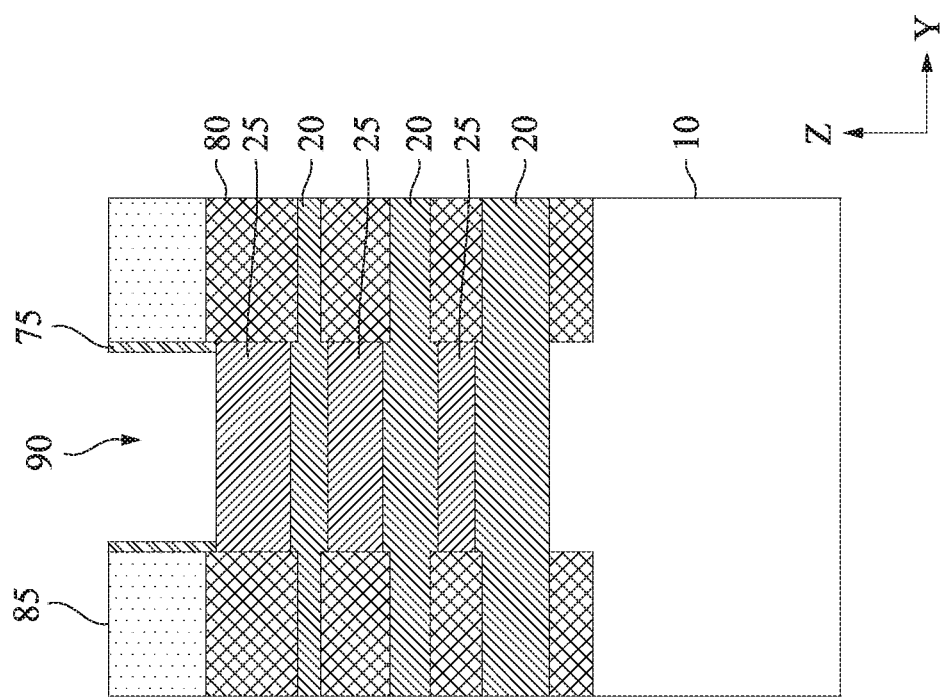
FIGS. 14A-14D show one of the various stages of manufacturing a semiconductor FET device according to embodiments of the present disclosure.
Figure 14A:
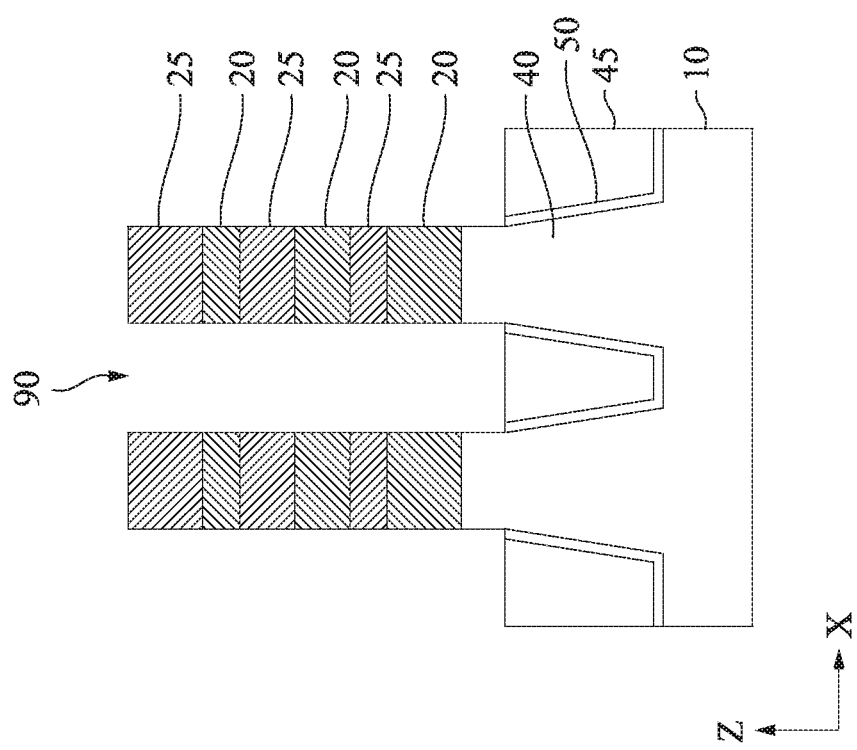
Figure 14D:
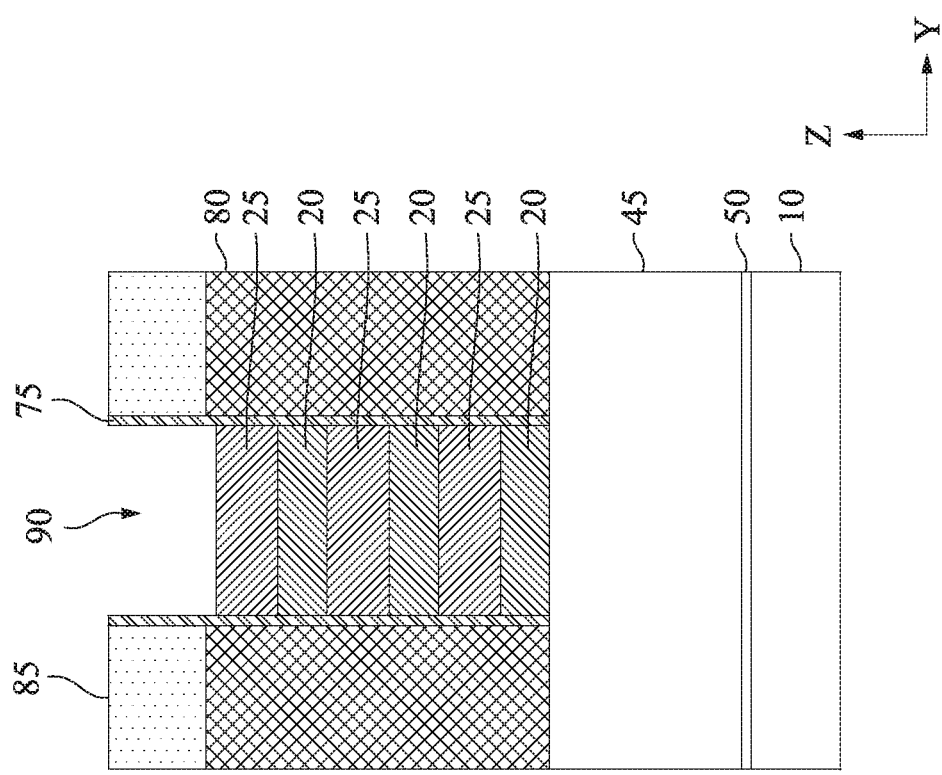
Figure 14C:
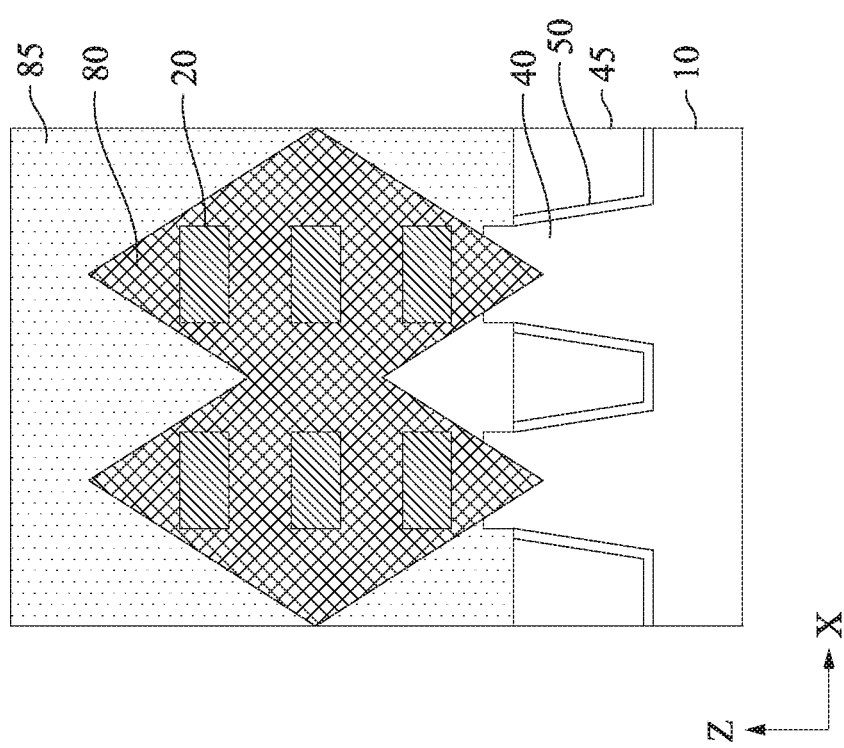

Then, the sacrificial gate electrode layer 60 and sacrificial gate dielectric layer 55 are removed, thereby forming a gate space 90, in which the channel regions of the fin structures are exposed, as shown in FIGS. 14A-14D. FIG. 14A is a cross sectional view taken along the gate electrode in the X-direction (corresponding to line A-A of FIG. 1). FIG. 14B is a cross sectional view taken along the fin structure in the Y-direction (corresponding to line B-B of FIG. 1). FIG. 14C is a cross sectional view corresponding to line C-C of FIG. 1. FIG. 14D is a cross sectional view corresponding to line D-D of FIG. 1.

The ILD layer 85 protects the S/D structures 80 during the removal of the sacrificial gate structures. The sacrificial gate structures can be removed using plasma dry etching and/or wet etching. When the sacrificial gate electrode layer 60 is polysilicon and the ILD layer 85 is silicon oxide, a wet etchant such as a tetramethylammonium hydroxide (TMAH) solution can be used to selectively remove the sacrificial gate electrode layer 60. The sacrificial gate dielectric layer 55 is thereafter removed using plasma dry etching and/or wet etching.

Figure 14F:
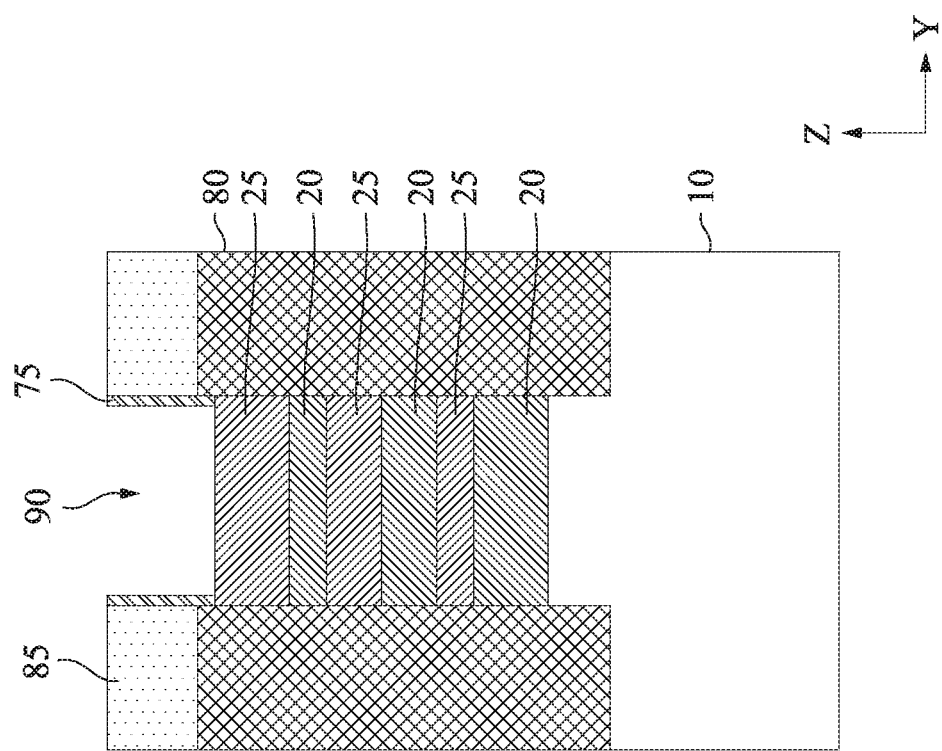
FIG. 14F is a cross sectional view corresponding to line B-B of FIG. 1 of another embodiment.
Figure 14E:
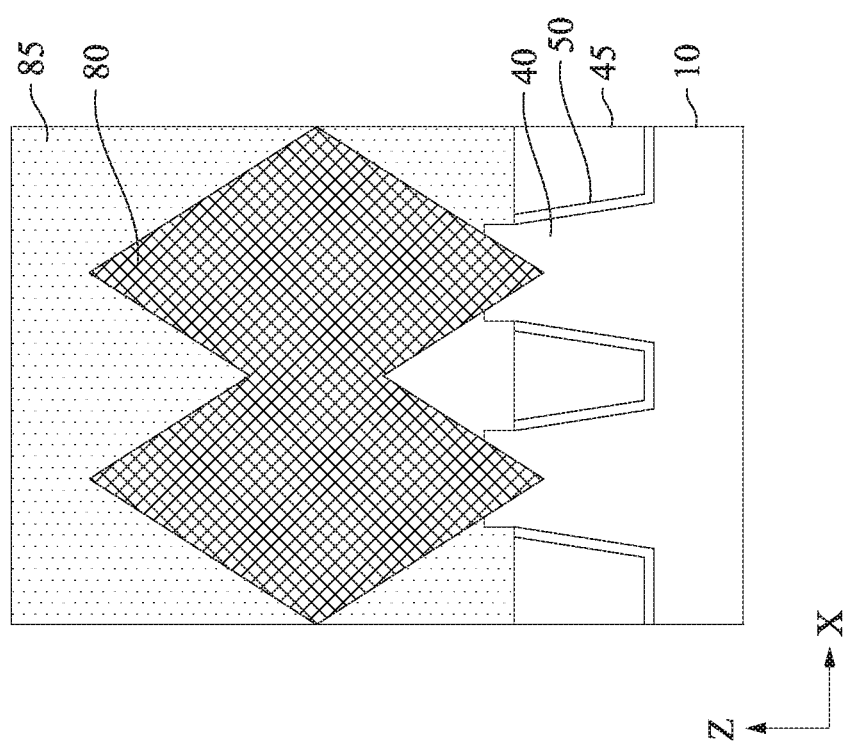
FIG. 14E is a cross sectional view corresponding to line C-C of FIG. 1

FIG. 14E is a cross sectional view corresponding to line C-C of FIG. 1 and FIG. 14F is a cross sectional view corresponding to line B-B of FIG. 1 of another embodiment where the sacrificial gate electrode layer 60 and sacrificial gate dielectric layer of FIG. 13F are removed.

Figure 15B:
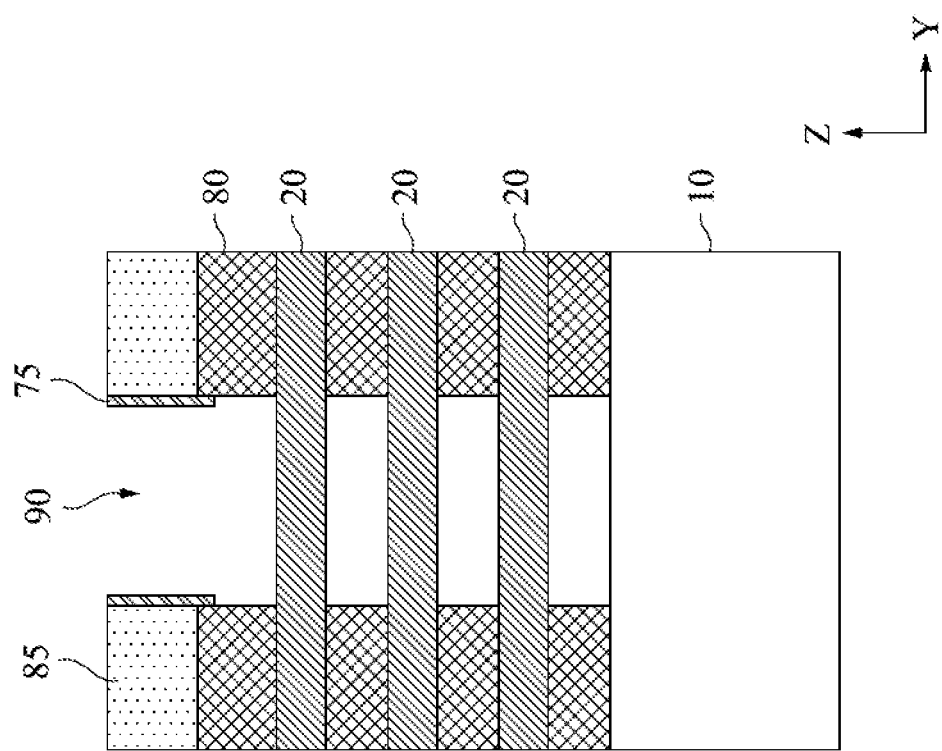
FIGS. 15A-15D show one of the various stages of manufacturing a semiconductor FET device according to embodiments of the present disclosure.
Figure 15A:
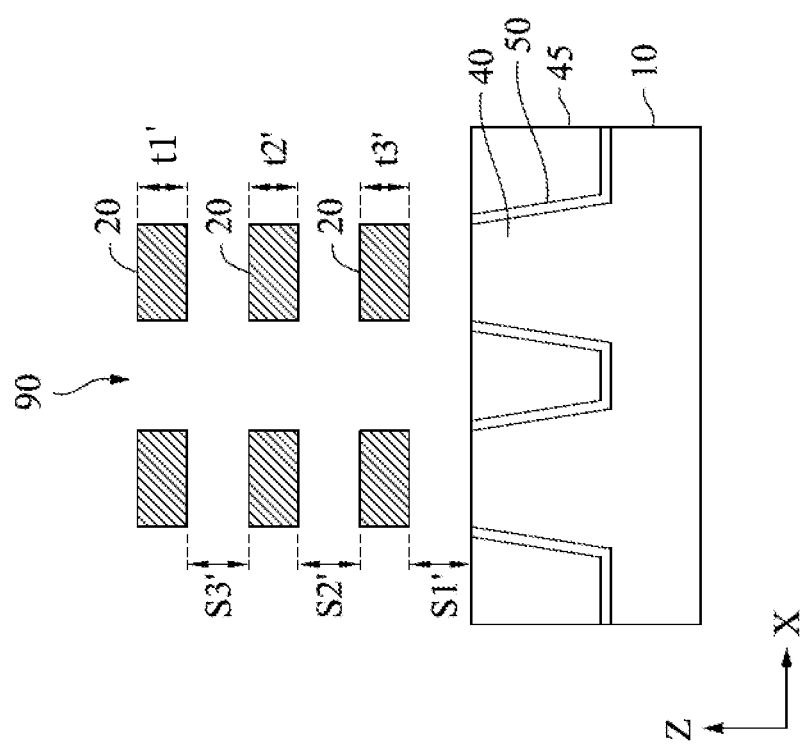
Figure 15C:
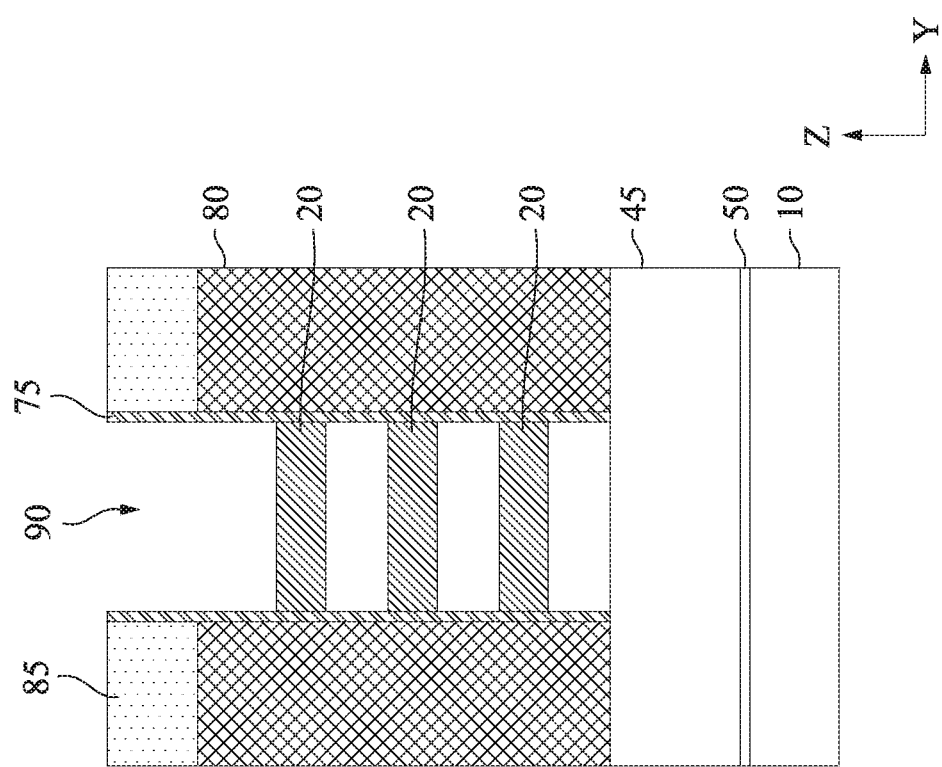
Figure 15D:
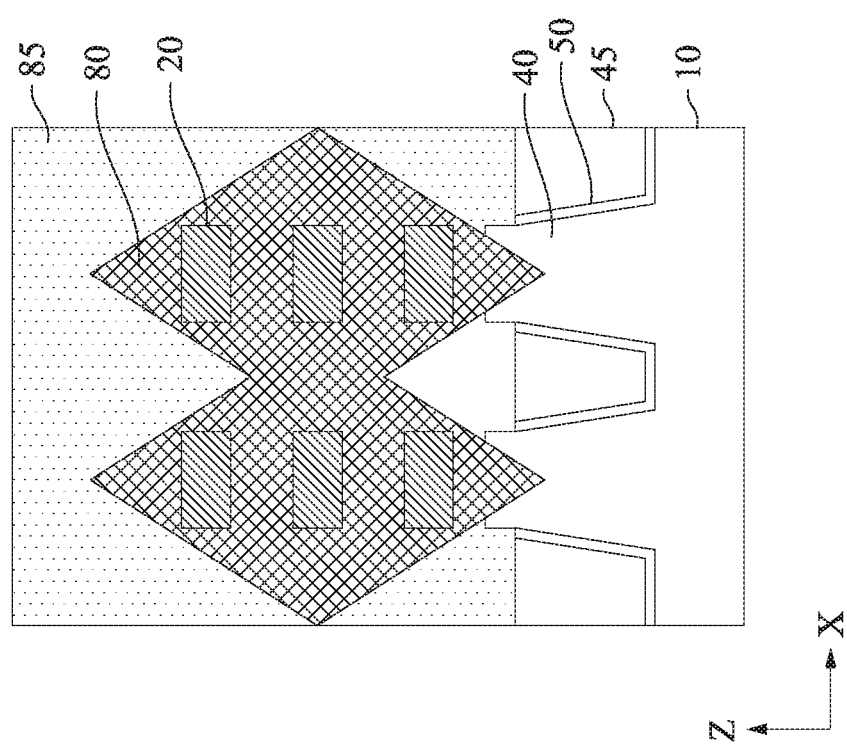

After the sacrificial gate structure is removed, the second semiconductor layers 25 in the fin structures are removed, thereby forming nanowires of the first semiconductor layers 20, as shown in FIGS. 15A-15D. FIG. 15A is a cross sectional view taken along the gate electrode in the X-direction (corresponding to line A-A of FIG. 1). FIG. 15B is a cross sectional view taken along the fin structure in the Y-direction (corresponding to line B-B of FIG. 1). FIG. 15C is a cross sectional view corresponding to line C-C of FIG. 1. FIG. 15D is a cross sectional view corresponding to line D-D of FIG. 1.

The second semiconductor layers 25 can be removed or etched using an etchant that selectively etches the second semiconductor layers 25 against the first semiconductor layers 20. When the second semiconductor layers 25 are Si and the first semiconductor layers 20 are Ge or SiGe, the second semiconductor layers 25 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, the etching solution heated to a temperature of about 60° C. or greater when applied to the second semiconductor layers 25. When the second semiconductor layers 25 are Si and the substrate 10 is a silicon substrate, the etching of the second semiconductor layers 25 also removes a portion of the fin structure underlying the bottommost first semiconductor layer 20. When the second semiconductor layers 25 and the substrate 10 are made of different materials an additional etching operation is performed in some embodiments to remove a portion of the fin structure underlying the bottommost second semiconductor layer 25, to provide the structure shown in FIGS. 15A and 15B.

In some embodiments, the wet etchant used in removing the portions of the second semiconductor layer 25 in the channel regions also partially etches the first semiconductor layers 20. The amount of the first semiconductor layer 20 etched during the second semiconductor removal is greater in the upper first semiconductor layers 20 (the layers a further distance away from the semiconductor substrate 10). The upper first semiconductor layers 20 are exposed to the wet etchant for a longer period of time than the lower first semiconductor layers. In some embodiments, as a result of the partial etching of the first semiconductor layers 20 during the removal of the second semiconductor layers 25 in the channel regions, the resulting thickness t1', t2', t3' of each first semiconductor nanowire 20 of the nanowire structure in the channel regions is about the same, and the spaces S1', S2', S3' between adjacent first semiconductor layers 20 is substantially the same. By substantially the same it is meant that the thicknesses of each layer are within 5% of each other, and the distance of the spaces between adjacent layers are within 5% of each other.

FIGS. 15E and 15F show another embodiment, where the second semiconductor layers 25 are removed from the structure of FIG. 14F. FIG. 15E is a cross sectional view corresponding to line C-C of FIG. 1 and FIG. 15F is a cross sectional view corresponding to line B-B of FIG. 1.

In some embodiments, a combination of dry etching techniques and wet etching techniques are used to remove the second semiconductor layer 25.

The cross sectional shape of the semiconductor nanowires 20 in the channel region are shown as rectangular, but can be any polygonal shape (triangular, diamond, etc.), polygonal shape with rounded corners, circular, or oval (vertically or horizontally).

In other embodiments, any of the previously described operations are modified so that the first semiconductor layers 20 are removed by using suitable etching techniques, and nanowires made of the second semiconductor layer 25 are obtained, and the succeeding operations of forming a gate dielectric layer and gate electrode layer are performed on a channel nanowire structure having nanowires made of the second semiconductor layer 25.

Figure 16B:
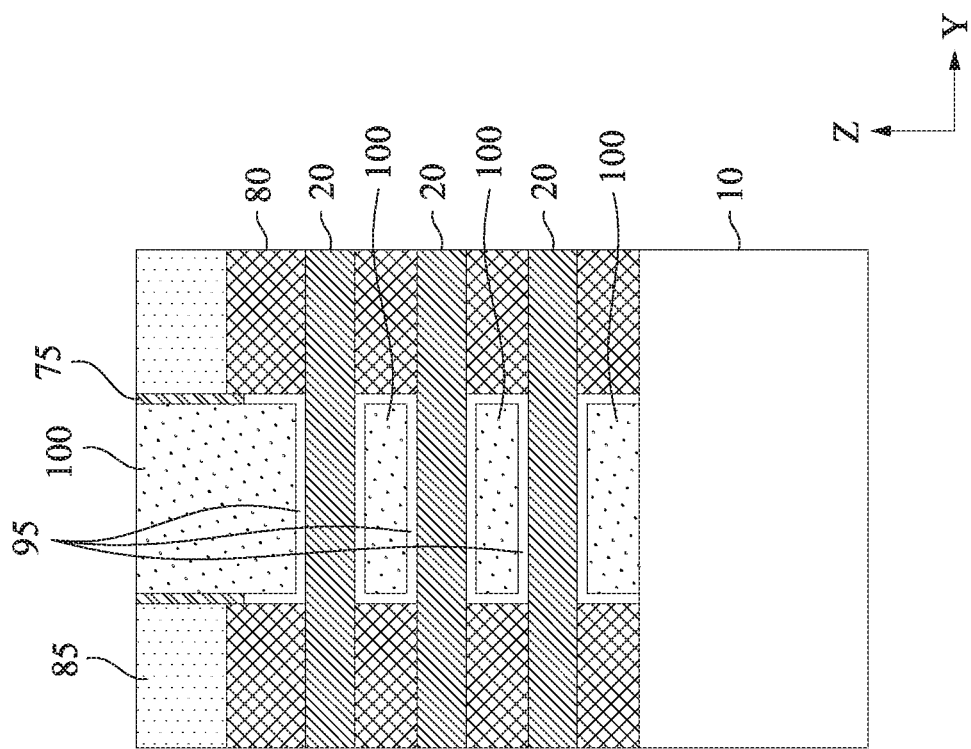
FIGS. 16A-16D show one of the various stages of manufacturing a semiconductor FET device according to embodiments of the present disclosure.
Figure 16A:
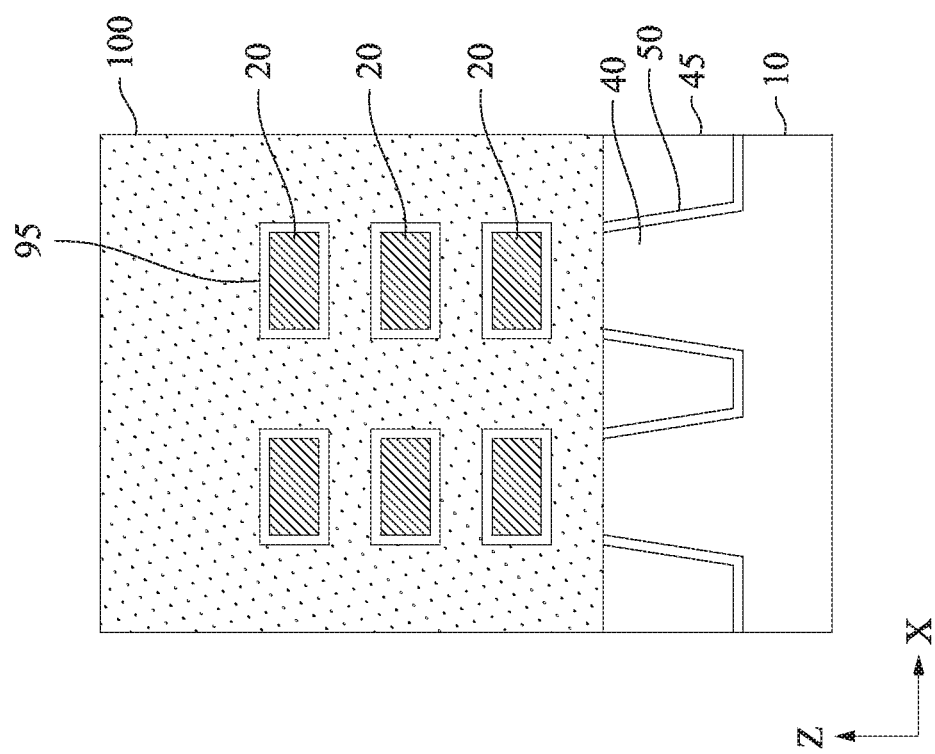
Figure 16D:
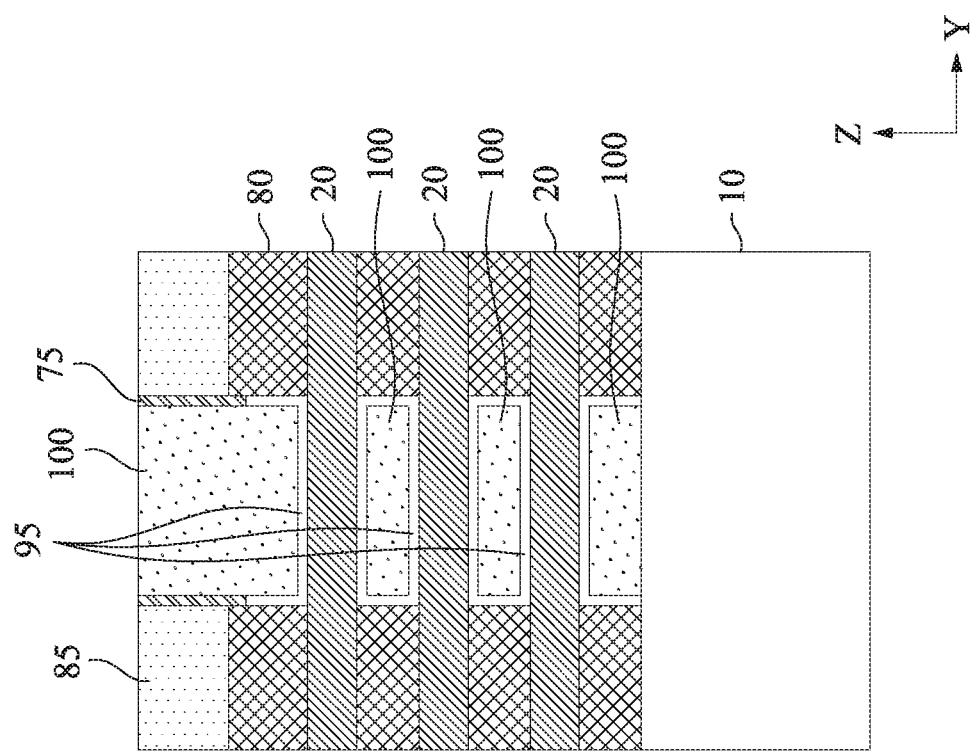
Figure 16C:
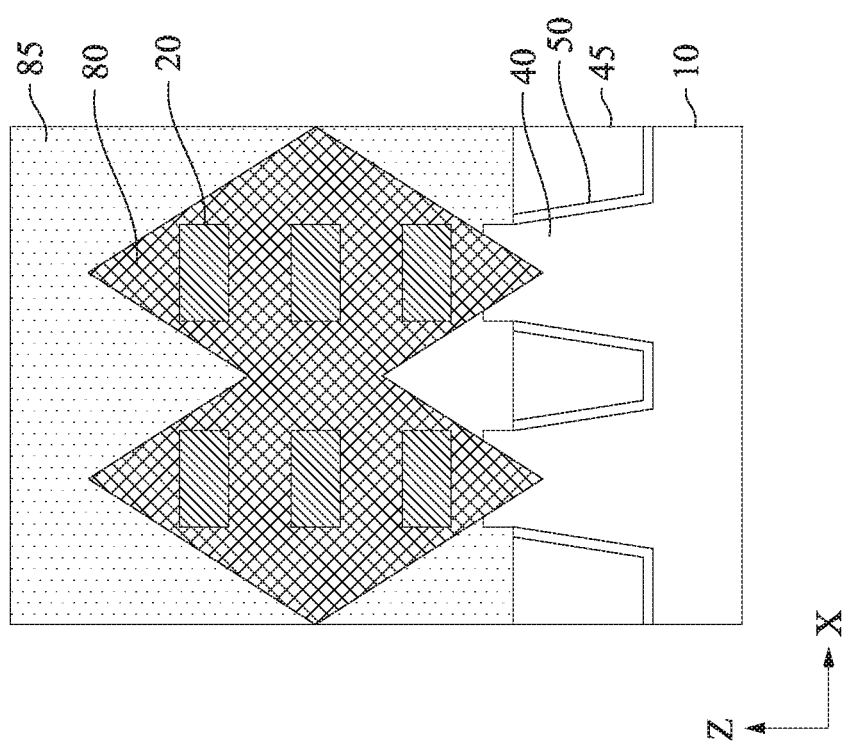

After the semiconductor nanowires of the first semiconductor layers 20 are formed, a gate dielectric layer 95 is formed around each channel layer (nanowire) 20, and a gate electrode layer 100 is formed over the gate dielectric layer 95, as shown in FIGS. 16A-16D. FIG. 16A is a cross sectional view taken along the gate electrode in the X-direction (corresponding to line A-A of FIG. 1). FIG. 16B is a cross sectional view taken along the fin structure in the Y-direction (corresponding to line B-B of FIG. 1). FIG. 16C is a cross sectional view corresponding to line C-C of FIG. 1. FIG. 16D is a cross sectional view corresponding to line D-D of FIG. 1.

Figure 16F:
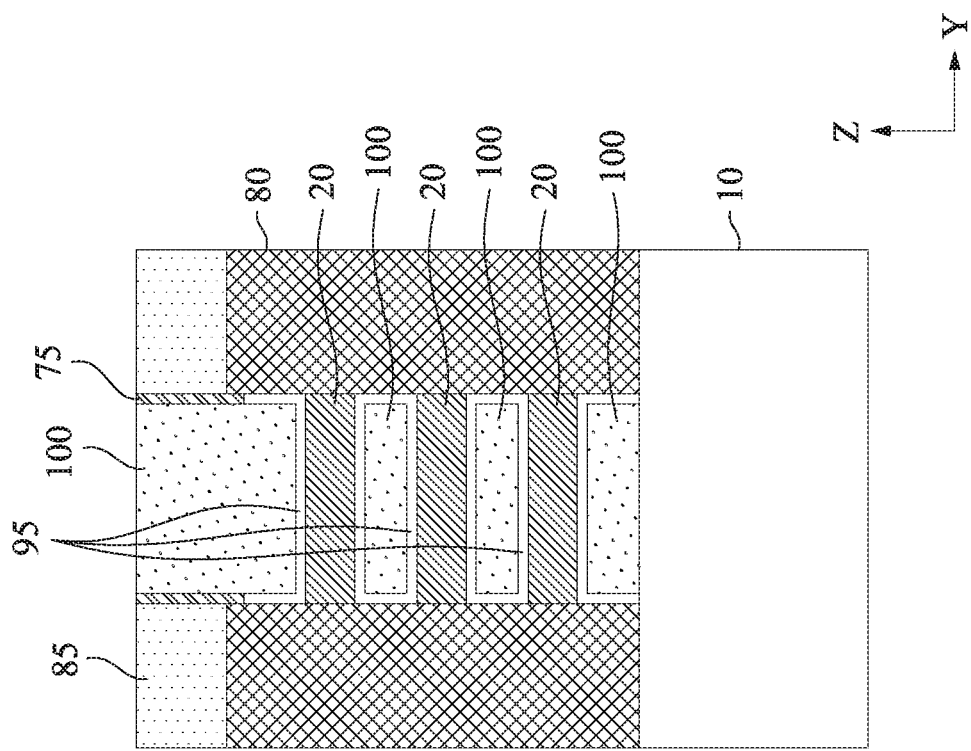
FIG. 16F is a cross sectional view corresponding to line B-B of FIG. 1 of another embodiment.
Figure 16E:
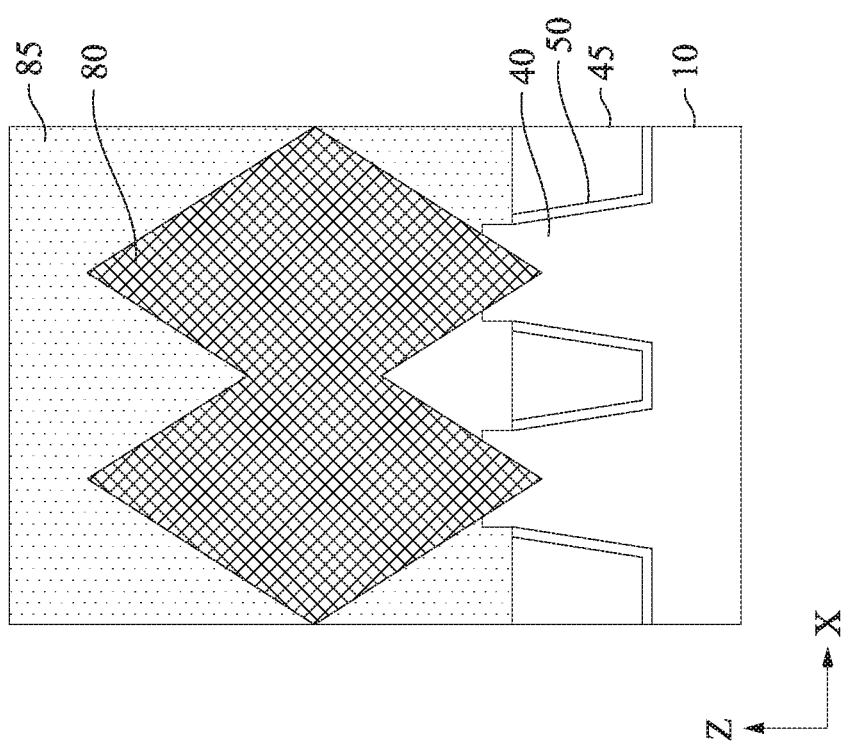
FIG. 16E is a cross sectional view corresponding to line C-C of FIG. 1

FIGS. 16E and 16F show another embodiment, where the gate dielectric layer 95 and gate electrode layer 100 are formed on the structure of FIG. 15F. FIG. 16E is a cross sectional view corresponding to line C-C of FIG. 1 and FIG. 16F is a cross sectional view corresponding to line B-B of FIG. 1.

In certain embodiments, the gate dielectric layer 95 includes one or more layers of a dielectric material, such as silicon oxide, silicon nitride, or high-k dielectric material, other suitable dielectric material, and/or combinations thereof. Examples of the high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. In some embodiments, the gate dielectric layer 95 includes an interfacial layer formed between the channel layers and the dielectric material.

The gate dielectric layer 95 may be formed by CVD, ALD, or any suitable method. In one embodiment, the gate dielectric layer 95 is formed using a highly conformal deposition process such as ALD in order to ensure the formation of a gate dielectric layer having a uniform thickness around each channel layers. The thickness of the gate dielectric layer 95 is in a range from about 1 nm to about 6 nm in some embodiments. In some embodiments, the gate dielectric layer 95 is also formed on the exposed source/drain epitaxial layers 80.

The gate electrode layer 100 is formed on the gate dielectric layer 95 to surround each channel layer. The gate electrode 100 includes one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 100 may be formed by CVD, ALD, electro-plating, or other suitable method. The gate electrode layer is also deposited over the upper surface of the ILD layer 85. The gate dielectric layer and the gate electrode layer formed over the ILD layer 85 are then planarized by using, for example, CMP, until the top surface of the ILD layer 85 is revealed. After the planarization operation, the gate electrode layer is recessed and a cap insulating layer (not shown) is formed over the recessed gate electrode in some embodiments. The cap insulating layer includes one or more layers of a silicon nitride-based material, such as $Si_3N_4$. The cap insulating layer can be formed by depositing an insulating material followed by a planarization operation.

In certain embodiments of the present disclosure, one or more work function adjustment layers (not shown) are interposed between the gate dielectric layer 95 and the gate electrode 100. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-type FET and the p-type FET, which may use different metal layers.

Subsequently, contact holes (not shown) may be formed in the ILD layer 85 by using dry etching. In some embodiments, the upper portion of the S/D epitaxial layer 80 is etched. In some embodiments, a silicide layer is formed over the S/D epitaxial layer 80. The silicide layer includes one or more of WSi, CoSi, NiSi, TiSi, MoSi and TaSi. Then, a conductive material (not shown) is formed in the contact holes. The conductive material includes one or more of Co, Ni, W, Ti, Ta, Cu, Al, TiN and TaN. It is understood that the GAA FETs undergo further CMOS processes to form various features such as contacts/vias, interconnect metal layers, dielectric layers, passivation layers, etc.

FIGS. 17-29G show various stages of manufacturing a semiconductor FET device according to other embodiments of the present disclosure.

Figure 17:
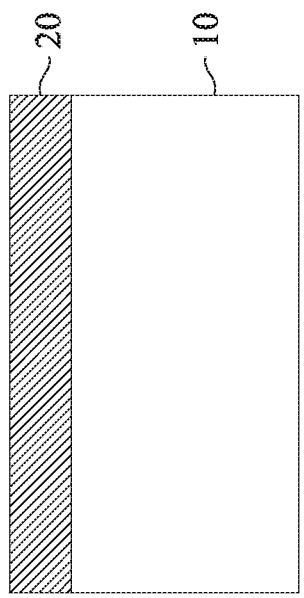
FIG. 17 shows a cross sectional view of one of the various stages of manufacturing a semiconductor GAA FET device according to embodiments of the present disclosure.

As shown in FIG. 17, a first semiconductor layer 20 is formed over a substrate 10. The substrate 10 is made of any of the materials previously described in relation to FIG. 2 and the first semiconductor layer 20 is made of any material previously described in relation to FIG. 3.

Figure 18:
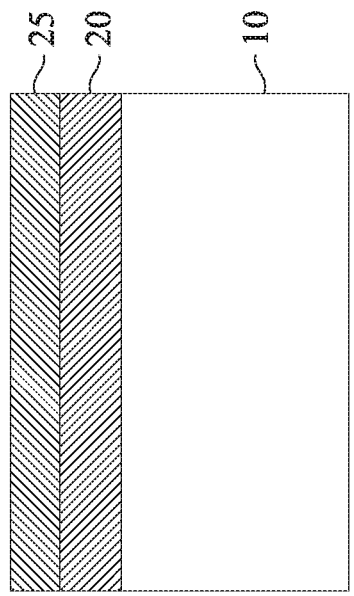
FIG. 18 shows a cross sectional view of one of the various stages of manufacturing a semiconductor GAA FET device according to embodiments of the present disclosure.

A second semiconductor layer 25 is subsequently formed over the first semiconductor layer 20, as shown in FIG. 18. The second semiconductor layer 25 is made of any material and by any process previously described in relation to FIG. 4.

In some embodiments, a thickness of the first semiconductor layer 20 and the second semiconductor layer 25 is about 3 nm to about 20 nm. In other embodiments, a thickness of the first semiconductor layer 20 and the second semiconductor layer 25 is about 5 nm to about 15 nm.

Figure 19B:
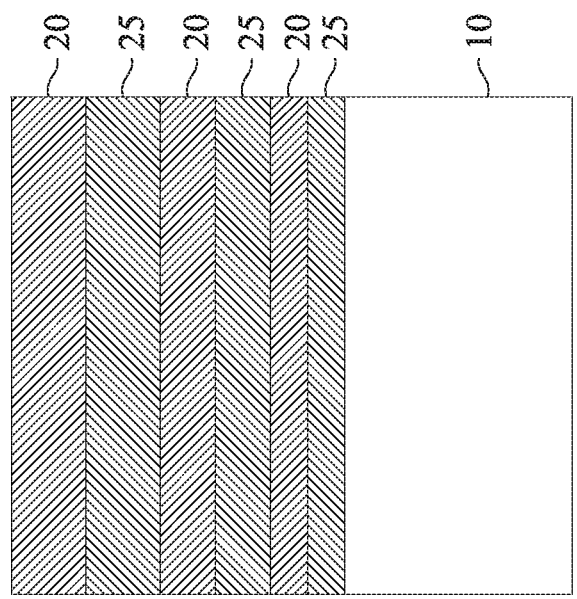
FIGS. 19A and 19B show cross sectional views of one of the various stages of manufacturing a semiconductor GAA FET device according to embodiments of the present disclosure.
Figure 19A:
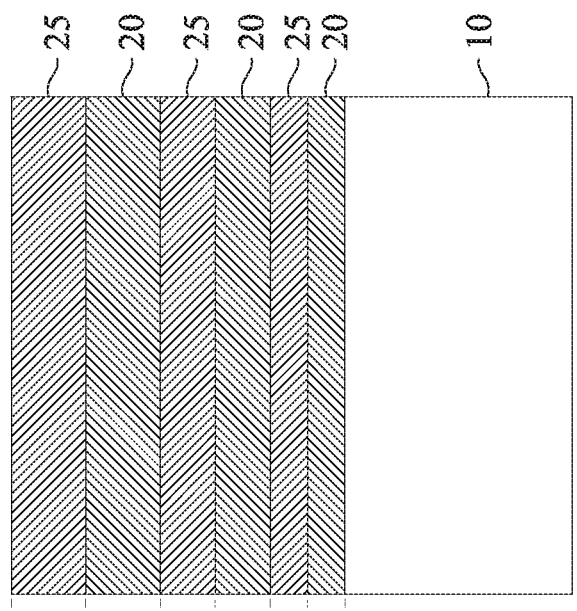

Next, in some embodiments, additional first semiconductor layers 20 and second semiconductor layers 25 are stacked in a repeating sequence, as shown in FIG. 19A. In FIG. 19A, three repeating sequences of first and second semiconductor layers are shown, however, the number of the repeating sequences are not limited to three, and may be as small as 2 and in some embodiments, 4-10 repeating sequences are formed. In other embodiments, repeating sequences of the second semiconductor layer 25 and the first semiconductor layer 20 are formed, as shown in FIG. 19B. By adjusting the numbers of the stacked layers, a driving current of the GAA FET device can be adjusted.

In some embodiments, a thickness of the first semiconductor layers 20 and the second semiconductor layers 25 increases as a distance from the substrate 10 increases. In some embodiments, each successive first or second semiconductor layer is about 1 nm to about 2 nm thicker than the preceding respective first or second semiconductor layer as the distance from the semiconductor substrate increases.

As shown in FIG. 19A in one embodiment, the lowermost first semiconductor layer 20 is made of SiGe having a thickness A1 of about 3 nm to about 18 nm. The lowermost second semiconductor layer 25 is made of Si having a thickness B1 of about 3 nm to about 18 nm. In some embodiments, the next first semiconductor layer 20 spaced apart from the substrate 10 is made of SiGe having a thickness A2 of about 4 nm to about 19 nm, and the next second semiconductor layer 25 spaced apart from the substrate 10 is made of Si having a thickness B2 of about 4 nm to about 19 nm. In some embodiments, the uppermost first semiconductor layer 20 is made of SiGe having a thickness A3 of about 5 nm to about 20 nm, and the uppermost second semiconductor layer 25 is made of Si having a thickness B3 of about 5 nm to about 20 nm. In some embodiments, the thicknesses A1 and B1 are about the same, the thicknesses A2 and B2 are about the same, and the thicknesses A3 and B3 are about the same. In other embodiments, A1≠B1, A2≠B2, and A3≠B3. In some embodiments, the thickness of each successive first or second semiconductor layer is about 1 to about 2 nm thicker than a respective preceding first or second semiconductor layer as the distance from the substrate increases.

Figure 20:
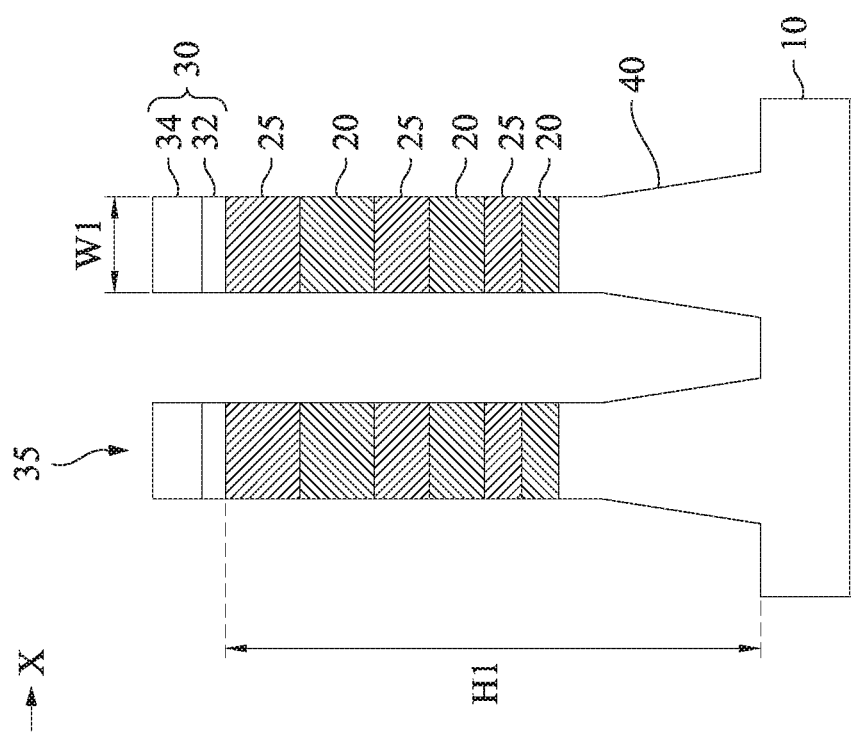
FIG. 20 shows a cross sectional view of one of the various stages of manufacturing a semiconductor GAA FET device according to embodiments of the present disclosure.

In some embodiments, a mask layer 30 is formed over the uppermost semiconductor layer, as shown in FIG. 20. The mask layer 30 can be formed by any of the materials and by any of the processes previously described in relation to FIG. 6.

Next, as shown in FIG. 20, the stacked layers of the first and second semiconductor layers 20, 25 are patterned by using the patterned mask layer, thereby the stacked layers are formed into fin structures 35 extending in the Y direction. In FIG. 20, two fin structures 35 are arranged in the X direction. But the number of the fin structures is not limited to two, and may be as small as one and three or more. In some embodiments, one or more dummy fin structures are formed on both sides of the fin structures 35 to improve pattern fidelity in the patterning operations. As shown in FIG. 20, the fin structures 35 have upper portions constituted by the stacked semiconductor layers 20, 25 and well portions 40.

The width W1 of the upper portion of the fin structure 35 along the X direction is in a range from about 5 nm to about 40 nm in some embodiments, and is in a range from about 10 nm to about 30 nm in other embodiments. The height H1 along the Z direction of the fin structure is in a range from about 100 nm to about 200 nm in some embodiments. The stacked fin structure 35 may be patterned by any suitable method previously described in relation to FIG. 7.

Figure 21:
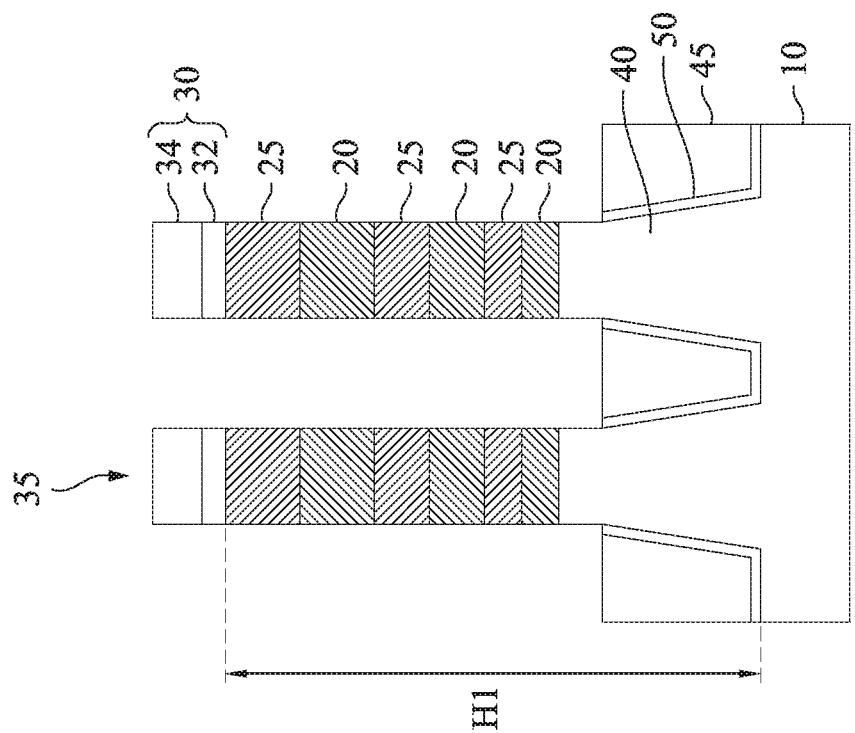
FIG. 21 shows a cross sectional view of one of the various stages of manufacturing a semiconductor GAA FET device according to embodiments of the present disclosure.

Fin liner layers 50 and shallow trench isolation (STI) regions 45 and fin liner are subsequently formed between the fin structures, as shown in FIG. 21. The fin liner layers 50 and STI regions 45 are formed by any of the materials and processes previously described in relation to FIG. 8.

Figure 22B:
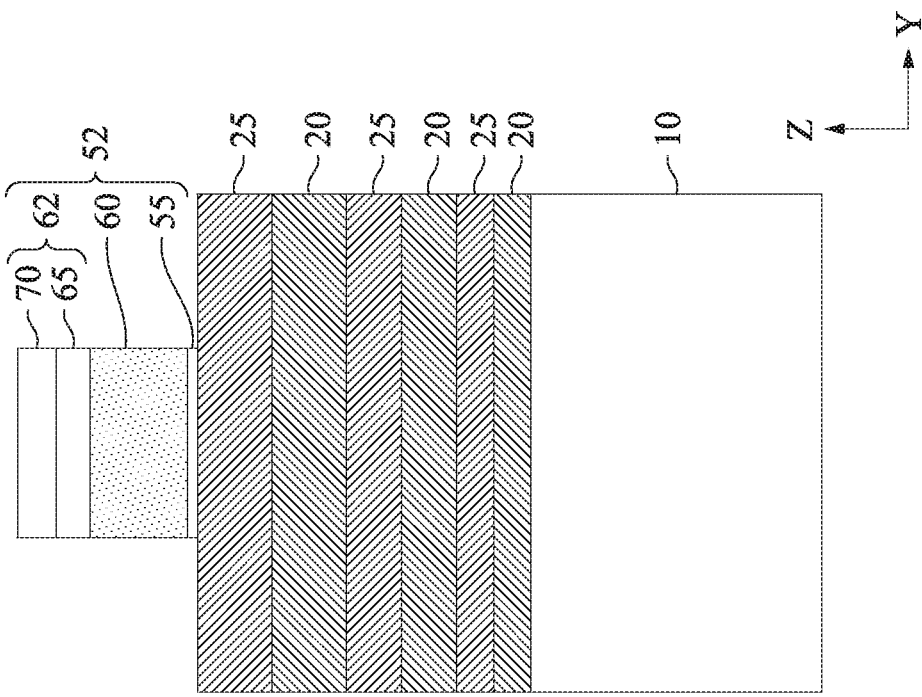
FIGS. 22A and 22B show one of the various stages of manufacturing a semiconductor FET device according to embodiments of the present disclosure.
Figure 22A:
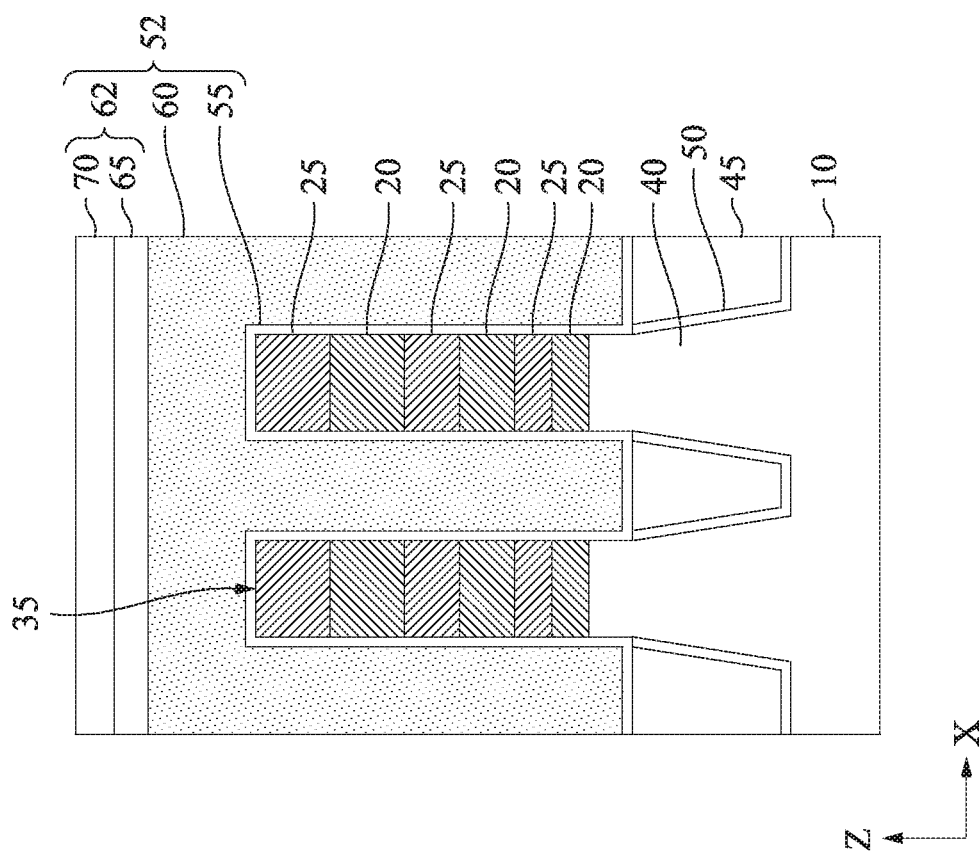

After the STI regions 45 are formed, a sacrificial (dummy) gate structure 52 is formed in some embodiments, as shown in FIGS. 22A and 22B. FIG. 22A is a cross sectional view taken along the gate electrode in the X-direction (corresponding to line A-A of FIG. 1). FIG. 22B is a cross sectional view taken along the fin structure 35 in the Y-direction (corresponding to line B-B of FIG. 1). FIGS. 22A and 22B illustrate a structure after a sacrificial gate structure 52 is formed over the exposed fin structures 35. The sacrificial gate structure 52 is formed over a portion of the fin structures 35 which is to be a channel region. The sacrificial gate structure 52 defines the channel region of the GAA FET. The sacrificial gate structure 52 includes a sacrificial gate dielectric layer 55 and a sacrificial gate electrode layer 60. The sacrificial gate dielectric layer 55 includes one or more layers of insulating material, such as a silicon oxide-based material. In one embodiment, silicon oxide formed by CVD is used. The thickness of the sacrificial gate dielectric layer 55 is in a range from about 1 nm to about 5 nm in some embodiments. The sacrificial gate structure 52 is formed any of the materials and processes described in relation to FIGS. 9A and 9B.

In FIGS. 22A and 22B, one sacrificial gate structure 52 is formed, but the number of the sacrificial gate structures is not limited to one. Two or more sacrificial gate structures are arranged in the Y direction of the fin structures in some embodiments. In certain embodiments, one or more dummy sacrificial gate structures are formed on both sides of the sacrificial gate structures to improve pattern fidelity.

Figure 23B:
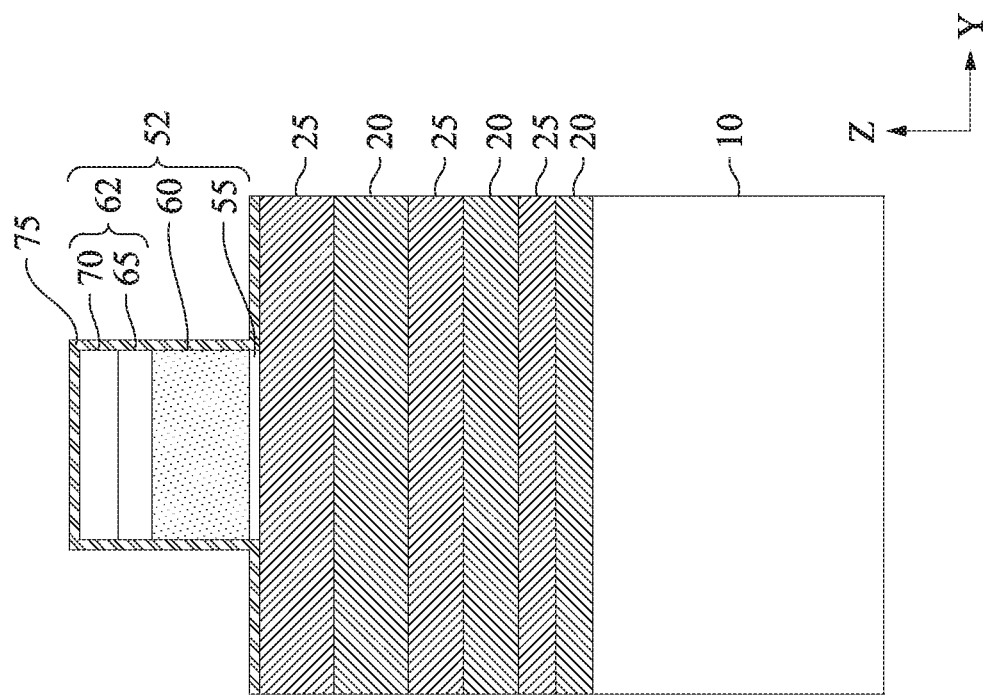
FIGS. 23A-23D show one of the various stages of manufacturing a semiconductor FET device according to embodiments of the present disclosure.
Figure 23A:
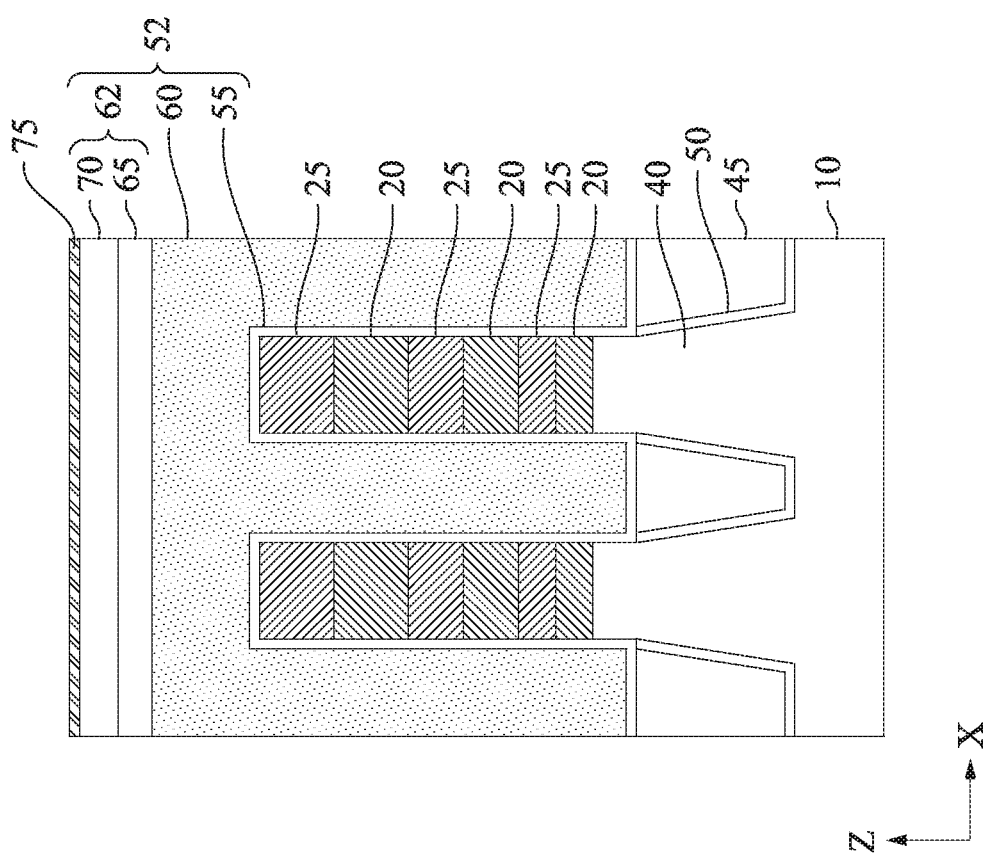
Figure 23D:
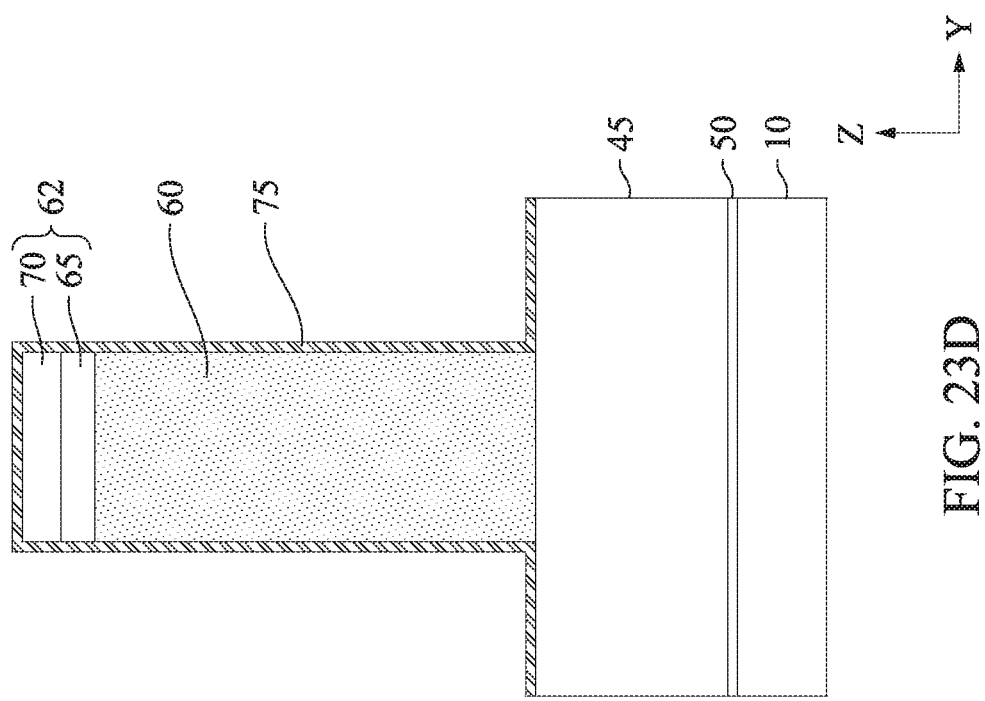
Figure 23C:
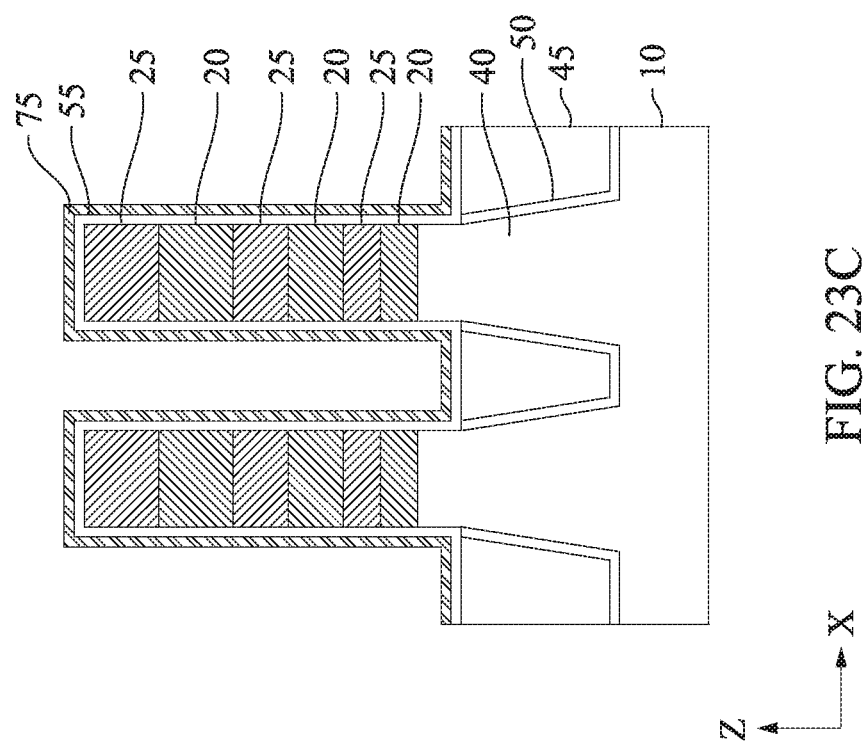

After the sacrificial gate structure 52 is formed, a cover layer 75 made of an insulating material is conformally formed over the exposed fin structures 35 and the sacrificial gate structure 52, as shown in FIGS. 23A-23D. FIG. 23A is a cross sectional view taken along the gate electrode in the X-direction (corresponding to line A-A of FIG. 1). FIG. 23B is a cross sectional view corresponding to the fin structure in the Y-direction (corresponding to line B-B of FIG. 1). FIG. 23C is a cross sectional view corresponding to line C-C of FIG. 1. FIG. 23D is a cross sectional view corresponding to line D-D of FIG. 1. The cover layer 75 is deposited in a conformal manner so it is formed to have substantially equal thicknesses on vertical surfaces, such as the sidewalls, horizontal surfaces, and the top of the sacrificial gate structure, respectively. In some embodiments, the cover layer 75 has a thickness in a range from about 2 nm to about 20 nm, in other embodiments, the cover layer 75 has a thickness in a range from about 5 nm to about 15 nm. The cover layer 75 is made of any of the materials and any of the processes previously described in relation to FIGS. 10A-10D.

Figure 24B:
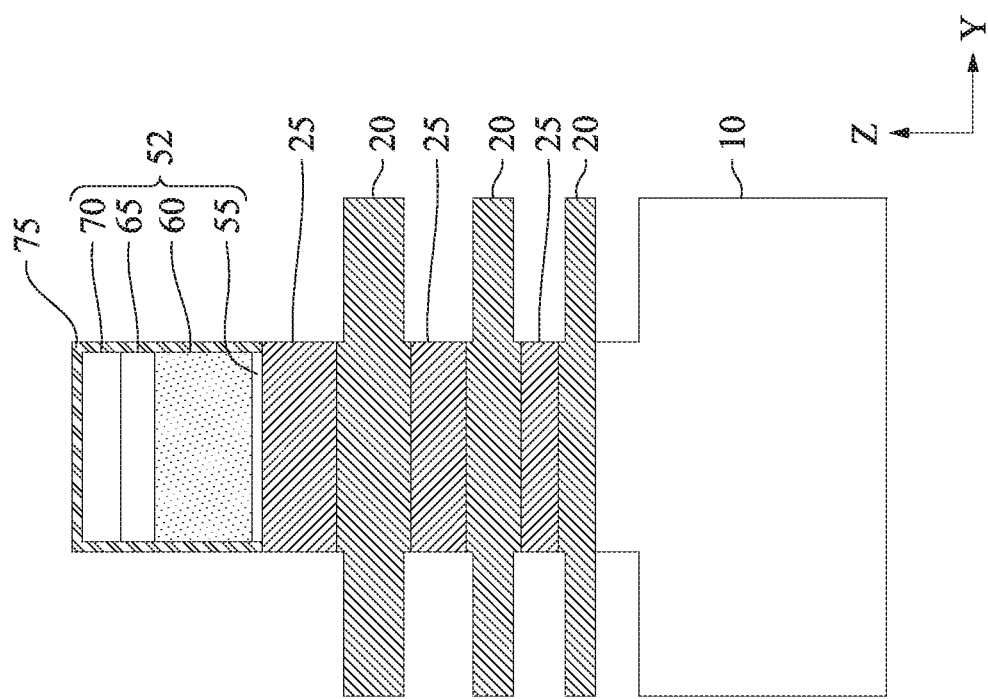
FIGS. 24A-24D show one of the various stages of manufacturing a semiconductor FET device according to embodiments of the present disclosure.
Figure 24A:
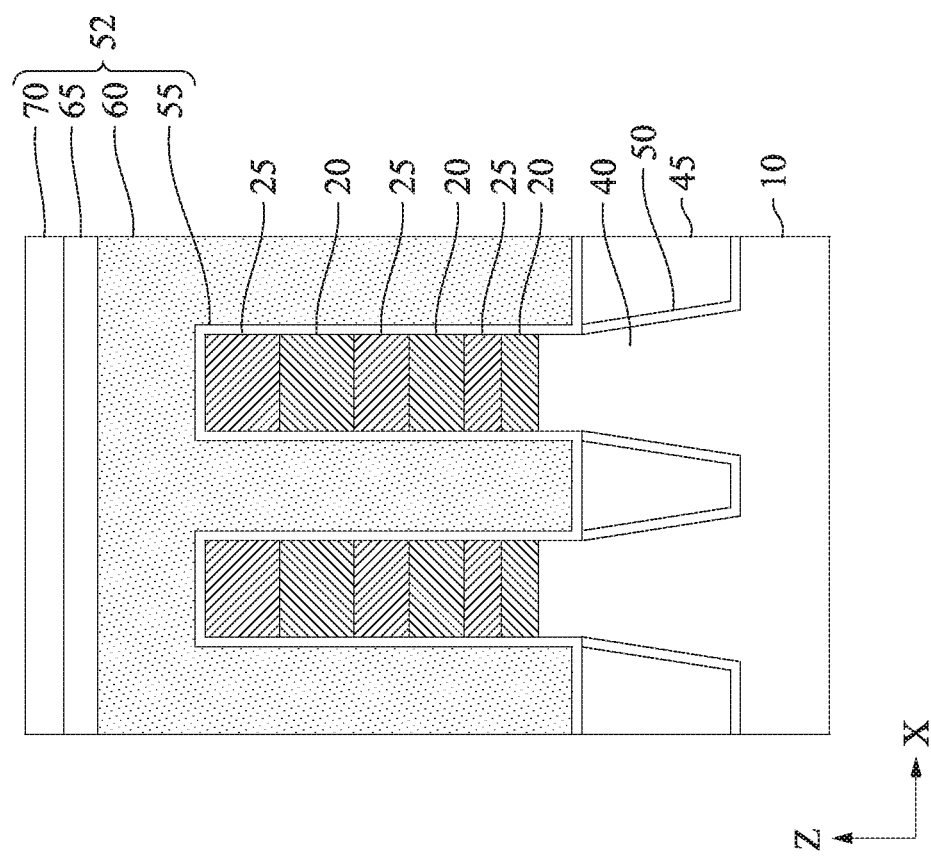
Figure 24D:
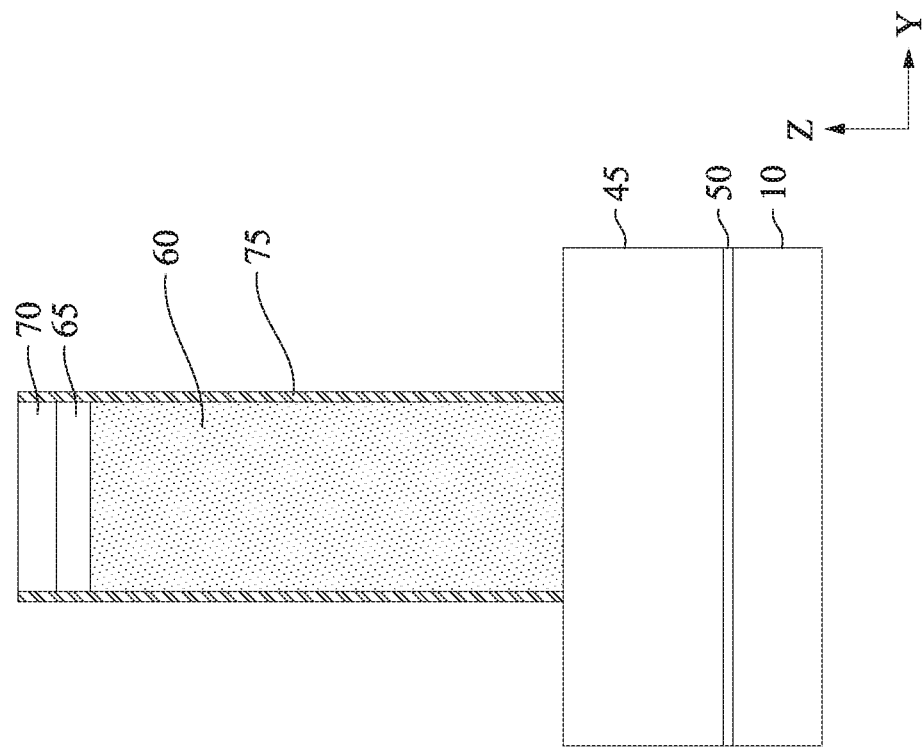
Figure 24C:
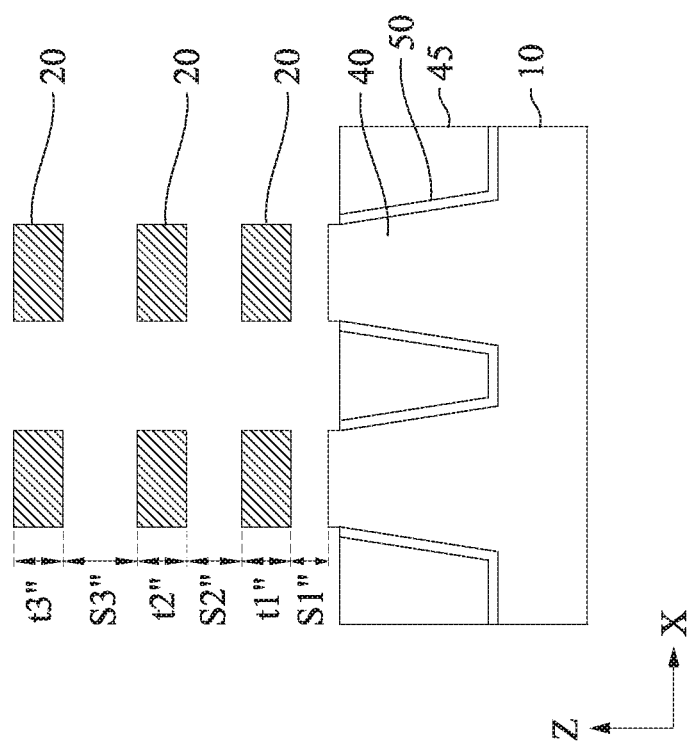

Then, as shown in FIGS. 24A-24D, the cover layer 75 is subjected to anisotropic etching to remove the cover layer 75 formed over the silicon oxide mask layer 70 and the source/drain regions, and then the second semiconductor layers 25 and upper portion of the substrate 10 in the source/drain regions are removed down to about the upper surface of the isolation insulating layer 45 in some embodiments. FIG. 24A is a cross sectional view corresponding to the gate electrode in the X-direction (corresponding to line A-A of FIG. 1). FIG. 24B is a cross sectional view taken along the fin structure in the Y-direction (corresponding to line B-B of FIG. 1). FIG. 24C is a cross sectional view corresponding to line C-C of FIG. 1. FIG. 24D is a cross sectional view corresponding to line D-D of FIG. 1. The second semiconductor layers 25 and upper portion of the substrate are removed using a suitable etching operation. For example, when the second semiconductor layers 25 are Si and the first semiconductor layers 20 are Ge or SiGe, the second semiconductor layers 25 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, the second semiconductor layers 25 are removed when forming a p-type pFET.

As shown in FIG. 24B, in some embodiments, the wet etchant used in removing the portions of the second semiconductor layer 25 in the source/drain regions also partially etches the first semiconductor layers 20. The amount of the first semiconductor layer 20 etched during the second semiconductor removal is greater in the upper first semiconductor layers 20 (the layers a further distance away from the semiconductor substrate 10). The upper first semiconductor layers 20 are exposed to the wet etchant for a longer period of time than the lower first semiconductor layers. In some embodiments, as a result of the partial etching of the first semiconductor layers 20 during the removal of the second semiconductor layers 25 in the source/drain regions, the thickness of each of the portion of the first semiconductor layers 20 in the source/drain regions is about the same.

As shown in FIG. 24C, in some embodiments, as a result of the partial etching of the first semiconductor layers 20 during the removal of the second semiconductor layers 25 in the source/drain regions, the thickness t1", t2", t3" of each of the portion of the first semiconductor layers 20 in the source/drain regions is substantially the same, and the distance of the spaces S1", S2", S3" between adjacent first semiconductor layers 20 increases as the distance from the substrate 10 along the Z-direction increases. By substantially the same it is meant that the thicknesses of each layer are within 5% of each other. In some embodiments, the spaces increase by about 1 nm to about 2 nm between adjacent first semiconductor layers 20 as the distance from the substrate 10 along the Z-direction increases.

The cover layer 75 and sacrificial gate dielectric layer 55 are completely removed in the source/drain regions using suitable lithography and etching techniques in some embodiments.

Figure 24E:
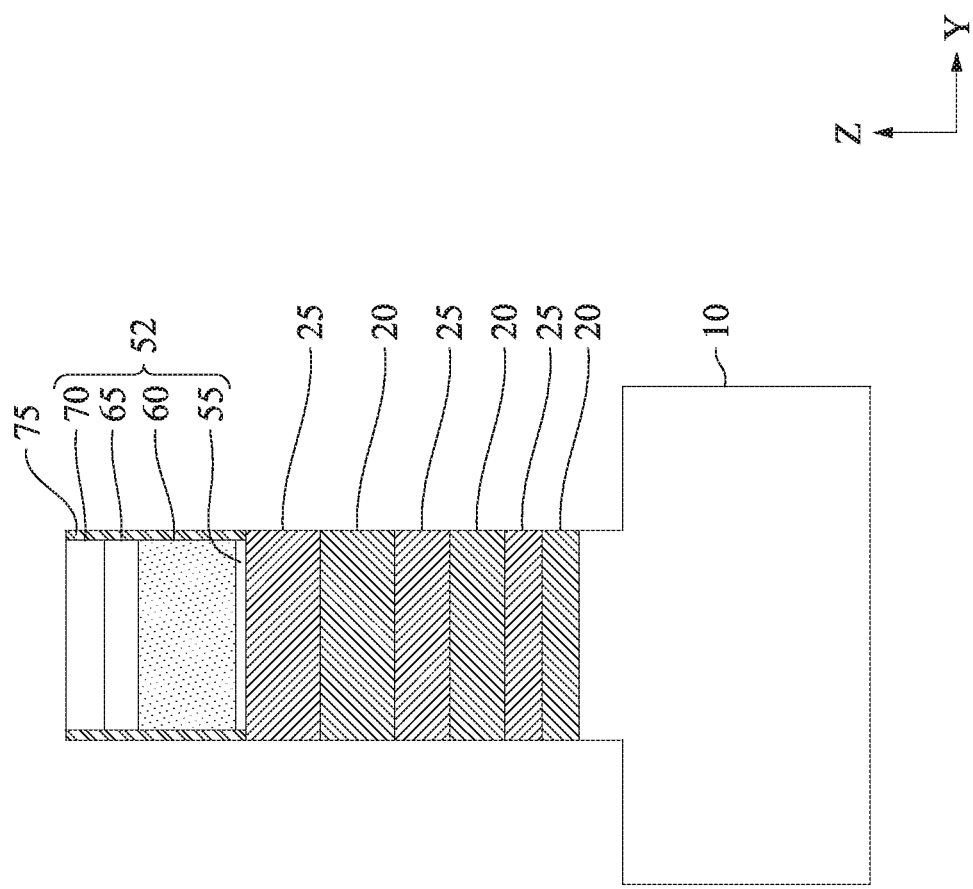
FIG. 24E is a cross sectional view corresponding to line B-B of FIG. 1 of another embodiment.

In other embodiments, the fin structures in the source/drain regions are recessed down to about the upper surface of the isolation insulating layer 45, as shown in FIG. 24E. In other words, all the first and second semiconductor layers and the upper portion of the substrate 10 are removed in the source/drain regions. FIG. 24E is a cross sectional view corresponding to line B-B of FIG. 1. The fin structures are recessed by a recess etching operation using suitable etchants in some embodiments. In some embodiments, the recess etching operation is a dry etching operation.

Figure 25B:
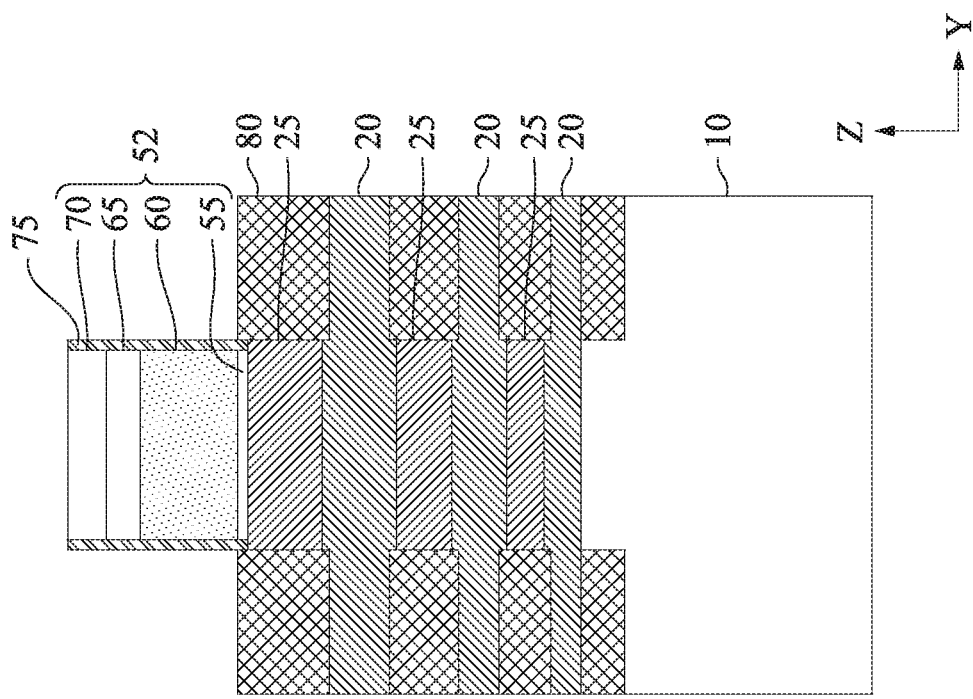
FIGS. 25A-25D show one of the various stages of manufacturing a semiconductor FET device according to embodiments of the present disclosure.
Figure 25A:
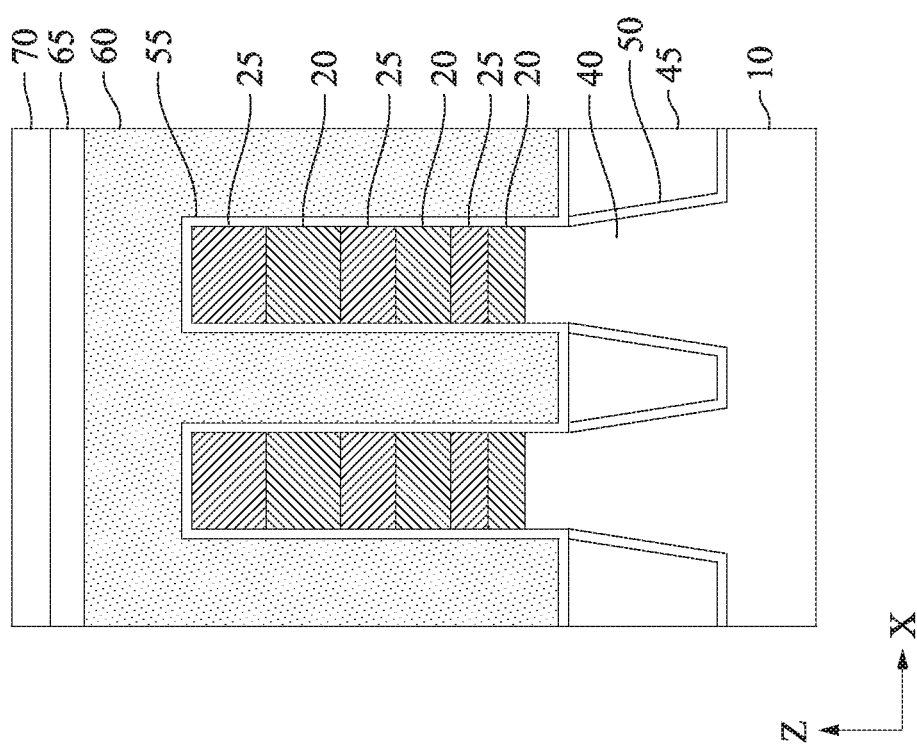
Figure 25D:
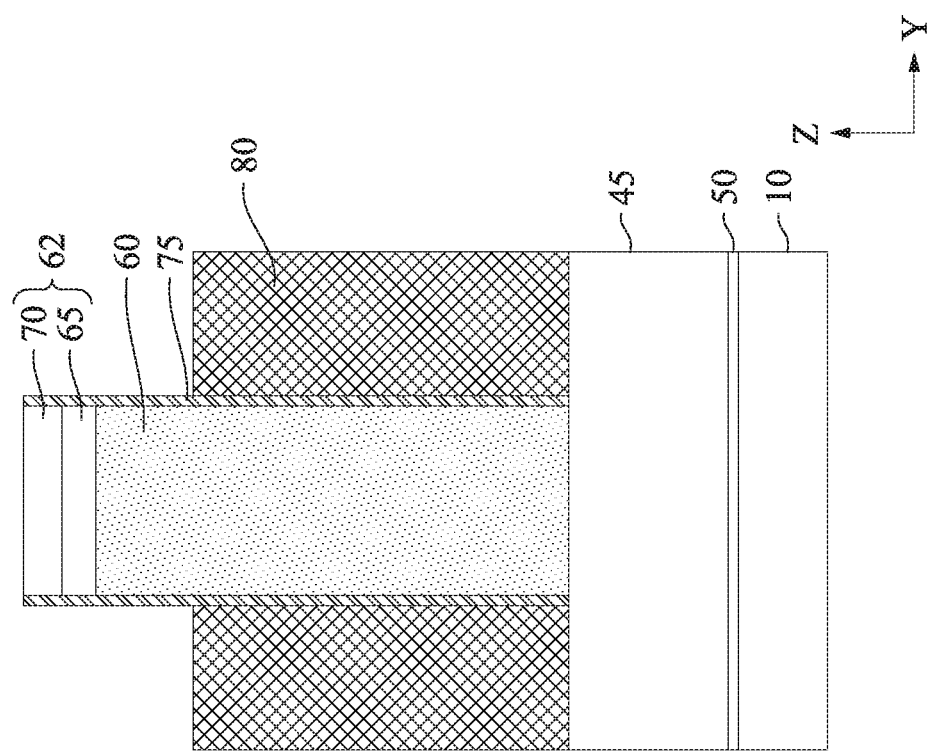
Figure 25C:
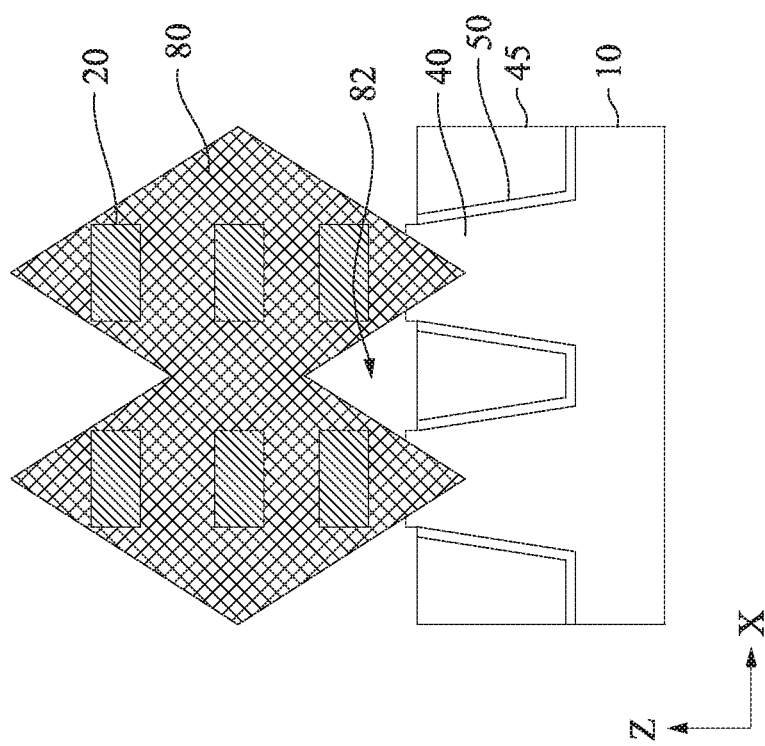

Subsequently, a source/drain epitaxial layer 80 is formed, as shown in FIGS. 25A-25D. FIG. 25A is a cross sectional view taken along the gate electrode in the X-direction (corresponding to line A-A of FIG. 1). FIG. 25B is a cross sectional view taken along the fin structure in the Y-direction (corresponding to line B-B of FIG. 1). FIG. 25C is a cross sectional view corresponding to line C-C of FIG. 1. FIG. 25D is a cross sectional view corresponding to line D-D of FIG. 1.

The source/drain epitaxial layer 80 can be made of any of the materials or any of the processes previously described in relation to FIGS. 12A-12F.

Figure 25F:
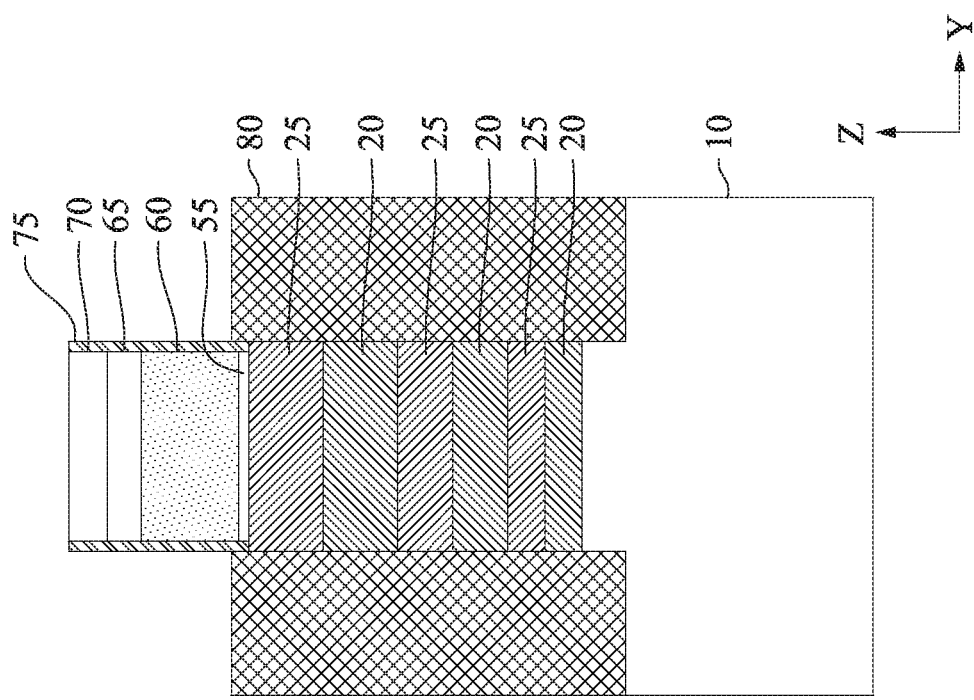
FIG. 25F is a cross sectional view corresponding to line B-B of FIG. 1 of another embodiment.
Figure 25E:
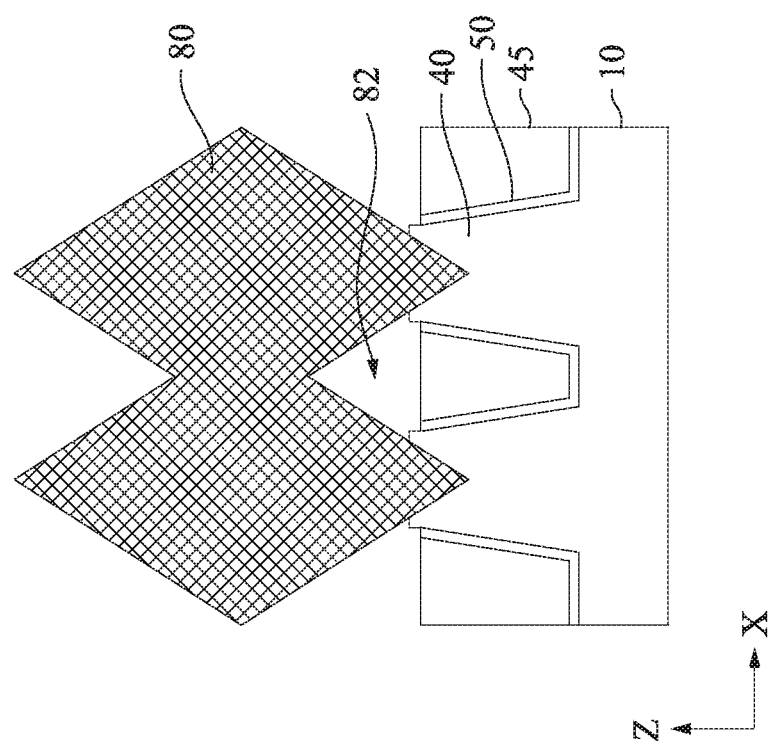
FIG. 25E is a cross sectional view corresponding to line C-C of FIG. 1

FIGS. 25E and 25F show another embodiment, where the source/drain epitaxial layer 80 is formed on the structure of FIG. 24E. FIG. 25E is a cross sectional view corresponding to line C-C of FIG. 1 and FIG. 25F is a cross sectional view corresponding to line B-B of FIG. 1.

Figure 26B:
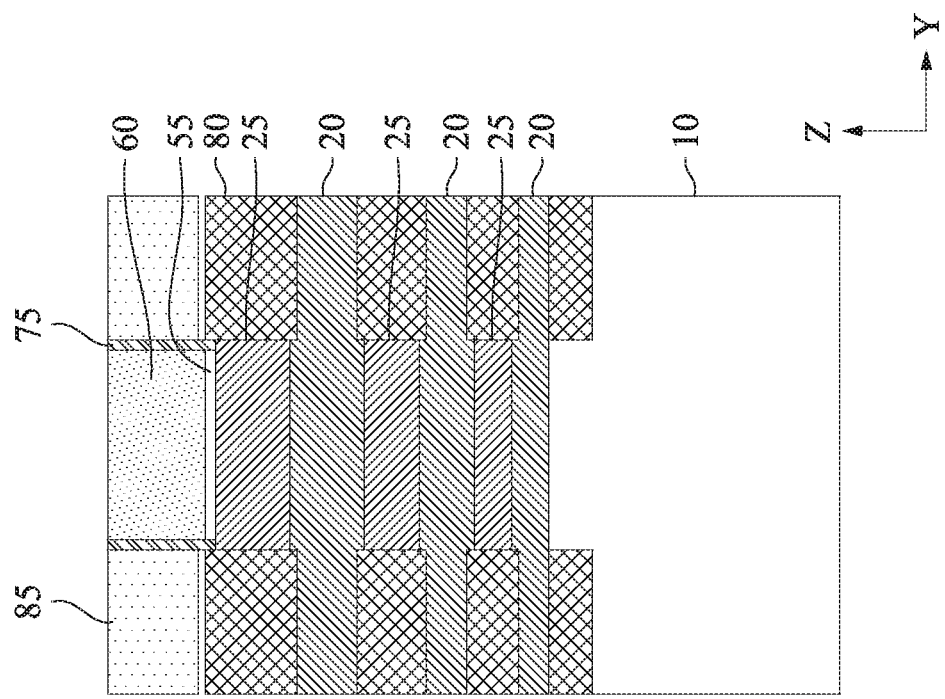
FIGS. 26A-26D show one of the various stages of manufacturing a semiconductor FET device according to embodiments of the present disclosure.
Figure 26A:
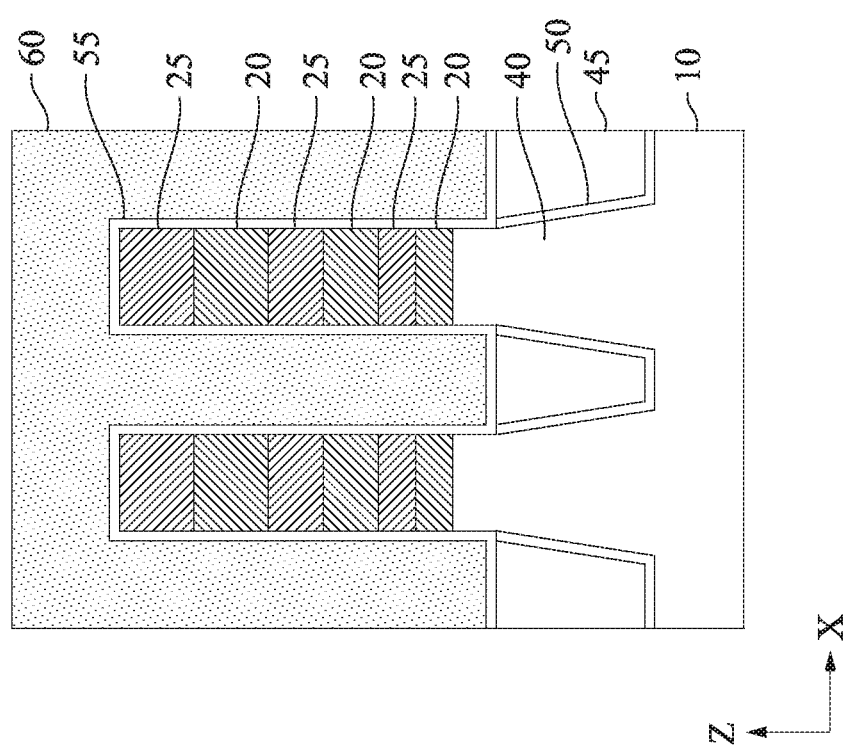
Figure 26D:
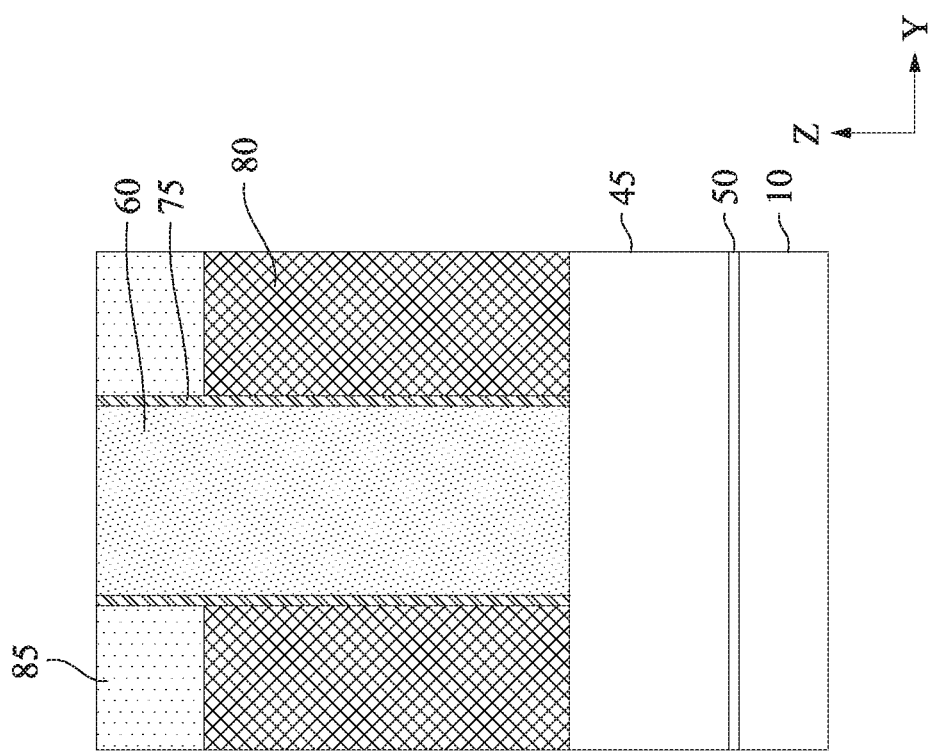
Figure 26C:
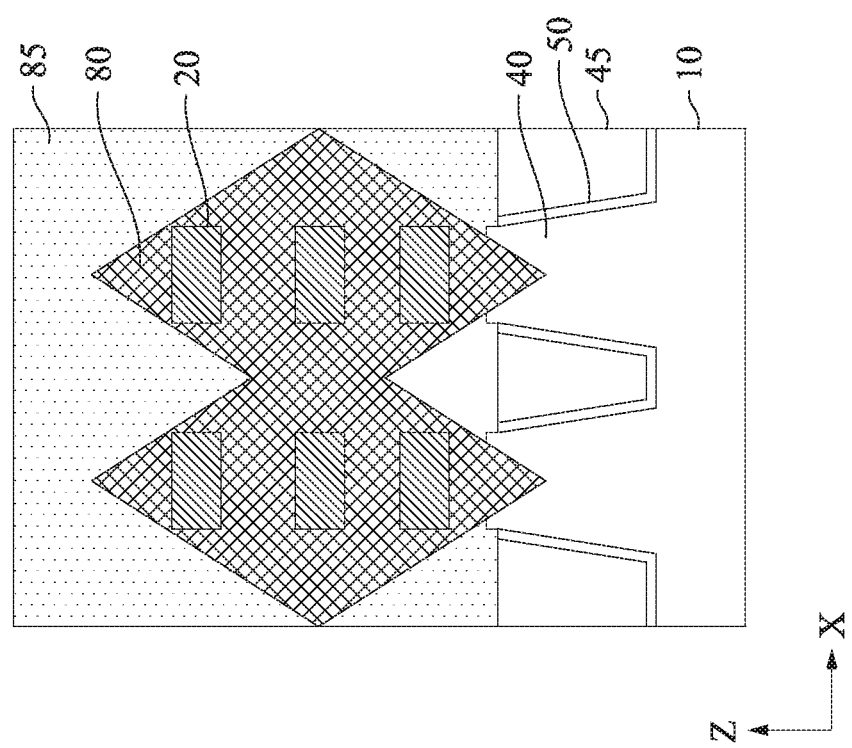

Subsequently, an interlayer dielectric (ILD) layer 85 is formed, as shown in FIGS. 26A-26D. FIG. 26A is a cross sectional view taken along the gate electrode in the X-direction (corresponding to line A-A of FIG. 1). FIG. 26B is a cross sectional view taken along the fin structure in the Y-direction (corresponding to line B-B of FIG. 1). FIG. 26C is a cross sectional view corresponding to line C-C of FIG. 1. FIG. 26D is a cross sectional view corresponding to line D-D of FIG. 1. The ILD layer 85 can be formed by any of the materials and by any of the processes previously described in relation to FIGS. 13A-13F.

Figure 26F:
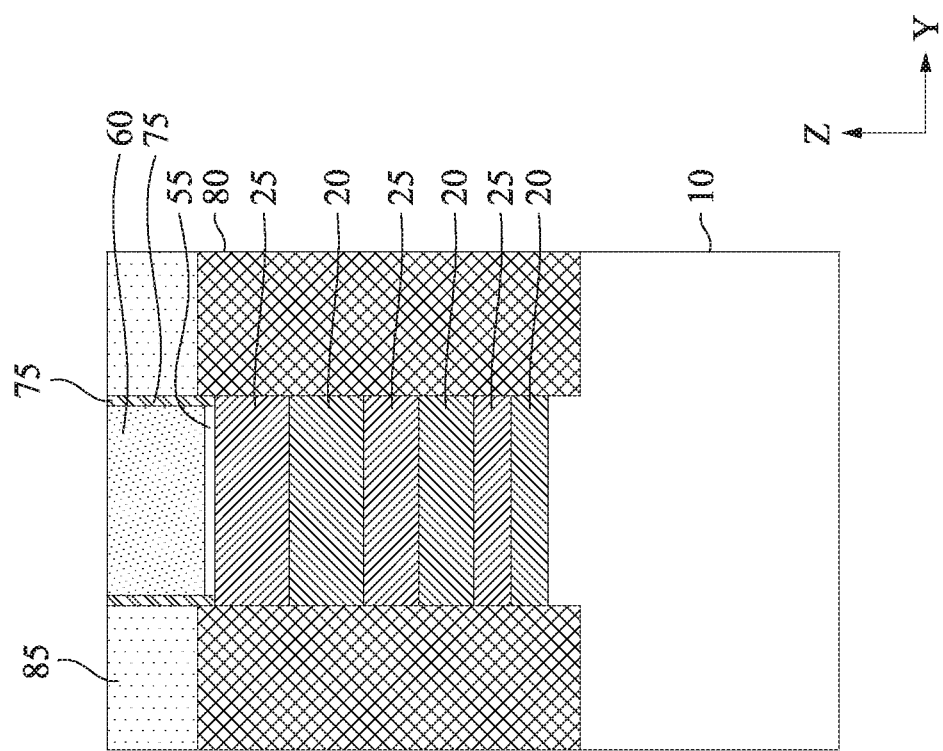
FIG. 26F is a cross sectional view corresponding to line B-B of FIG. 1 of another embodiment.
Figure 26E:
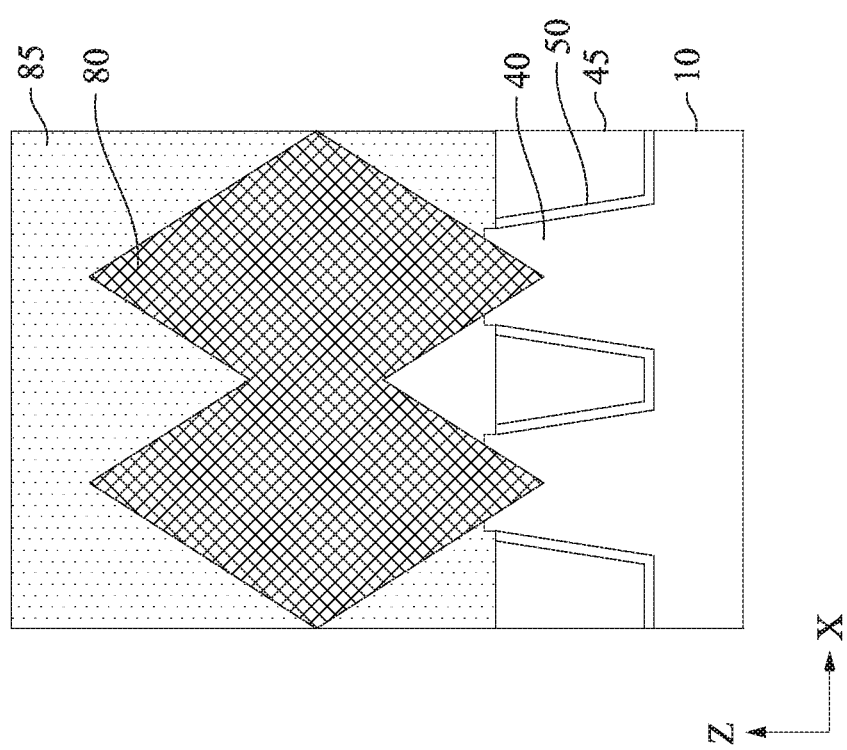
FIG. 26E is a cross sectional view taken along line C-C of FIG. 1

FIGS. 26E and 26F show another embodiment, where the ILD layer 85 is formed on the structure of FIGS. 25E and 25F. FIG. 26E is a cross sectional view corresponding to line C-C of FIG. 1 and FIG. 26F is a cross sectional view corresponding to line B-B of FIG. 1.

Figure 27B:
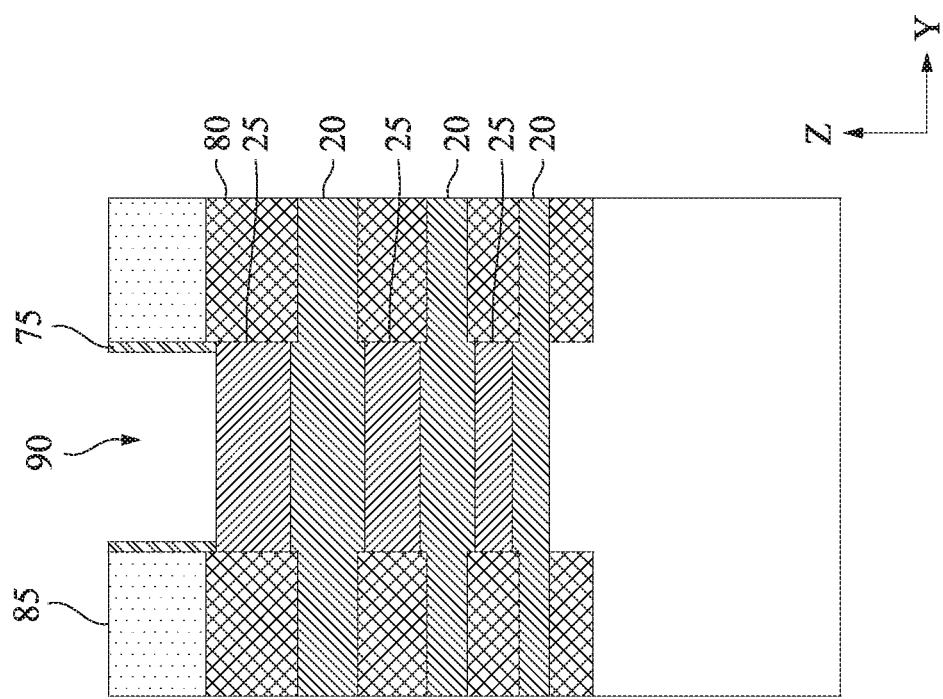
FIGS. 27A-27D show one of the various stages of manufacturing a semiconductor FET device according to embodiments of the present disclosure.
Figure 27A:
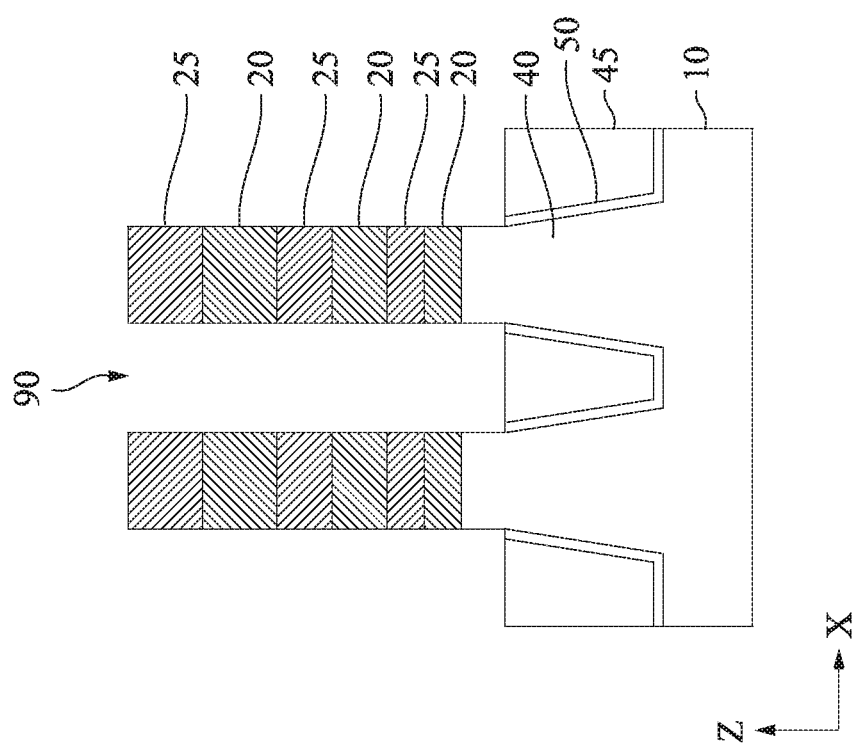
Figure 27D:
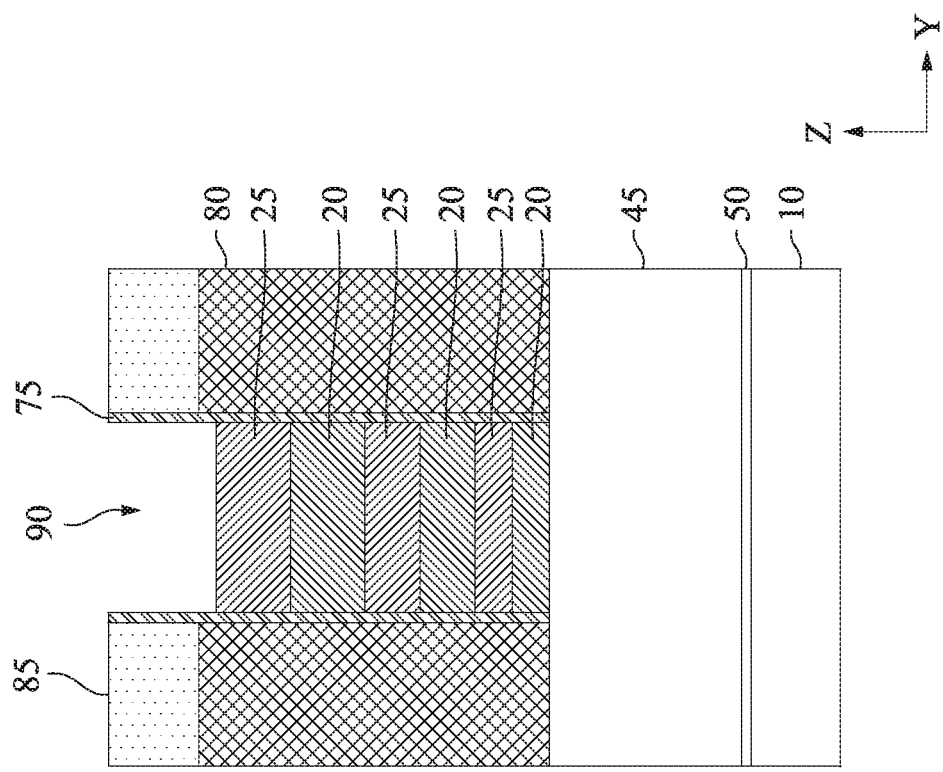
Figure 27C:
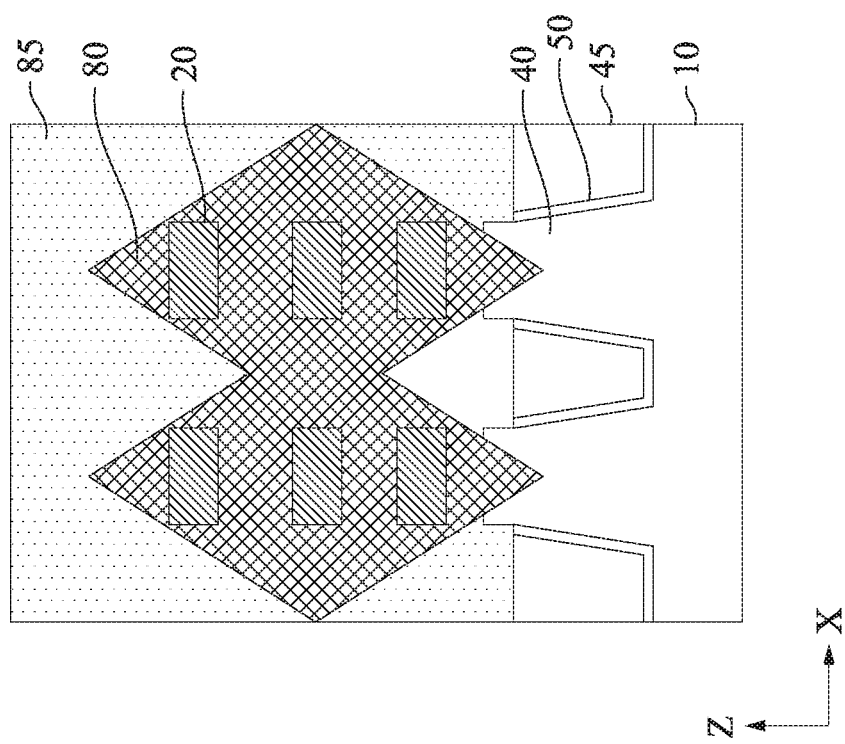

Then, the sacrificial gate electrode layer 60 and sacrificial gate dielectric layer 55 are removed, thereby forming a gate space 90, in which the channel regions of the fin structures are exposed, as shown in FIGS. 27A-27D. FIG. 27A is a cross sectional view taken along the gate electrode in the X-direction (corresponding to line A-A of FIG. 1). FIG. 27B is a cross sectional view taken along the fin structure in the Y-direction (corresponding to line B-B of FIG. 1). FIG. 27C is a cross sectional view corresponding to line C-C of FIG. 1. FIG. 27D is a cross sectional view corresponding to line D-D of FIG. 1. The ILD layer 85 protects the S/D structures 80 during the removal of the sacrificial gate structures. The sacrificial gate structures can be removed by any of the processes previously described in relation to FIGS. 14A-14F.

Figure 27F:
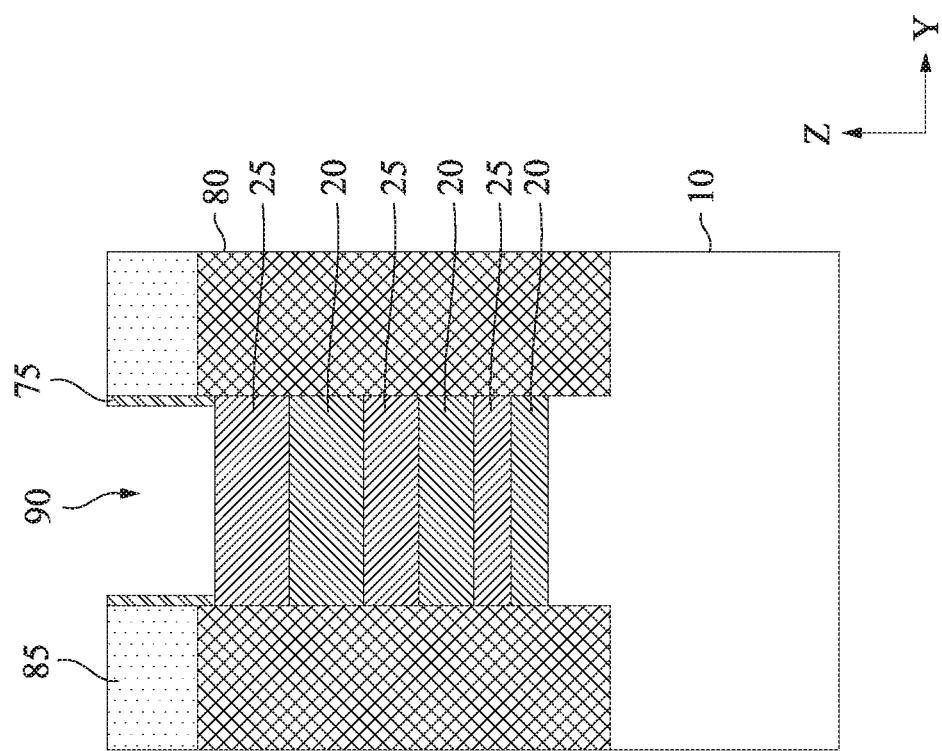
FIG. 27F is a cross sectional view corresponding to line B-B of FIG. 1 of another embodiment.
Figure 27E:
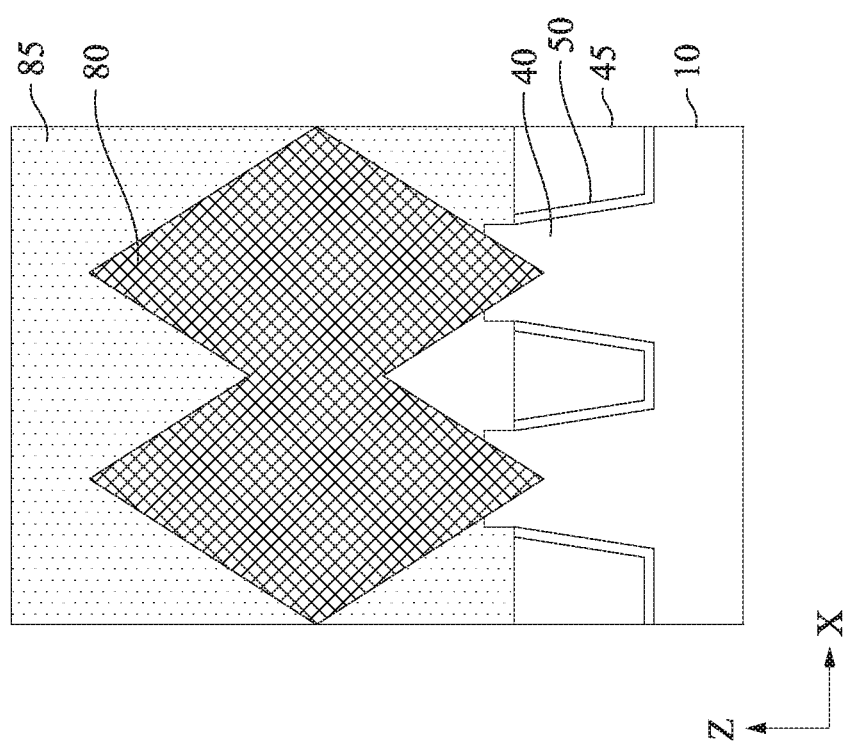
FIG. 27E is a cross sectional view corresponding to line C-C of FIG. 1

FIG. 27E is a cross sectional view corresponding to line C-C of FIG. 1 and FIG. 27F is a cross sectional view corresponding to line B-B of FIG. 1 of another embodiment where the sacrificial gate electrode layer 60 and sacrificial gate dielectric layer of FIG. 26F are removed.

Figure 28B:
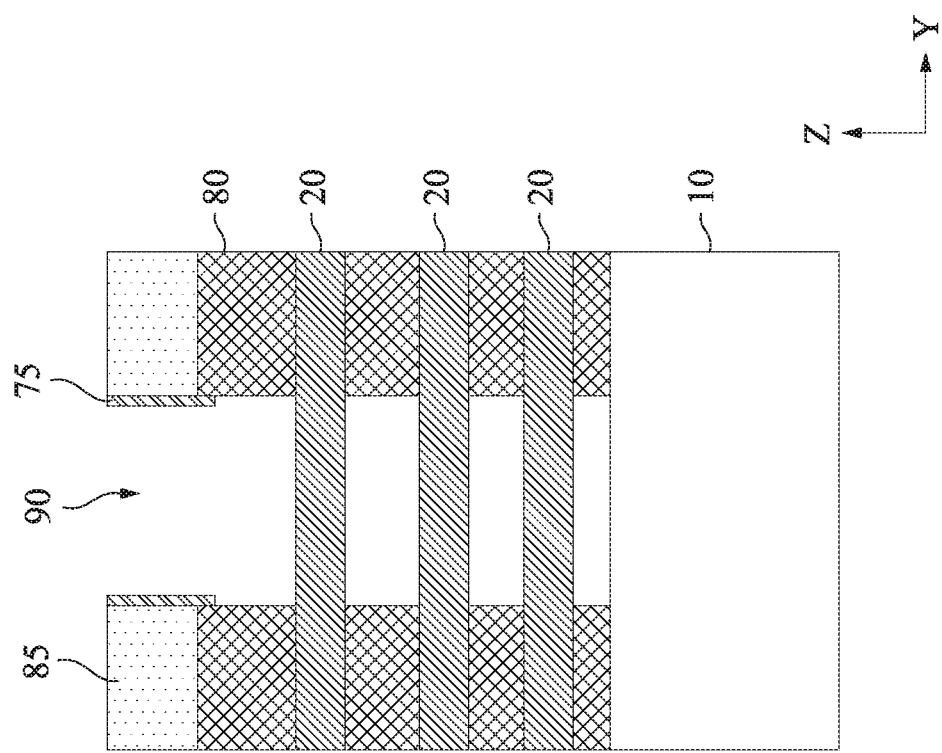
FIGS. 28A-28D show one of the various stages of manufacturing a semiconductor FET device according to embodiments of the present disclosure.
Figure 28A:
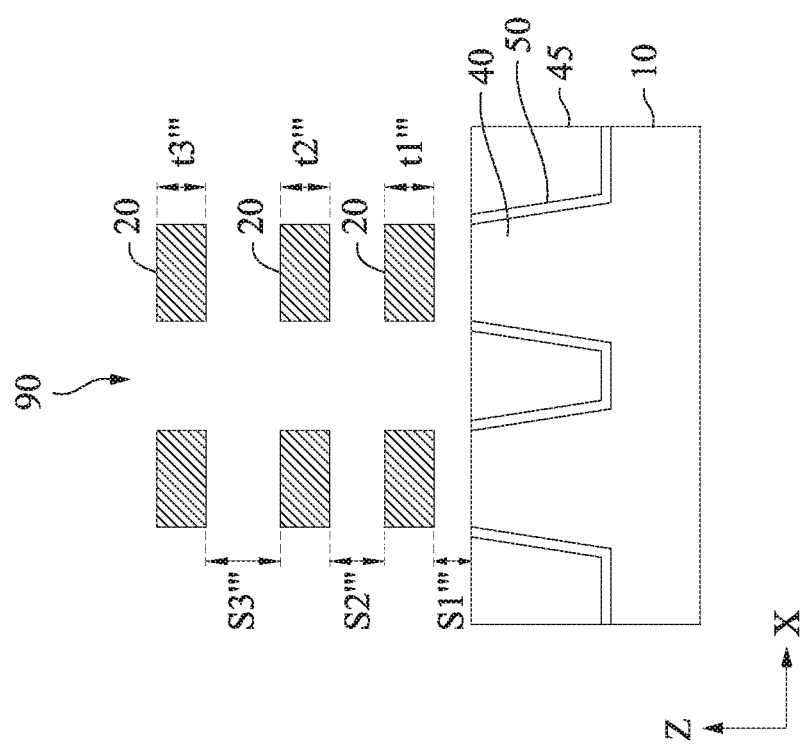
Figure 28D:
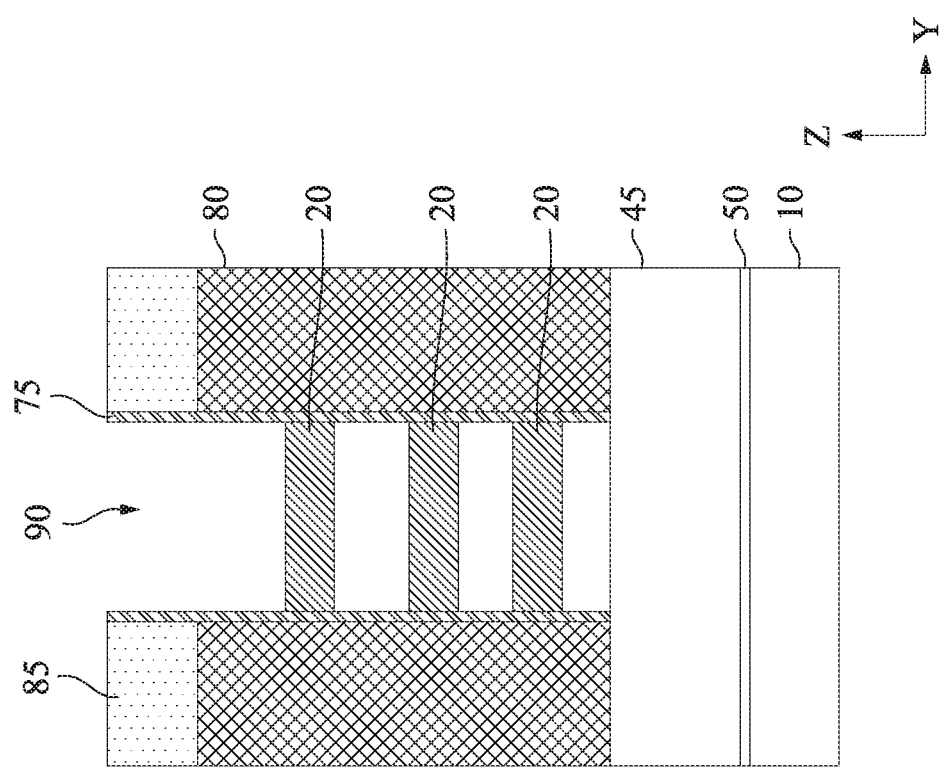
Figure 28C:
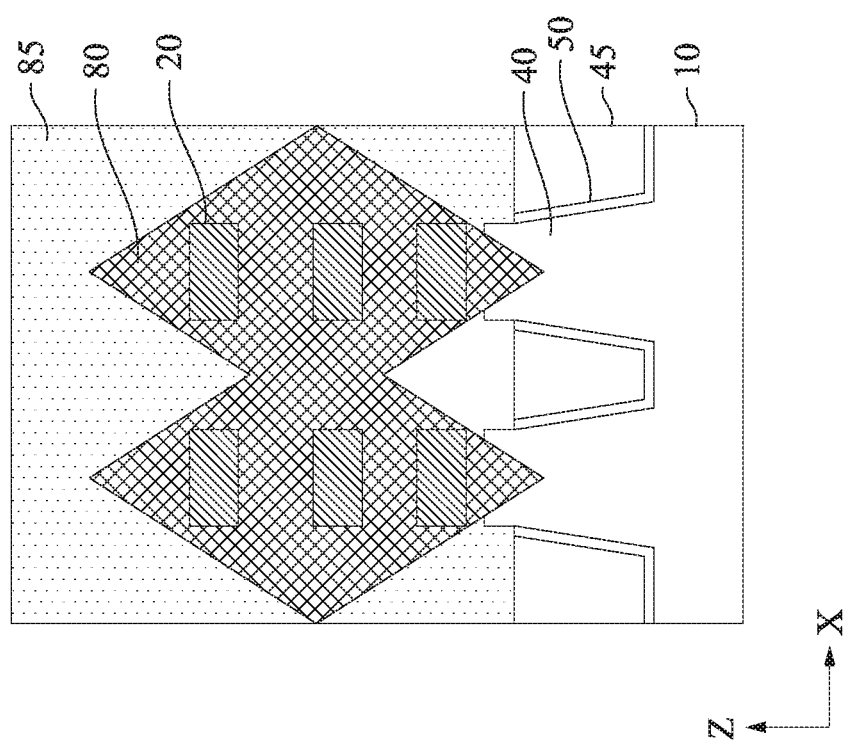

After the sacrificial gate structure is removed, the second semiconductor layers 25 in the fin structures are removed, thereby forming nanowires of the first semiconductor layers 20, as shown in FIGS. 28A-28D. FIG. 28A is a cross sectional view taken along the gate electrode in the X-direction (corresponding to line A-A of FIG. 1). FIG. 28B is a cross sectional view taken along the fin structure in the Y-direction (corresponding to line B-B of FIG. 1). FIG. 28C is a cross sectional view corresponding to line C-C of FIG. 1. FIG. 28D is a cross sectional view corresponding to line D-D of FIG. 1.

The second semiconductor layers 25 can be removed or etched using any of the materials and by any of the processes previously described in relation to FIGS. 15A-15F, using an etchant that selectively etches the second semiconductor layers 25 against the first semiconductor layers 20. When the second semiconductor layers 25 are Si and the substrate 10 is a silicon substrate, the etching of the second semiconductor layers 25 also removes a portion of the fin structure underlying the bottommost first semiconductor layer 20. When the second semiconductor layers 25 and the substrate 10 are made of different materials an additional etching operation is performed in some embodiments to remove a portion of the fin structure underlying the bottommost second semiconductor layer 25, to provide the structure shown in FIGS. 28A and 28B.

In some embodiments, the wet etchant used in removing the portions of the second semiconductor layer 25 in the channel regions also partially etches the first semiconductor layers 20. The amount of the first semiconductor layer 20 etched during the second semiconductor removal is greater in the upper first semiconductor layers 20 (the layers a further distance away from the semiconductor substrate 10). The upper first semiconductor layers 20 are exposed to the wet etchant for a longer period of time than the lower first semiconductor layers. In some embodiments, as a result of the partial etching of the first semiconductor layers 20 during the removal of the second semiconductor layers 25 in the channel regions, the resulting thickness $t1'''$, $t2'''$, $t3'''$ of each first semiconductor nanowire 20 of the nanowire structure in the channel regions is about the same. By substantially the same it is meant that the thicknesses of each layer are within 5% of each other.

In some embodiments, along the stacking direction of the nanowires 20 (Z-direction) the successive nanowires 20 are spaced further apart. As shown in FIG. 28A, the distance $S3'''$ between the uppermost nanowire 20 and the middle nanowire 20 is greater than the distance $S2'''$ between the middle nanowire 20 and the lowermost nanowire 20, and the distance $S2'''$ is greater than the distance $S1$ between the lowermost nanowire 20 and the upper surface of shallow trench insulating layer 45. In other words, $S3'''>S2'''>S1'''$. In some embodiments, the distances increase by about 1 nm to about 2 nm between adjacent first semiconductor layers 20 as the distance from the substrate 10 along the Z-direction increases.

Figure 28F:
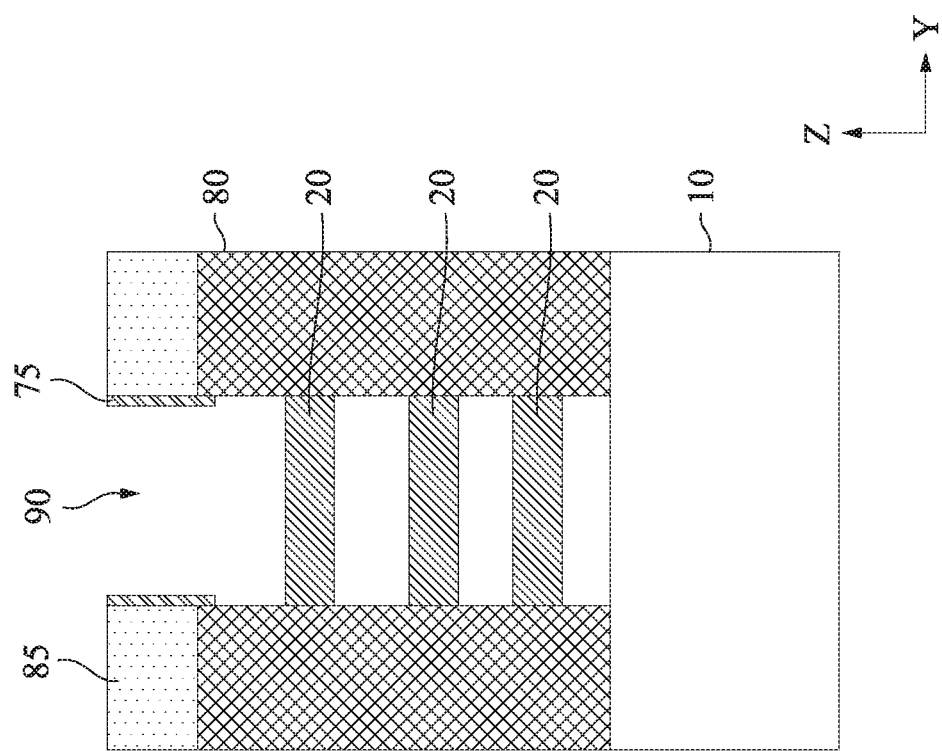
FIG. 28F is a cross sectional view corresponding to line B-B of FIG. 1 of another embodiment.
Figure 28E:
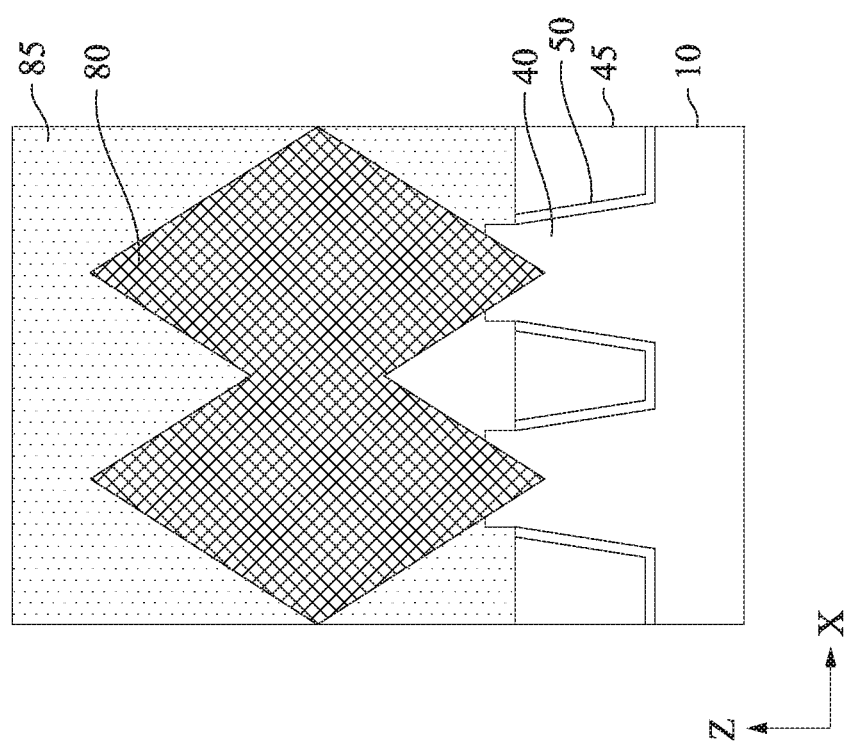
FIG. 28E is a cross sectional view corresponding to line C-C of FIG. 1

FIGS. 28E and 28F show another embodiment, where the second semiconductor layers 25 are removed from the structure of FIG. 27F. FIG. 28E is a cross sectional view corresponding to line C-C of FIG. 1 and FIG. 28F is a cross sectional view corresponding to line B-B of FIG. 1.

In some embodiments, a combination of dry etching techniques and wet etching techniques are used to remove the second semiconductor layer 25.

The cross sectional shape of the semiconductor nanowires 20 in the channel region are shown as rectangular, but can be any polygonal shape (triangular, diamond, etc.), polygonal shape with rounded corners, circular, or oval (vertically or horizontally).

In other embodiments, any of the previously described operations are modified so that the first semiconductor layers 20 are removed by using suitable etching techniques, and nanowires made of the second semiconductor layer 25 are obtained. And the succeeding operations of forming a gate dielectric layer and gate electrode layer are performed on a channel nanowire structure having nanowires made of the second semiconductor layer 25.

Figure 28G:
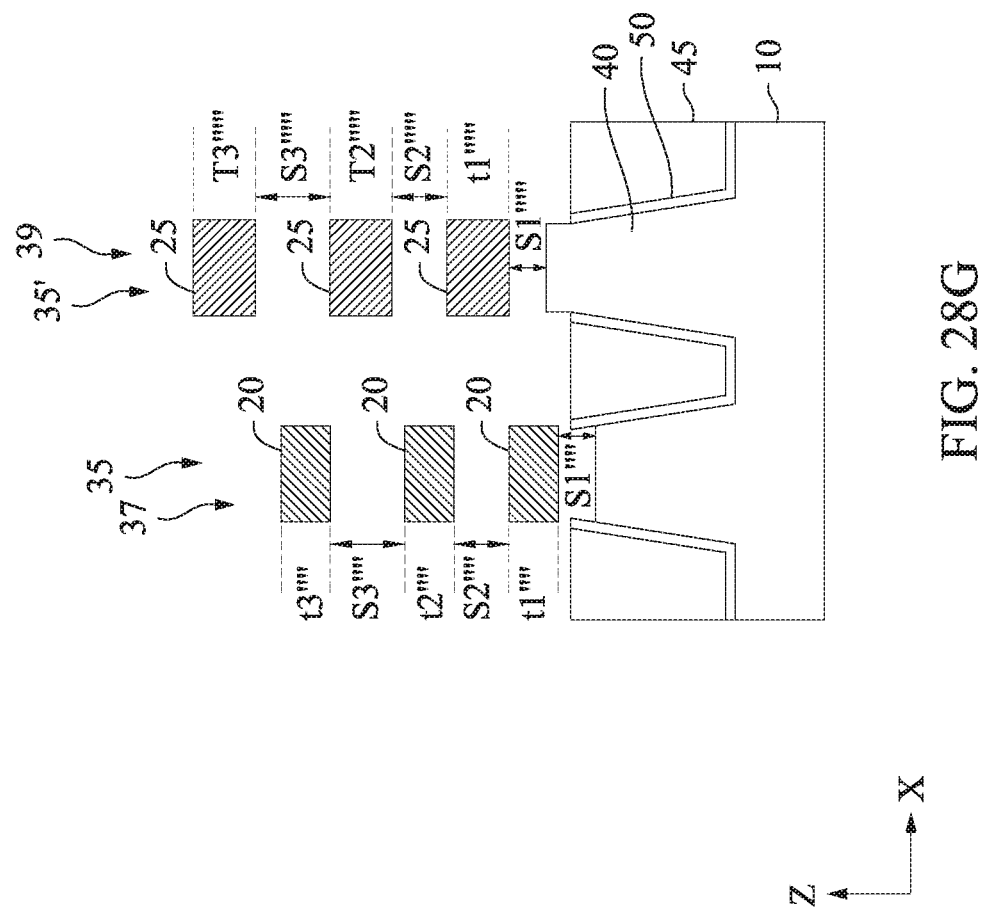
FIG. 28G is a cross sectional view of another embodiment corresponding to line A-A of FIG. 1.

In some embodiments, the first semiconductor layers are removed in the channel region over some fin structures 35 and the second semiconductor layers are removed over the channel region of other fin structures 35, as shown in FIG. 28G. In some embodiments, a second fin structure is masked while the second semiconductor layers are removed in the channel region of a first fin structure, and then the first fin structure is masked while the first semiconductor layers are removed in the channel region of the second fin structure, to provide the structure shown in FIG. 28G. In some embodiments, a first nanowire structure 37 including a stack of the first nanowires 20 is formed over a first fin structure 35 and a second nanowire structure 39 including a stack of the second nanowires 25 is formed over a second fin structure 35'. In some embodiments, the upper portion of the fin structure 35 is etched below a lowermost semiconductor layer 20, as shown in FIG. 28G.

In some embodiments, the thicknesses $t1''''$, $t2''''$, $t3''''$ of the first nanowires 20 and the thicknesses $t1''''$, $t2''''$, $t3''''$ of the second nanowires 25 is substantially the same. In some embodiments, along the nanowire stacking direction (Z-direction) the successive first nanowires 20 and the second nanowires 25 are spaced further apart. As shown in FIG. 28G, the distance $S3''''$ between the uppermost nanowire 20 and the middle nanowire 20 is greater than the distance $S2''''$ between the middle nanowire 20 and the lowermost nanowire 20 in the first nanowire structure 37, and the distance $S2''''$ is greater than the distance $S1''''$ between the lowermost nanowire 20 and the upper surface of well portion 40 of the fin structure 35. In other words, $S3''''>S2''''>S1''''$. Likewise, the spacing relationship of the second nanowires 25 in the second nanowire structure is $S3'''''>S2'''''>S1'''''$. By substantially the same it is meant that the thicknesses of each layer are within 5% of each other. In some embodiments, the spaces increase by about 1 nm to about 2 nm between adjacent first semiconductor layers 20 as the distance from the substrate 10 along the Z-direction increases.

In some embodiments, the first nanowire structure 37 is a part of a p-type FET and the second nanowire structure 39 is part of an n-type FET.

Figure 29B:
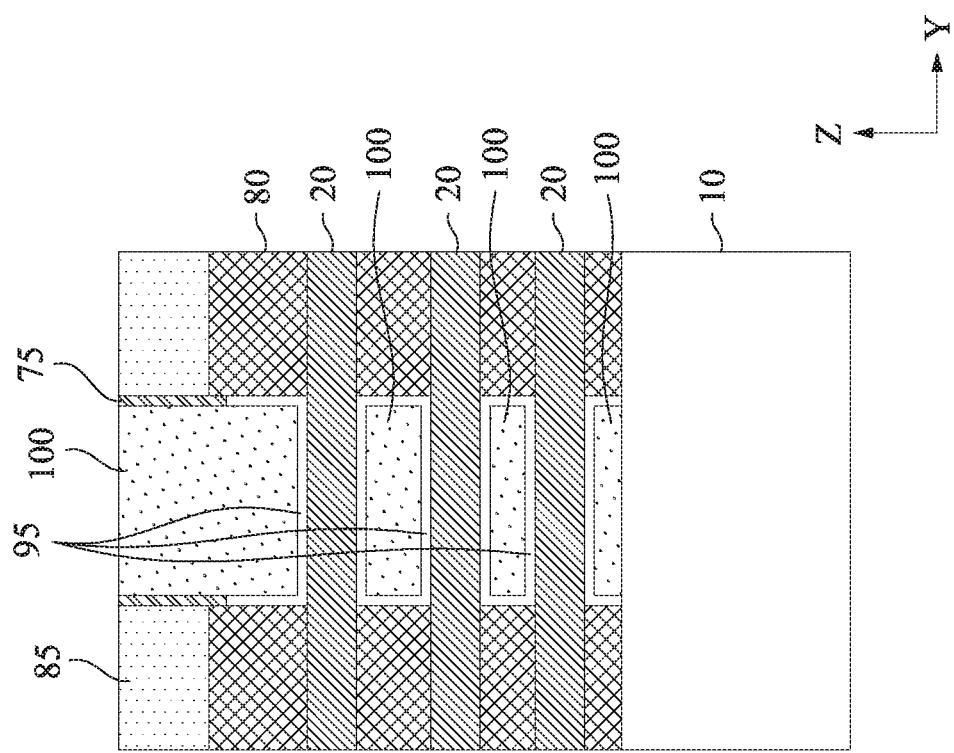
FIGS. 29A-29D show one of the various stages of manufacturing a semiconductor FET device according to embodiments of the present disclosure.
Figure 29A:
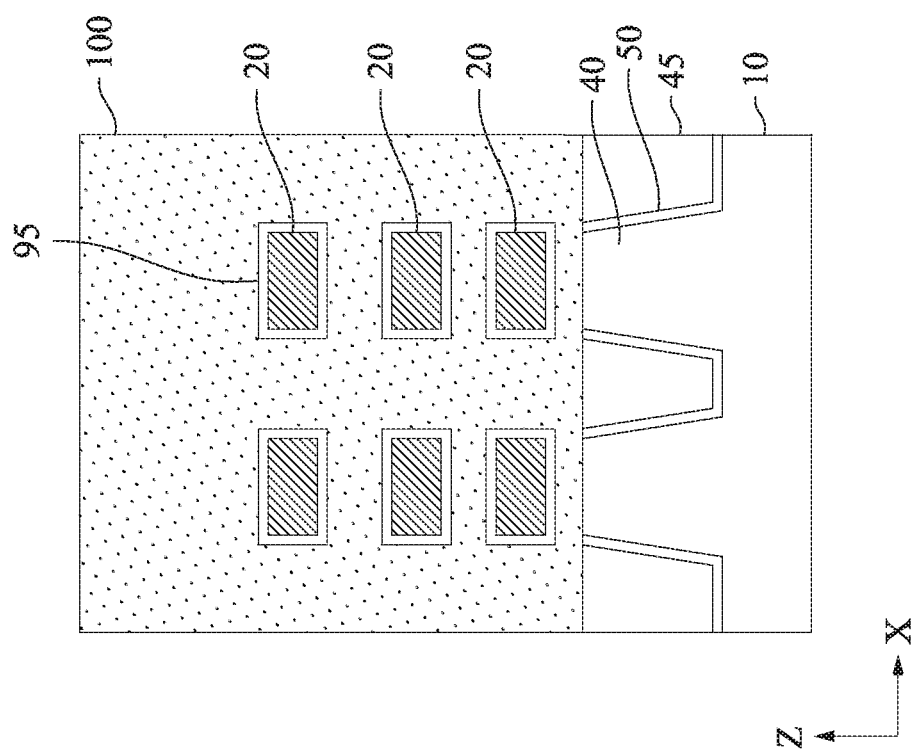
Figure 29D:
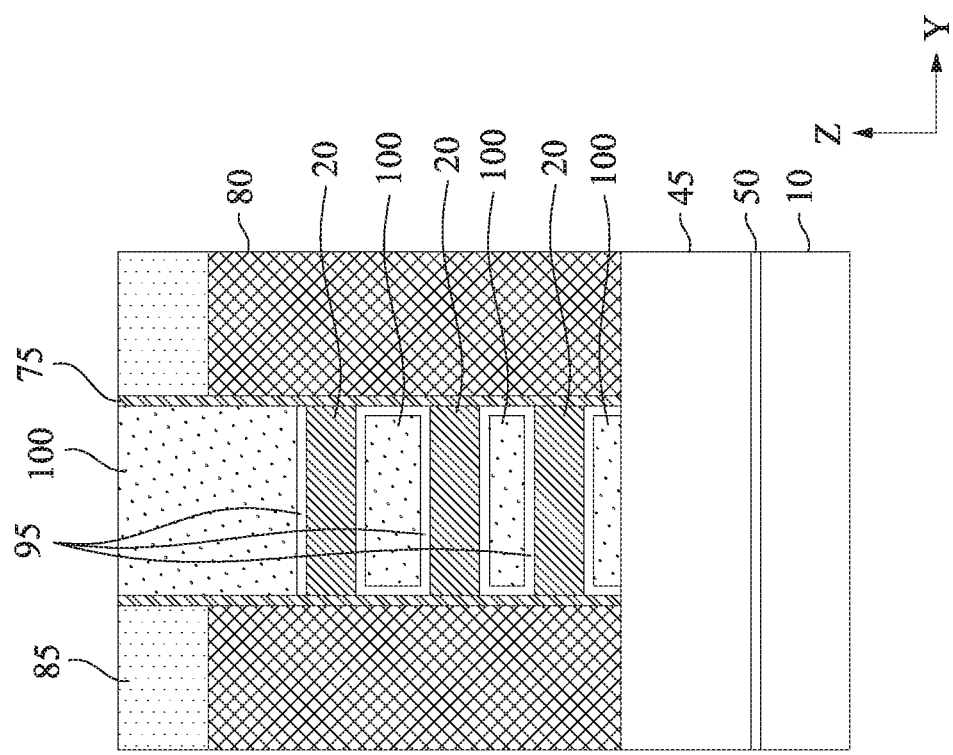
Figure 29C:
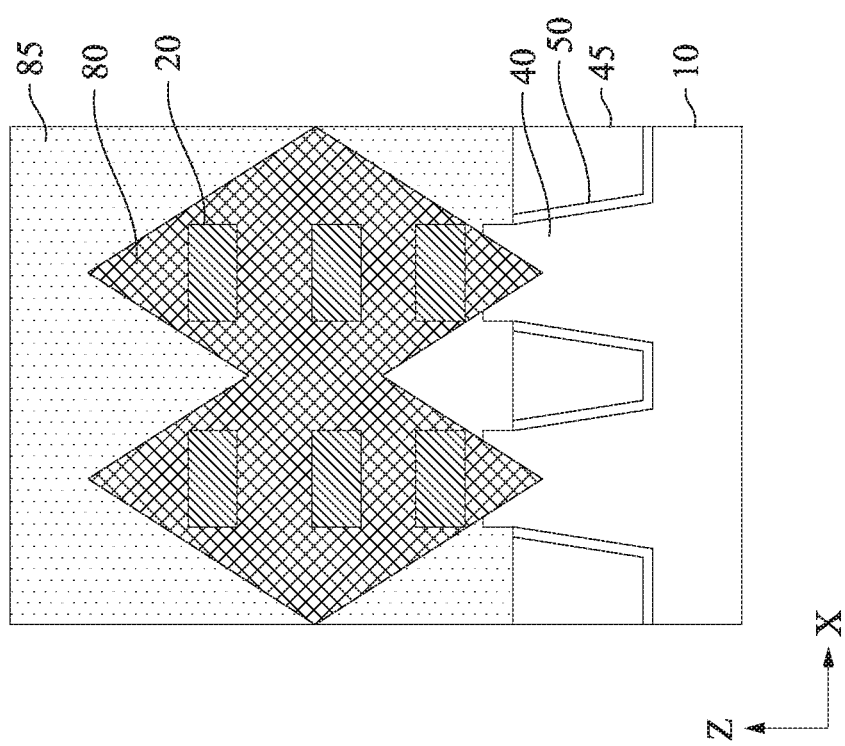

After the semiconductor nanowires of the first semiconductor layers 20 are formed, a gate dielectric layer 95 is formed around each channel layer (nanowire) 20, and a gate electrode layer 100 is formed over the gate dielectric layer 95, as shown in FIGS. 29A-29D. FIG. 29A is a cross sectional view taken along the gate electrode in the X-direction (corresponding to line A-A of FIG. 1). FIG. 29B is a cross sectional view taken along the fin structure in the Y-direction (corresponding to line B-B of FIG. 1). FIG. 29C is a cross sectional view corresponding to line C-C of FIG. 1. FIG. 29D is a cross sectional view corresponding to line D-D of FIG. 1.

Figure 29F:
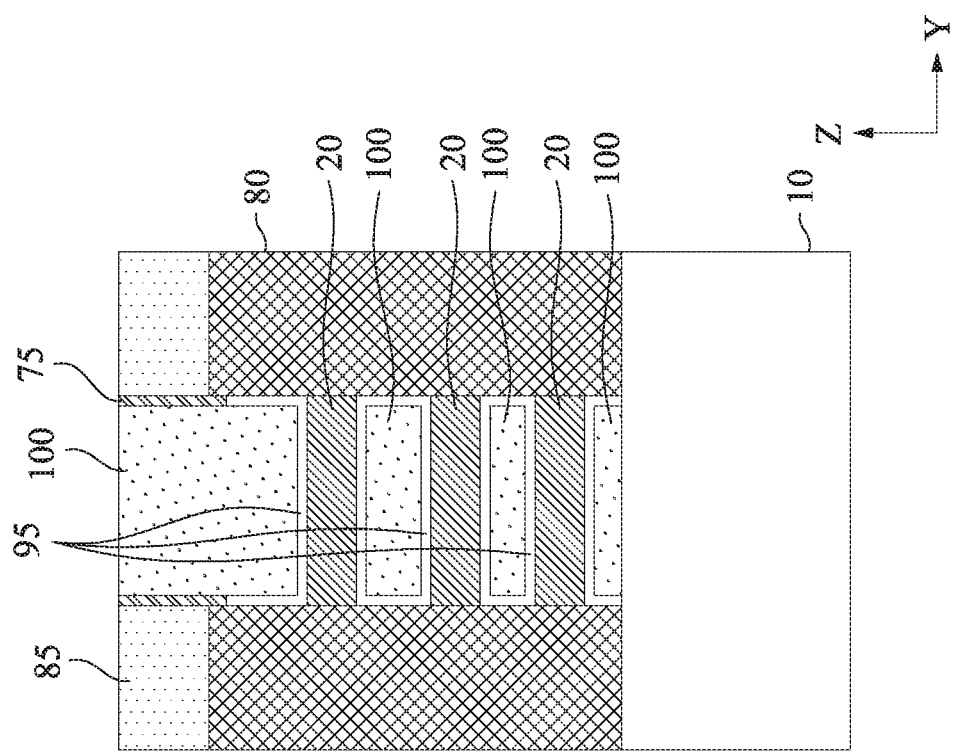
FIG. 29F is a cross sectional view corresponding to line B-B of FIG. 1 of another embodiment.
Figure 29E:
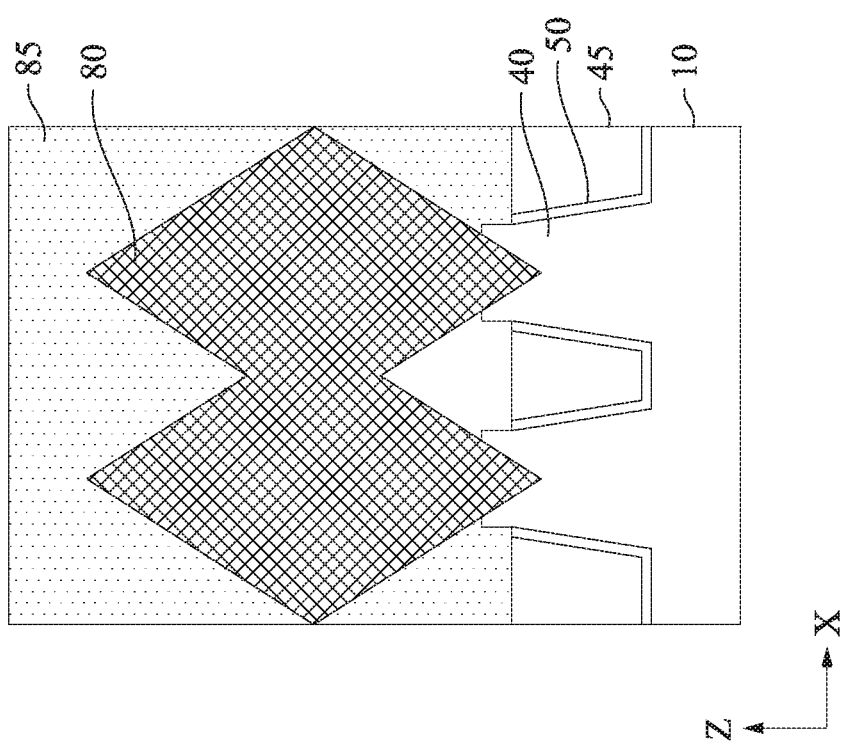
FIG. 29E is a cross sectional view corresponding to line C-C of FIG. 1

FIGS. 29E and 29F show another embodiment, where the gate dielectric layer 95 and gate electrode layer 100 are formed on the structure of FIG. 28F. FIG. 29E is a cross sectional view corresponding to line C-C of FIG. 1 and FIG. 29F is a cross sectional view corresponding to line B-B of FIG. 1.

Figure 29G:
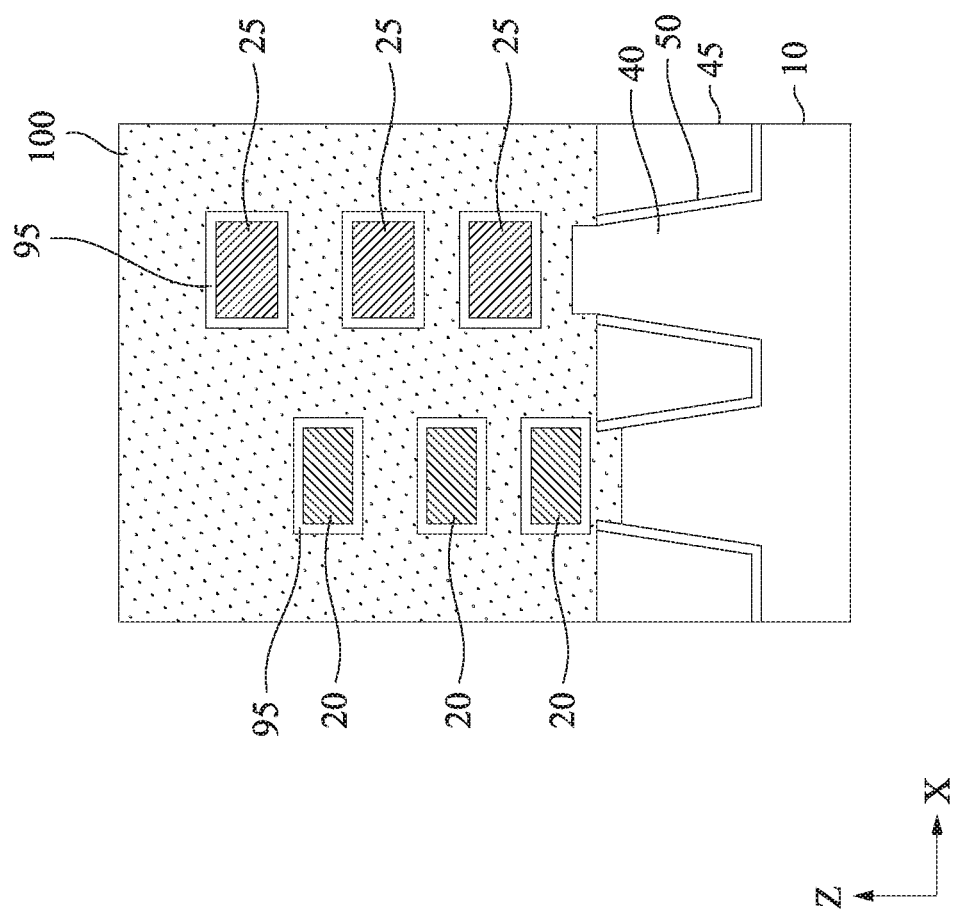
FIG. 29G is a cross sectional view of another embodiment corresponding to line A-A of FIG. 1.

FIG. 29G shows another embodiment, where the gate dielectric layer 95 and gate electrode layer 100 are formed on the structure of FIG. 28G.

The gate dielectric layer 95 and gate electrode layer 100 are formed by any of the materials and any of the processes previously described in relation to FIGS. 16A-16F.

In certain embodiments of the present disclosure, one or more work function adjustment layers (not shown) are interposed between the gate dielectric layer 95 and the gate electrode 100, as previously described. Subsequently, contact holes (not shown) may be formed in the ILD layer 85 by using dry etching. In some embodiments, the upper portion of the S/D epitaxial layer 80 is etched. In some embodiments, a silicide layer is formed over the S/D epitaxial layer 80. The silicide layer includes one or more of WSi, CoSi, NiSi, TiSi, MoSi and TaSi. Then, a conductive material (not shown) is formed in the contact holes. The conductive material includes one or more of Co, Ni, W, Ti, Ta, Cu, Al, TiN and TaN. It is understood that the GAA FETs undergo further CMOS processes to form various features such as contacts/vias, interconnect metal layers, dielectric layers, passivation layers, etc.

In certain embodiments, the semiconductor device is an n-type GAA FET. In other embodiments, the semiconductor device is a p-type GAA FET. In some embodiments, one or more n-type GAA FETs and one or more p-type GAA FETs are provided on the same substrate 10.

In embodiments of the present disclosure, by varying the thicknesses of the first and second semiconductor layers, a uniform final thickness of the nanowires after the nanowire release etching operation is maintained. Embodiments of the present disclosure provide improved control of the dimensions of nanowires in the channel region of semiconductor devices, and ensures the release of all the nanowires in a nanowire structure. Embodiments of the present disclosure are adaptable for nanosheets in addition to nanowires. Embodiments of the present disclosure compensate for the loss of nanowire thickness resulting from the wet etching nanowire release operation, thereby improving semiconductor device performance.

It will be understood that not all advantages have been necessarily discussed herein, no particular advantage is required for all embodiments or examples, and other embodiments or examples may offer different advantages.

An embodiment of the disclosure is a method of manufacturing a semiconductor device, including forming a stacked structure of first semiconductor layers and second semiconductor layers alternately stacked in a first direction over a substrate. A thickness of the first semiconductor layers as formed increases in each first semiconductor layer spaced further apart from the substrate in the first direction. The stacked structure is patterned into a fin structure extending along a second direction substantially perpendicular to the first direction. A portion of the second semiconductor layers between adjacent first semiconductor layers is removed, and a gate structure is formed extending in a third direction over a first portion of the first semiconductor layers so that the gate structure wraps around the first semiconductor layers. The third direction is substantially perpendicular to both the first direction and the second direction. Each of the first semiconductor layers at the first portion of the first semiconductor layers have a substantially same thickness. In an embodiment, the method includes forming source/drain regions over a second portion of the first semiconductor layers located on opposing sides of the gate structure so that the source/drain regions wrap around the first semiconductor layers. In an embodiment, a thickness of the second semiconductor layers as formed increases in each second semiconductor layer spaced further apart from the substrate in the first direction. In an embodiment, each of the first semiconductor layers at the second portion of the first semiconductor layers have a substantially same thickness. In an embodiment, adjacent first semiconductor layers are spaced further apart in the first direction as a distance of the first semiconductor layer from the substrate in the first direction increases. In an embodiment, the removing a portion of the second semiconductor layers between adjacent first semiconductor layers includes an isotropic etching operation. In an embodiment, the method includes forming an isolation insulating layer over the fin structure, forming a cover layer over the isolation insulating layer, patterning the cover layer so as to form an opening and remaining boundary portions, and recessing the isolation insulating layer through the opening to expose a central region of the fin structure, so that end regions of the fin structure remain buried in the isolation insulating layer, and the portion of the second semiconductor layers removed between adjacent first semiconductor layers is in the central region. In an embodiment, the forming the gate structure includes forming a conformal gate dielectric layer wrapping around the first semiconductor layers; and forming a gate electrode layer on the gate dielectric layer wrapping around the first semiconductor layers. In an embodiment, the first semiconductor layer is made of SiGe and the second semiconductor layer is made of Si.

Another embodiment of the disclosure is a method of manufacturing a semiconductor device, including forming a stacked structure of first semiconductor layers and second semiconductor layers alternately stacked in a first direction over a substrate. A thickness of each first semiconductor layer in the stacked structure is less than a thickness of any first semiconductor layers located nearer to the semiconductor substrate, and a thickness of each second semiconductor layer in the stacked structure is greater than a thickness of any second semiconductor layers located nearer to the substrate. The stacked structure is patterned into a fin structure extending along a second direction substantially perpendicular to the first direction. A first portion of the first semiconductor layers is removed between adjacent second semiconductor layers. Each second semiconductor layer has a substantially same thickness after removing the first portion of the first semiconductor layers. A gate structure extending in a third direction is formed over a first portion of the second semiconductor layers so that the gate structure wraps around the second semiconductor layers. The third direction is substantially perpendicular to both the first direction and the second direction. In an embodiment, adjacent second semiconductor layers are spaced a substantially same distance apart in the first direction at the first portion of the second semiconductor layers. In an embodiment, the forming the gate structure includes forming a conformal gate dielectric layer wrapping around the second semiconductor layers, and forming a gate electrode layer on the gate dielectric layer wrapping around the second semiconductor layers. In an embodiment, the method includes forming an isolation insulating layer over the fin structure, forming a cover layer over the isolation insulating layer, patterning the cover layer so as to form an opening and remaining boundary portions, and recessing the isolation insulating layer through the opening to expose a central region of the fin structure, so that end regions of the fin structure remain buried in the isolation insulating layer, and the portion of the first semiconductor layers removed between adjacent first semiconductor layers is in the central region. In an embodiment, the first portion of the first semiconductor layers removed between adjacent second semiconductor layers is removed by isotropically etching the first semiconductor layers between adjacent semiconductor layers. In an embodiment, the method includes forming source/drain regions over a second portion of the second semiconductor layers located on opposing sides of the gate structure so that the source/drain regions wrap around the second semiconductor layers.

Another embodiment of the disclosure is a method of manufacturing a semiconductor device, including forming a stacked structure of first semiconductor layers and second semiconductor layers alternately stacked in a first direction over a substrate. A thickness of the first semiconductor layers as formed increase in each first semiconductor layer spaced apart from the substrate in the first direction, and a thickness of the second semiconductor layers as formed increases in each second semiconductor layer spaced apart from the substrate in the first direction. The stacked structure is patterned into a plurality of fin structures extending along a second direction substantially perpendicular to the first direction, wherein the plurality of fin structures are arranged along a third direction. The third direction is substantially perpendicular to the first and second directions. The first semiconductor layers are removed between adjacent second semiconductor layers in a first portion of a first fin structure. Each second semiconductor layer at the first portion of the first fin structure has a substantially same thickness after removing the first semiconductor layers. The second semiconductor layers are removed between adjacent first semiconductor layers in a first portion of a second fin structure. Each first semiconductor layer in the first portion of the second fin structure has a substantially same thickness after removing the second semiconductor layers. A gate structure is formed extending in the third direction over the first portion of the first fin structure so that the gate structure wraps around the second semiconductor layers and over the first portion of the second fin structure so that the gate structure wraps around the first semiconductor layers. In an embodiment, the method includes forming source/drain regions over second portions of the first fin structure located on opposing sides of the gate structure so that the source/drain regions wrap around the second semiconductor layers, and forming source/drain regions over second portions of the second fin structure located on opposing sides of the gate structure so that the source/drain regions wrap around the first semiconductor layers. In an embodiment, the gate structure is a sacrificial gate structure, and the method includes after forming the source/drain regions, removing the sacrificial gate structure to form a gate space, and forming a high-k gate dielectric layer and a metal gate electrode layer in the gate space. In an embodiment, the high-k gate dielectric layer and the metal gate electrode layer wraps around the second semiconductor layers in the first fin structure and wraps around the first semiconductor layers in the second fin structure. In an embodiment, the first semiconductor layer is made of a different material than the substrate and the second semiconductor layer is made of a same material as the substrate.

Another embodiment of the disclosure is a semiconductor device, including a fin structure disposed over a semiconductor substrate extending in a first direction. A nanowire structure includes a plurality of spaced-apart nanowires arranged in a second direction over a first portion of the fin structure, wherein the second direction is substantially perpendicular to the first direction, each nanowire has a substantially same thickness in the second direction, and a distance between adjacent nanowires in the second direction increases as a distance from the semiconductor substrate along the second direction increases. A gate electrode structure is wrapped around each of the plurality of nanowires over the first portion of the fin structure. In an embodiment, the semiconductor device includes source/drain regions disposed over a second portion of the fin structure located on opposing sides of the gate structure along the first direction. In an embodiment, the source/drain regions wrap around each of the plurality of nanowires. In an embodiment, the gate structure includes a high-k gate dielectric layer and a gate metal electrode layer. In an embodiment, the semiconductor device includes a second fin structure disposed over the substrate and arranged in a third direction substantially perpendicular to the first and second directions. In an embodiment, a nanowire structure includes a plurality of spaced-apart nanowires arranged in the second direction is disposed over each of the fin structures. In an embodiment, each nanowire has a substantially same thickness in the second direction, and a distance between adjacent nanowires in the second direction increases as a distance from the semiconductor substrate along the second direction increases. In an embodiment, the gate electrode structure extends over each of the fin structures.

Another embodiment of the disclosure is a semiconductor device, including a first fin structure extending in a first direction disposed over a semiconductor substrate, and a second fin structure extending in the first direction disposed over the semiconductor substrate. The second fin structure is spaced-apart from the first fin structure in a second direction substantially perpendicular to the first direction. A first nanowire structure includes a plurality of spaced-apart first nanowires arranged in a third direction over a first portion of the first fin structure, wherein the third direction is substantially perpendicular to the first direction and the second direction. A second nanowire structure includes a plurality of spaced-apart second nanowires arranged in the third direction over a first portion of the second fin structure. Each first nanowire has a substantially same thickness in the third direction, and a distance between adjacent first nanowires in the third direction increases as a distance from the semiconductor substrate along the third direction increases. A gate electrode structure extends in the second direction disposed over the first nanowire structure and the second nanowire structure. In an embodiment, the gate electrode structure wraps around each of the first nanowires and the second nanowires. In an embodiment, each second nanowire has a substantially same thickness in the third direction, and a distance between adjacent second nanowires in the third direction increases as a distance from the semiconductor substrate along the third direction increases. In an embodiment, the semiconductor device includes source/drain regions disposed over the first fin structure and the second fin structure on opposing sides of the gate structure. In an embodiment, the source/drain regions wrap around each of the first nanowires and second nanowires. In an embodiment, the gate electrode structure includes a high-k gate dielectric layer and a gate metal electrode layer. In an embodiment, the first nanowires and the second nanowires are made of different materials. In an embodiment, the first nanowires are made of Si and the second nanowires are made of SiGe. In an embodiment, the second nanowires are arranged in a staggered formation in the third direction relative to the first nanowires. In an embodiment, the first nanowires and the second nanowires are made of a same material as the semiconductor substrate.

Another embodiment of the disclosure is a semiconductor device, including a plurality of fin structures disposed over a semiconductor substrate. A gate electrode structure crosses over a channel region each of the plurality of fin structures, and a source/drain structure is disposed over each fin of the plurality of fin structures on opposing sides of the gate electrode structure. Each channel region includes a plurality of spaced-apart nanowires arranged along a first direction extending away from an upper surface of each fin structure of the plurality of fin structures. Each nanowire has a substantially same thickness in first direction, and a distance between adjacent nanowires in the first direction increases as a distance from the upper surfaces of the fin structures along the first direction increases. In an embodiment, the nanowires disposed over one fin structure of the plurality of fin structures are made of a different material than the nanowires disposed over another fin structure of the plurality of fin structures.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a stacked structure of first semiconductor layers and second semiconductor layers alternately stacked in a first direction over a substrate,
    wherein a thickness of the first semiconductor layers as formed increases in each first semiconductor layer spaced further apart from the substrate in the first direction;
    patterning the stacked structure into a fin structure extending along a second direction substantially perpendicular to the first direction;
    removing a portion of the second semiconductor layers between adjacent first semiconductor layers; and
    forming a gate structure extending in a third direction over a first portion of the first semiconductor layers so that the gate structure wraps around the first semiconductor layers, the third direction being substantially perpendicular to both the first direction and the second direction,
    wherein each of the first semiconductor layers at the first portion of the first semiconductor layers have a substantially same thickness.

2. The method according to claim 1, further comprising forming source/drain regions over a second portion of the first semiconductor layers located on opposing sides of the gate structure so that the source/drain regions wrap around the first semiconductor layers.

3. The method according to claim 1, wherein a thickness of the second semiconductor layers as formed increases in each second semiconductor layer spaced further apart from the substrate in the first direction.

4. The method according to claim 2, wherein each of the first semiconductor layers at the second portion of the first semiconductor layers have a substantially same thickness.

5. The method according to claim 1, wherein adjacent first semiconductor layers are spaced further apart in the first direction as a distance of the first semiconductor layer from the substrate in the first direction increases.

6. The method according to claim 1, wherein the removing a portion of the second semiconductor layers between adjacent first semiconductor layers includes an isotropic etching operation.

7. The method according to claim 1, further comprising:
    forming an isolation insulating layer over the fin structure;
    forming a cover layer over the isolation insulating layer;
    patterning the cover layer so as to form an opening and remaining boundary portions; and
    recessing the isolation insulating layer through the opening to expose a central region of the fin structure, so that end regions of the fin structure remain buried in the isolation insulating layer, and
    wherein the portion of the second semiconductor layers removed between adjacent first semiconductor layers is in the central region.

8. The method according to claim 1, wherein the forming the gate structure comprises:
    forming a conformal gate dielectric layer wrapping around the first semiconductor layers; and
    forming a gate electrode layer on the gate dielectric layer wrapping around the first semiconductor layers.

9. The method according to claim 1, wherein the first semiconductor layer is made of SiGe and the second semiconductor layer is made of Si.

10. A method of manufacturing a semiconductor device, comprising:
    forming a stacked structure of first semiconductor layers and second semiconductor layers alternately stacked in a first direction over a substrate,
    wherein a thickness of each first semiconductor layer in the stacked structure is less than a thickness of any first semiconductor layers located nearer to the semiconductor substrate, and
    a thickness of each second semiconductor layer in the stacked structure is greater than a thickness of any second semiconductor layers located nearer to the substrate;
    patterning the stacked structure into a fin structure extending along a second direction substantially perpendicular to the first direction;
    removing a first portion of the first semiconductor layers between adjacent second semiconductor layers,
    wherein each second semiconductor layer has a substantially same thickness after removing the first portion of the first semiconductor layers; and
    forming a gate structure extending in a third direction over a first portion of the second semiconductor layers so that the gate structure wraps around the second semiconductor layers, the third direction being substantially perpendicular to both the first direction and the second direction.

11. The method according to claim 10, wherein adjacent second semiconductor layers are spaced a substantially same distance apart in the first direction at the first portion of the second semiconductor layers.

12. The method according to claim 10, wherein the forming the gate structure comprises:
    forming a conformal gate dielectric layer wrapping around the second semiconductor layers; and
    forming a gate electrode layer on the gate dielectric layer wrapping around the second semiconductor layers.

13. The method according to claim 10, further comprising:
    forming an isolation insulating layer over the fin structure;
    forming a cover layer over the isolation insulating layer;

patterning the cover layer so as to form an opening and remaining boundary portions; and recessing the isolation insulating layer through the opening to expose a central region of the fin structure, so that end regions of the fin structure remain buried in the isolation insulating layer, and wherein the first portion of the first semiconductor layers removed between adjacent first semiconductor layers is in the central region.

14. The method according to claim 10, wherein the first portion of the first semiconductor layers removed between adjacent second semiconductor layers is removed by isotropically etching the first semiconductor layers between adjacent second semiconductor layers.

15. The method according to claim 10, further comprising forming source/drain regions over a second portion of the second semiconductor layers located on opposing sides of the gate structure so that the source/drain regions wrap around the second semiconductor layers.

16. A method of manufacturing a semiconductor device, comprising:

forming a stacked structure of first semiconductor layers and second semiconductor layers alternately stacked in a first direction over a substrate, wherein a thickness of the first semiconductor layers as formed increases in each first semiconductor layer spaced apart from the substrate in the first direction, and a thickness of the second semiconductor layers as formed increases in each second semiconductor layer spaced apart from the substrate in the first direction;

patterning the stacked structure into a plurality of fin structures extending along a second direction substantially perpendicular to the first direction, wherein the plurality of fin structures are arranged along a third direction, the third direction being substantially perpendicular to the first and second directions;

removing the first semiconductor layers between adjacent second semiconductor layers in a first portion of a first fin structure, wherein each second semiconductor layer at the first portion of the first fin structure has a substantially same thickness after removing the first semiconductor layers, and removing the second semiconductor layers between adjacent first semiconductor layers in a first portion of a second fin structure, wherein each first semiconductor layer in the first portion of the second fin structure has a substantially same thickness after removing the second semiconductor layers; and forming a gate structure extending in the third direction over the first portion of the first fin structure so that the gate structure wraps around the second semiconductor layers and over the first portion of the second fin structure so that the gate structure wraps around the first semiconductor layers.

17. The method according to claim 16, further comprising:

forming source/drain regions over second portions of the first fin structure located on opposing sides of the gate structure so that the source/drain regions wrap around the second semiconductor layers; and forming source/drain regions over second portions of the second fin structure located on opposing sides of the gate structure so that the source/drain regions wrap around the first semiconductor layers.

18. The method according to claim 16, wherein the gate structure is a sacrificial gate structure, and further comprising after forming the source/drain regions:

removing the sacrificial gate structure to form a gate space; and forming a high-k gate dielectric layer and a metal gate electrode layer in the gate space.

19. The method according to claim 18, wherein the high-k gate dielectric layer and the metal gate electrode layer wraps around the second semiconductor layers in the first fin structure and wraps around the first semiconductor layers in the second fin structure.

20. The method according to claim 16, wherein the first semiconductor layer is made of a different material than the substrate and the second semiconductor layer is made of a same material as the substrate.

* * * * *